United States Patent
Maki et al.

(10) Patent No.: US 10,222,759 B2
(45) Date of Patent: *Mar. 5, 2019

(54) INTEGRATED CIRCUIT DEVICE, ELECTRONIC APPARATUS, AND VEHICLE

(71) Applicant: Seiko Epson Corporation, Tokyo (JP)

(72) Inventors: Katsuhiko Maki, Chino (JP); Hideo Haneda, Matsumoto (JP); Takashi Kurashina, Matsumoto (JP); Akio Tsutsumi, Chino (JP); Yasuhiro Sudo, Chino (JP)

(73) Assignee: Seiko Epson Corporation (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/715,607

(22) Filed: Sep. 26, 2017

(65) Prior Publication Data

US 2018/0091156 A1 Mar. 29, 2018

(30) Foreign Application Priority Data

Sep. 27, 2016 (JP) ................. 2016-187799
May 24, 2017 (JP) ................. 2017-102224

(51) Int. Cl.
*G04F 10/00* (2006.01)
*H03L 7/085* (2006.01)
*H03B 5/36* (2006.01)
*H03L 7/099* (2006.01)
*H03L 7/18* (2006.01)
*H03L 7/23* (2006.01)

(52) U.S. Cl.
CPC ........... *G04F 10/005* (2013.01); *H03B 5/362* (2013.01); *H03B 5/368* (2013.01); *H03L 7/085* (2013.01); *H03L 7/099* (2013.01); *H03L 7/18* (2013.01); *H03L 7/23* (2013.01)

(58) Field of Classification Search
CPC ........ G04F 10/005; H03B 5/362; H03L 7/085
USPC ....................................................... 327/145
See application file for complete search history.

(56) References Cited

U.S. PATENT DOCUMENTS

| | | | |
|---|---|---|---|
| 7,259,601 B2 | 8/2007 | Zarate et al. | |
| 7,304,510 B2 | 12/2007 | Matsuta | |
| 7,486,119 B2 | 2/2009 | Lee | |
| 7,830,191 B2 | 11/2010 | Kojima et al. | |
| 8,222,935 B2 | 7/2012 | Awata | |
| 8,462,840 B2* | 6/2013 | Chen | H03M 1/661 375/239 |
| 8,552,776 B2 | 10/2013 | Kwak et al. | |
| 9,068,896 B2* | 6/2015 | Yun | G01K 7/32 |

(Continued)

FOREIGN PATENT DOCUMENTS

| | | |
|---|---|---|
| JP | 64-079687 A | 3/1989 |
| JP | 05-087954 A | 4/1993 |

(Continued)

*Primary Examiner* — William Hernandez
(74) *Attorney, Agent, or Firm* — Harness, Dickey & Pierce, P.L.C.

(57) ABSTRACT

An integrated circuit device includes: a first oscillation circuit that oscillates a first resonator to generate a first clock signal with a first clock frequency; a second oscillation circuit that oscillates a second oscillation element to generate a second clock signal with a second clock frequency that is different from the first clock frequency; and a time-to-digital conversion circuit that converts a time into a digital value using the first and second clock signals.

17 Claims, 28 Drawing Sheets

(56) References Cited

U.S. PATENT DOCUMENTS

| | | | |
|---|---|---|---|
| 2003/0076181 A1* | 4/2003 | Tabatabaei | G04F 10/06 331/57 |
| 2007/0046347 A1 | 3/2007 | Lee | |
| 2008/0048739 A1 | 2/2008 | Nakaya et al. | |
| 2008/0136479 A1 | 6/2008 | You et al. | |
| 2009/0184741 A1 | 7/2009 | Suda et al. | |
| 2009/0256577 A1 | 10/2009 | Hasumi et al. | |
| 2010/0052751 A1 | 3/2010 | Abe | |
| 2010/0182186 A1* | 7/2010 | Lin | H03M 1/50 341/166 |
| 2011/0128055 A1 | 6/2011 | Pelgrom et al. | |
| 2011/0169673 A1* | 7/2011 | Henzler | G04F 10/005 341/141 |
| 2011/0304361 A1* | 12/2011 | Henzler | G04F 10/005 327/105 |
| 2014/0361840 A1* | 12/2014 | Liu | H03L 7/06 331/18 |
| 2015/0061781 A1 | 3/2015 | Shimura | |
| 2015/0145572 A1* | 5/2015 | Sato | G04F 10/005 327/159 |
| 2016/0103423 A1* | 4/2016 | Chang | G04F 10/005 341/118 |
| 2016/0173108 A1 | 6/2016 | Oshita et al. | |
| 2017/0230051 A1 | 8/2017 | Oshita et al. | |
| 2018/0088160 A1* | 3/2018 | Maki | G01R 23/10 |
| 2018/0088536 A1* | 3/2018 | Kurashina | H03L 7/0992 |
| 2018/0091158 A1* | 3/2018 | Sudo | H03L 7/087 |

FOREIGN PATENT DOCUMENTS

| | | |
|---|---|---|
| JP | 2007-110370 A | 4/2007 |
| JP | 2009-246484 A | 10/2009 |
| JP | 2010-119077 A | 5/2010 |

* cited by examiner

| fr (MHz) | f1 (MHz) | f2 (MHz) | N2 | M2 | N1 | M1 | Δt=\|1/f1−1/f2\| (ps) |
|---|---|---|---|---|---|---|---|
| 101 | 102.01 | 102 | 102 | 101 | 101 | 100 | 0.96 |
| 102 | 189.04 | 189 | 63 | 34 | 139 | 75 | 1.12 |
| 201 | 276.04 | 276 | 92 | 67 | 103 | 75 | 0.53 |

INTEGRATED CIRCUIT DEVICE, ELECTRONIC APPARATUS, AND VEHICLE

BACKGROUND

1. Technical Field

The present invention relates to an integrated circuit device, an electronic apparatus, and a vehicle.

2. Related Art

In the related art, there are known circuit devices including time-to-digital conversion circuits. Time-to-digital conversion circuits convert times into digital values. As examples of circuit devices including such time-to-digital conversion circuits in the related art, known technologies of the related art disclosed are in, for example, JP-A-2009-246484, JP-A-2007-110370, JP-A-2010-119077, and JP-A-5-87954.

In the technologies of the related art of JP-A-2009-246484, JP-A-2007-110370, and JP-A-2010-119077, time-to-digital conversion is realized using so-called vernier delay circuits. In the vernier delay circuits, delay elements, which are semiconductor elements, are used to realize time-to-digital conversion.

JP-A-5-87954 discloses an infinitesimal time measurement device including a first quartz crystal oscillator that outputs a first clock pulse, a second quartz crystal oscillator that outputs a second clock pulse, an edge matching detection circuit, a synchronization counter, a microcomputer, and a transmission time control unit. The edge matching detection circuit detects a synchronization point of the first and second clock pulses. The synchronization counter performs a counting process in synchronization with the first and second clock pulses. The microcomputer calculates an infinitesimal time from a start pulse to a stop pulse based on a value of the synchronization counter. The transmission time control unit outputs the start pulse in accordance with an output of the edge matching detection circuit and values of the synchronization counter and the microcomputer.

In the technologies of the related art of JP-A-2009-246484, JP-A-2007-110370, and JP-A-2010-119077, the so-called vernier delay circuits are used to realize time-to-digital conversion. In the vernier delay circuits, the delay elements used to realize the time-to-digital conversion are semiconductor elements. In the time-to-digital conversion realized using the semiconductor elements, however, it is easy to improve resolution, but there is a problem that it is difficult to improve precision.

In the technology of the related art of JP-A-5-87954, two quartz crystal oscillators are used to realize time-to-digital conversion. In the technology of the related art, however, each of two oscillation circuits oscillating two quartz crystal oscillation elements is contained in each quartz crystal oscillator. Therefore, a circuit used for time measurement is realized by a different IC chip from the oscillation circuit or a circuit component. Therefore, a control process suitable for the two oscillation circuits is not realized. As a result, it is difficult to improve the high performance of the time-to-digital conversion.

SUMMARY

An advantage of some aspects of the invention is that it provides an integrated circuit device, an electronic apparatus, and a vehicle capable of realizing high performance or simplification of a process for time-to-digital conversion.

The invention can be implemented in at least the following configurations.

An integrated circuit device according to an aspect of the invention includes: a first oscillation circuit that oscillates a first resonator to generate a first clock signal with a first clock frequency; a second oscillation circuit that oscillates a second oscillation element to generate a second clock signal with a second clock frequency that is different from the first clock frequency; and a time-to-digital conversion circuit that converts a time into a digital value using the first and second clock signals.

According to the aspect of the invention, the first and second clock signals with the different clock frequencies are generated when the first and second oscillation circuits oscillate the first and second oscillation elements. Then, the time-to-digital conversion is performed to convert a time into a digital value using the first and second clock signals generated by the first and second oscillation circuits. In this way, when the first and second clock signals generated by employing the first and second oscillation elements are used, the time-to-digital conversion can be realized using the clock signals with the clock frequencies of high precision. Therefore, compared to a case in which the time-to-digital conversion is realized using semiconductor elements, high precision of the time-to-digital conversion is achieved. The first and second oscillation circuits generating the first and second clock signals are contained in the integrated circuit device. Therefore, compared to a case in which the oscillation circuits are not contained in the integrated circuit device, high performance or simplification of a process for the time-to-digital conversion is achieved.

In the aspect of the invention, the integrated circuit device may further include a control unit that controls at least one of the first and second oscillation circuits.

With this configuration, control for realizing the high performance and the simplification of the process for the time-to-digital conversion is realized when the control unit controls the oscillation circuit.

In the aspect of the invention, the control unit may control at least one of an oscillation frequency and a phase of an oscillation signal of at least the one oscillation circuit.

With this configuration, when the oscillation frequency or the phase of the oscillation signal is controlled, it is possible to set a frequency relation or a phase relation between the first and second clock signals to an appropriate relation.

In the aspect of the invention, the control unit may control at least the one oscillation circuit so that the first and second clock signals have a given frequency relation or a given phase relation.

With this configuration, the time-to-digital conversion can be realized in a state in which the frequency relation or the phase relation between the first and second clock signals is appropriate.

In the aspect of the invention, when f1 is the first clock frequency and f2 is the second clock frequency, the control unit may control at least the one oscillation circuit so that N/f1=M/f2 (where N and M are mutually different integers equal to or greater than 2) is satisfied.

With this configuration, the first and second clock signals have the appropriate frequency relation, and thus it is possible to realize the time-to-digital conversion.

In the aspect of the invention, the integrated circuit device may further include a first terminal that connects one end of the first resonator to the first oscillation circuit; a second terminal that connects the other end of the first resonator to the first oscillation circuit; a third terminal that connects one end of the second oscillation element to the second oscillation circuit; and a fourth terminal that connects the other end of the second oscillation element to the second oscillation circuit.

When the first to fourth terminals are included in the integrated circuit device, circuit elements can be connected to the terminals or the first and second oscillation circuits can be controlled using the terminal.

In the aspect of the invention, the time-to-digital conversion circuit may convert a time difference between transition timings of first and second signals into a digital value.

With this configuration, the time difference between the transition timings of the first and second signals can be converted into the digital value with high precision using the first and second clock signals generated by the first and second oscillation elements.

In the aspect of the invention, when an inter-clock time difference which is the time difference between the transition timings of the first and second clock signals at first to i-th clock cycles is Δt to i×Δt (where Δt is a resolution and i is an integer equal to or greater than 2) after a phase synchronization timing of the first and second clock signals, the time-to-digital conversion circuit may calculate the digital value by specifying whether the time difference between the first and second signals correspond to one of Δt to i×Δt which is the inter-clock time difference.

With this configuration, the time difference between the first and second signals can be converted into the digital value effectively using the inter-clock time difference increasing by, for example, Δt after the phase synchronization timing.

In the aspect of the invention, when a period between first and second phase synchronization timings of the first and second clock signals is set as a measurement period and the time difference between the transition timings of the first and second clock signals is set as an inter-clock time difference, the time-to-digital conversion circuit may generate a plurality of the first signals at a plurality of cycles of the measurement period and acquire a plurality of the second signals of which signal levels are changed to corresponding to the plurality of generated first signals and the time-to-digital conversion circuit may calculate the digital value in accordance with a result of a comparison process of comparing a time difference between the first and second signals at each clock cycle among the plurality of clock cycles to the inter-clock time difference at each clock cycle.

With this configuration, the plurality of first signals can be generated at the plurality of clock cycles within the measurement period and the digital value of the time difference of the plurality of second signals corresponding to the plurality of first signals can be calculated using the inter-clock time difference between the first and second clock signals at each clock cycle. Thus, it is possible to realize acceleration of the time-to-digital conversion.

In the aspect of the invention, when a period between a first phase synchronization timing and a second phase synchronization timing of the first and second clock signals is set as a first updating period, a period between the second phase synchronization timing and a third phase synchronization timing is set as a second updating period, and the time difference between the transition timings of the first and second clock signals is set as an inter-clock time difference, the time-to-digital conversion circuit may generate the first signal at an m-th clock cycle (where m is an integer equal to or greater than 1), acquire the second signal with a signal level which is changed to correspond to the generated first signal, and perform a comparison process of comparing the time difference between the first and second signals at the m-th clock cycle to the inter-clock time difference during the first updating period and the time-to-digital conversion circuit may generate the first signal at an n-th clock cycle (where n is an integer equal to or greater than 1) set in accordance with a result of the comparison process during the first updating period, acquire the second signal with a signal level which is changed to correspond to the generated first signal, and perform a comparison process of comparing the time difference between the first and second signals at the n-th clock cycle to the inter-clock time difference during the second updating period.

With this configuration, a result of the comparison process during a previous updating period can be fed back, the clock cycle at which the first signal is generated during a current updating period can be set, and the time-to-digital conversion can be realized.

In the aspect of the invention, the time-to-digital conversion circuit may convert a time into a digital value at a resolution corresponding to a frequency difference between the first and second clock frequencies.

With this configuration, the resolution of the time-to-digital conversion can be set using the frequency difference between the first and second clock frequencies. Thus, it is possible to realize high performance time-to-digital conversion.

In the aspect of the invention, the time-to-digital conversion circuit may convert a time into a digital value at a resolution Δt in which $\Delta t = |1/f1 - 1/f2| = |f1 - f2|/(f1 \times f2)$ is satisfied when f1 is the first clock frequency and f2 is the second clock frequency.

With this configuration, for example, by decreasing the frequency difference between the first and second clock frequencies or setting the first and second clock frequencies to high frequencies, it is possible to decrease the resolution. Thus, it is possible to realize high performance time-to-digital conversion.

In the aspect of the invention, the first and second oscillation elements may be quartz crystal resonators.

With this configuration, when the first and second clock signals are generated using the quartz crystal resonators, the high precision of the first and second clock frequencies is achieved.

In the aspect of the invention, the integrated circuit device may further include a first PLL circuit that performs phase synchronization of the first clock signal with a reference clock signal; and a second PLL circuit that performs phase synchronization of the second clock signal with the reference clock signal.

With this configuration, by performing the phase synchronization using the first and second PLL circuits, it is possible to raise the incidence of the phase synchronization compared to a case in which the phases of the first and second clock signals are synchronized by one PLL circuit. Thus, it is possible to realize the high performance of the process for the time-to-digital conversion using the first and second clock signals.

In the aspect of the invention, when J is a jitter amount per clock cycle of the first and second clock signals and Δt is a resolution of time-to-digital conversion, J≤Δt may be satisfied.

With this configuration, it is possible to prevent a situation in which the precision of the time-to-digital conversion degrades because the jitter amount exceeds the resolution.

In the aspect of the invention, when K is the number of clocks of one of the first and second clock signals during a period between a phase synchronization timing of the one clock signal with the other clock signal or a reference clock signal and a subsequent phase synchronization timing, J≤Δt/K may be satisfied.

With this configuration, it is possible to prevent a situation in which the precision of the time-to-digital conversion degrades due to the resolution as a main cause.

In the aspect of the invention, when K is the number of clocks of one of the first and second clock signals during a period between a phase synchronization timing of the one clock signal with the other clock signal or a reference clock signal and a subsequent phase synchronization timing, $(1/10) \times (\Delta t/K^{1/2}) \leq J \leq 10 \times (\Delta t/K^{1/2})$ may be satisfied.

With this configuration, it is possible to realize the time-to-digital conversion with the resolution in which an influence of the accumulative jitter is considered (taken into account). Thus, high precision time-to-digital conversion is achieved.

An electronic apparatus according to another aspect of the invention includes the integrated circuit device according to the aspect of the invention.

A vehicle according to still another aspect of the invention includes the integrated circuit device according to the aspect of the invention.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a preferred embodiment of the invention will be described in detail. The embodiment to be described below does not limit the scope of the invention described in the appended claims and all of the configurations described in the embodiment are not requirements of the invention.

1. Integrated Circuit Device

Figure 1:
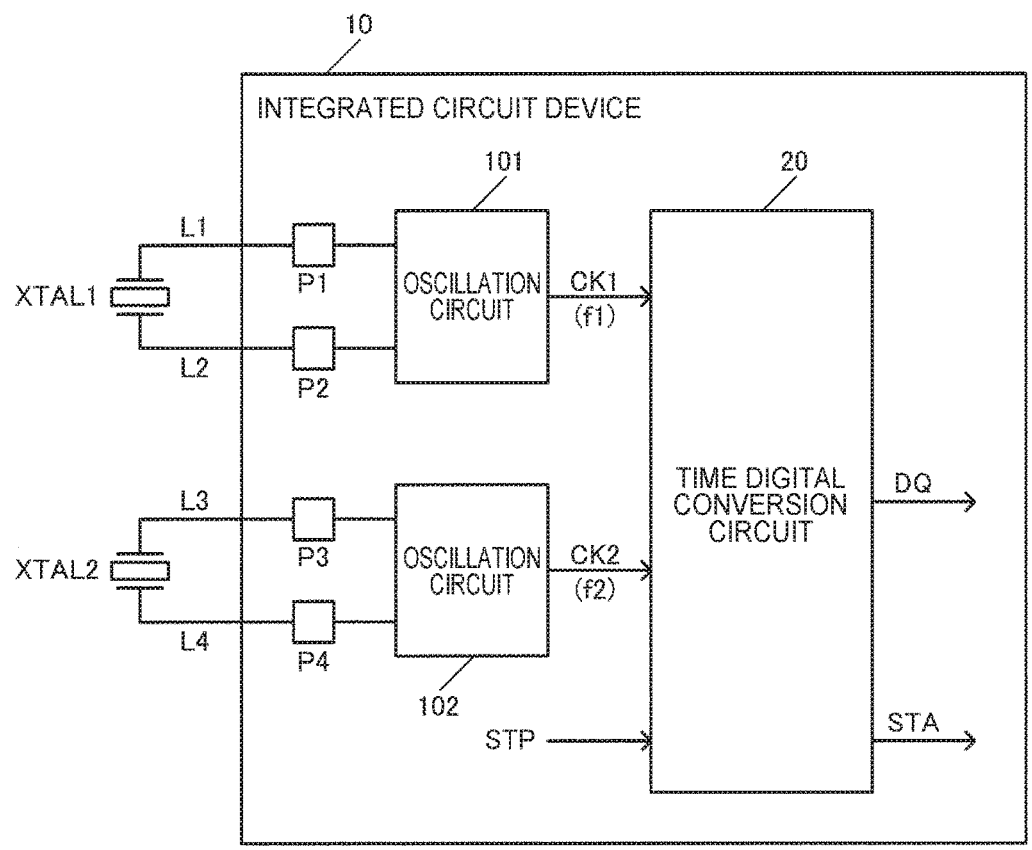
FIG. 1 is a diagram illustrating a basic configuration example of an integrated circuit device according to an embodiment.

FIG. 1 illustrates a basic configuration of an integrated circuit device 10 according to the embodiment. The integrated circuit device 10 includes oscillation circuits 101 and 102 and a time-to-digital conversion circuit 20. The integrated circuit device 10 can also include terminals P1, P2, P3, and P4. The integrated circuit device 10 is not limited to the configuration of FIG. 1. Various modifications can be realized in such a manner that some of the constituent elements are omitted or other constituent elements are added.

The oscillation circuit 101 (a first oscillation circuit) oscillates an oscillation element XTAL1 (a first resonator). Then, the oscillation circuit 101 generates a clock signal CK1 (a first clock signal) with a clock frequency f1 (a first clock frequency). The oscillation circuit 102 (a second oscillation element) oscillates an oscillation element XTAL2

(a second oscillation element). Then, the oscillation circuit 102 generates a clock signal CK2 (a second clock signal) with a clock frequency f2 (a second clock frequency). The oscillation circuits 101 and 102 are configured with circuit elements such as buffer circuits and capacitors or resistors for oscillation. Clock signals CK1 and CK2 generated by the oscillation circuits 101 and 102 are supplied to the time-to-digital conversion circuit 20.

The time-to-digital conversion circuit 20 converts a time into a digital value using the clock signals CK1 and CK2. Specifically, the clock signal CK1 with the clock frequency f1 generated using the oscillation element XTAL1 and the clock signal CK2 with the clock frequency f2 generated using the oscillation element XTAL2 are input. Then, a time is converted into a digital value using the clock signals CK1 and CK2. In an example of FIG. 1, the time-to-digital conversion circuit 20 converts a time difference between transition timings of a signal STA (a first signal: for example, a start signal) and a signal STP (a second signal: for example, a stop signal) into a digital value DQ using the clock signals CK1 and CK2 with the clock frequencies f1 and f2. Hereinafter, a case in which a scheme according to the embodiment is applied to time-to-digital conversion in which a time difference between transition timings of the signals STA and STP (first and second signals) is converted into a digital value will be mainly described, but the embodiment is not limited thereto. For example, the scheme of the embodiment may be applied to a time-to-digital conversion for measurement of an absolute time or the like.

The clock frequency f2 is a frequency that is different from the clock frequency f1 and, for example, is a frequency lower than the clock frequency f1. A time difference between transition timings of the signals STA and STP is a time difference between edges (for example, rising edges or falling edges) of the signals STA and STP. The time-to-digital conversion circuit 20 may perform a filtering process (a digital filtering process or a lowpass filtering process) on the digital value DQ and outputs the digital value DQ after the filtering process.

The oscillation elements XTAL1 and XTAL2 are, for example, piezoelectric resonators. Specifically, the oscillation elements XTAL1 and XTAL2 are, for example, quartz crystal resonators. For example, the oscillation elements XTAL1 and XTAL2 are thickness sliding oscillation type quartz crystal resonators, such as an AT cut type or an SC cut type. For example, the oscillation elements XTAL1 and XTAL2 may be simple package type (SPXO) resonators, may be an oven type (OCXO) resonator including a thermostatic oven, or may be a temperature compensated type (TCXO) not including a thermostatic oven. As the oscillation elements XTAL1 and XTAL2, surface acoustic wave (SAW) vibrators or micro electro mechanical systems (MEMS) resonators which are resonators made of silicon may be adopted.

The integrated circuit device 10 includes terminals P1 to P4 (first to fourth terminals or first to fourth pads). The terminals P1 to P4 are terminals (pads) for oscillation element connection. The terminal P1 (the first terminal) is a terminal that connects one end of the oscillation element XTAL1 to the oscillation circuit 101. The terminal P2 (the second terminal) is a terminal that connects the other end of the oscillation element XTAL1 to the oscillation circuit 101. The one end and the other end of the oscillation element XTAL1 are, for example, first and second electrodes of the oscillation element XTAL1. The oscillation element XTAL1 and the oscillation circuit 101 are connected by signal wirings L1 and L2. The signal wirings L1 and L2 are, for example, internal wirings (metal wirings) of a package of a physical quantity measurement apparatus. The signal wirings L1 and L2 connect the one end and the other end (first and second electrodes) of the oscillation element XTAL1 to the terminals P1 and P2 of the integrated circuit device 10. The physical quantity measurement apparatus is configured by the integrated circuit device 10 and the oscillation elements XTAL1 and XTAL2. The integrated circuit device 10 and the oscillation elements XTAL1 and XTAL2 are accommodated in the package of the physical quantity measurement apparatus.

The terminal P3 (the third terminal) is a terminal that connects one end of the oscillation element XTAL2 to the oscillation circuit 102. The terminal P4 (the fourth terminal) is a terminal that connects the other end of the oscillation element XTAL2 to the oscillation circuit 102. The one end and the other end of the oscillation element XTAL2 are, for example, first and second electrodes of the oscillation element XTAL2. The oscillation element XTAL2 and the oscillation circuit 102 are connected by signal wirings L3 and L4. The signal wirings L3 and L4 are, for example, internal wirings (metal wirings) of the package of the physical quantity measurement apparatus. The signal wirings L3 and L4 connect the one end and the other end (the first and second electrodes) of the oscillation element XTAL2 to the terminals P3 and P4 of the integrated circuit device 10.

In FIG. 1, the two oscillation circuits 101 and 102 are included and the time-to-digital conversion circuit 20 performs time-to-digital conversion using two clock signals CK1 and CK2 from the two oscillation circuits 101 and 102, but the embodiment is not limited thereto. For example, three or more oscillation circuits may be included to generate three or more clock signals and perform the time-to-digital conversion using the three or more clock signals. For example, in addition to the clock signals CK1 and CK2, a third clock signal is used to perform the time-to-digital conversion. In this way, high performance (high precision or the like) of the time-to-digital conversion is achieved.

As illustrated in FIG. 1, in the embodiment, the clock signals CK1 and CK2 are generated using the oscillation elements XTAL1 and XTAL2 and the clock signals CK1 and CK2 are used to perform the time-to-digital conversion. Therefore, the high precision of the time-to-digital conversion can be achieved. In particular, compared to the schemes of the related art of the above-described JP-A-2009-246484, JP-A-2007-110370, and JP-A-2010-119077 in which the time-to-digital conversion is realized using delay elements which are semiconductor elements, the precision of the time-to-digital conversion can be considerably improved.

In the scheme of the related art of the above-described JP-A-5-87954, an oscillation circuit is installed on a quartz crystal oscillator side and no oscillation circuit is installed on a circuit device side such as a microcomputer. Therefore, the first and second quartz crystal oscillators merely perform a free-running oscillation operation, and thus an oscillation operation of the first and second quartz crystal oscillators may not be controlled. In addition, since first and second clock pulses from the first and second quartz crystal oscillators may not have a given frequency relation or a given phase relation, there is a problem that circuit processing or a circuit configuration may be complicated or high performance of circuit processing may not sufficiently be realized.

In contrast, in the embodiment, as illustrated in FIG. 1, the oscillation circuits 101 and 102 oscillating the oscillation elements XTAL1 and XTAL2 are contained in the integrated circuit device 10. Accordingly, the oscillation circuits 101 and 102 can be controlled or the clock signals CK1 and CK2 can have a given frequency relation or a given phase relation. Thus, it is possible to realize high performance or simplification of a process for the time-to-digital conversion.

In the embodiment, as illustrated in FIG. 1, the terminals P1 to P4 for connection to the oscillation elements XTAL1 and XTAL2 are installed in the integrated circuit device 10. When the terminals P1 to P4 are installed in the integrated circuit device 10, circuit elements such as variable capacitance circuits can be connected to, for example, nodes (NB1, NB2, and NX1) of the terminals (P1 to P4) of the oscillation circuits in FIGS. 15 and 16 to be described below to control oscillation frequencies or the like. Thus, the oscillation frequencies of the oscillation circuits 101 and 102 can be controlled and the clock signals CK1 and CK2 can be set to have a given frequency relation. By installing the terminals P1 to P4 in the integrated circuit device 10, oscillation loops LP1 and LP2 can be electrically connected using a synchronization circuit 110 in FIG. 12 to be described below or an oscillation frequency of the oscillation circuit 101 can be controlled by a PLL circuit 120 in FIG. 14 to realize phase synchronization.

In FIG. 1, the time-to-digital conversion circuit 20 converts a time difference between transition timings of the signals STA and STP (first and second signals) into the digital value DQ. For example, the phases of the clock signals CK1 and CK2 are synchronized and the time-to-digital conversion circuit 20 transitions a signal level of the signal STA using the clock signal CK1 after a timing of the phase synchronization. For example, the signal level of the signal STA is changed from a first voltage level (for example, an L level) to a second voltage level (for example, an H level). Specifically, the time-to-digital conversion circuit 20 generates the signal STA of a pulse signal.

Then, the time-to-digital conversion circuit 20 calculates the digital value DQ corresponding to the time difference by comparing the phases of the clock signal CK2 and the signal STP of which the signal level is transitioned to correspond to the signal STA. For example, a timing at which a phase anteroposterior relation between the signal STP and clock signal CK2 is switched is determined through the phase comparison and the digital value DQ is calculated. The timing at which the anteroposterior relation between the phases is a timing at which the phase of one of the signal STP and the clock signal CK2 is changed from a state in which the one signal is behind the other signal in phase to a state in which the one signal is in front of the other signal in phase. Based on one of the signal STP and the clock signal CK2, the phase comparison of the signal STP and the clock signal CK2 can be realized, for example, by sampling the other signal. Alternatively, the comparison process for the phase comparison may be realized using a first count value which is based on the clock signal CK1 and a second count value which is based on the clock signal CK2.

In this way, in FIG. 1, the signal STA is generated based on the clock signal CK1, the phase comparison is performed on the clock signal CK2 and the signal STP of which the signal level is transitioned to correspond to the generated signal STA, and the digital value DQ corresponding to the time difference between the transition timings of the signals STA and STP is calculated. In this way, it is possible to realize the time-to-digital conversion with high performance (high precision or high resolution) while spontaneously generating the first signal used for the time-to-digital conversion.

Figure 2:
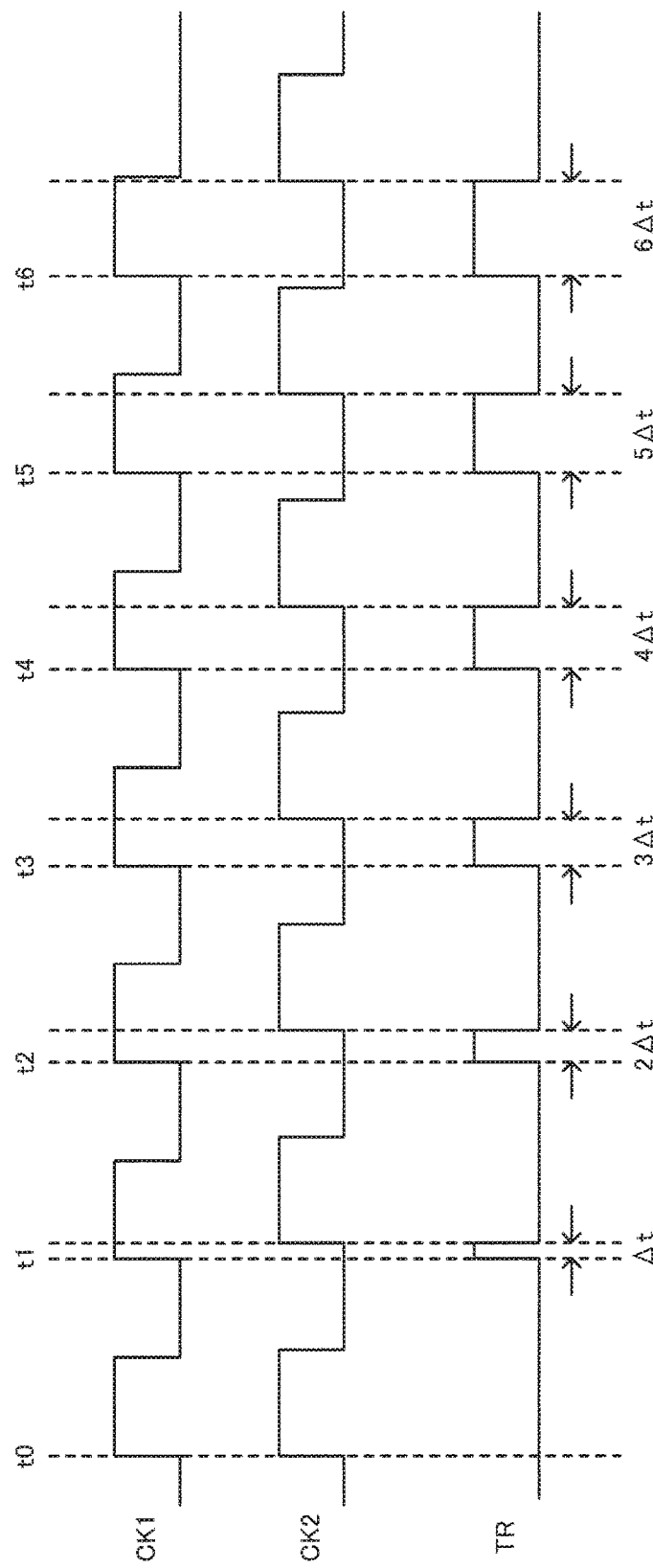
FIG. 2 is a diagram illustrating a time-to-digital conversion scheme using a clock frequency difference.

FIG. 2 is a diagram illustrating a time-to-digital conversion scheme using a clock frequency difference. At t0, the transition timings (phases) of the clock signals CK1 and CK2 match each other. Thereafter, at t1, t2, t3, and the like, an inter-clock time difference TR (phase difference) which is a time difference between the transition timings of the clock signals CK1 and CK2 is lengthened like $\Delta t$, $2\Delta t$, and $3\Delta t$. In FIG. 2, the inter-clock time difference is indicated by a pulse signal of TR.

Then, in the time-to-digital conversion according to the embodiment, for example, a time is converted into the digital value DQ employing a plurality of oscillation elements and using a clock frequency difference. That is, when f1 and f2 are clock frequencies of the clock signals CK1 and CK2, the time-to-digital conversion circuit 20 converts a time into the digital value DQ with a resolution corresponding a frequency difference $|f1-f2|$ between the clock frequencies f1 and f2. For example, as illustrated in FIG. 2, a time is converted into the digital value DQ using the principle of a caliper.

In this way, a resolution of the time-to-digital conversion can be set using the frequency difference $|f1-f2|$ between the clock frequencies f1 and f2, and thus it is possible to improve performance such as precision or a resolution of the time-to-digital conversion.

Specifically, a resolution (a time resolution) of the time-to-digital conversion according to the embodiment can be expressed as $\Delta t=|1/f1-1/f2|=|f1-f2|/(f1 \times f2)$. Then, the time-to-digital conversion circuit 20 converts a time into the digital value DQ with the resolution $\Delta t$ satisfying $\Delta t=|1/f1-1/f2|=|f1-f2|/(f1 \times f2)$. The resolution is expressed as $\Delta t=|f1-f2|/(f1 \times f2)$ and is a resolution corresponding to the frequency difference $|f1-f2|$.

In this way, the resolution of the time-to-digital conversion can be set by setting the clock frequencies f1 and f2. For example, by decreasing the frequency difference $|f1-f2|$ between the clock frequencies f1 and f2, it is possible to decrease the resolution $\Delta t$. Thus, it is possible to realize the time-to-digital conversion with a high resolution. By setting the clock frequencies f1 and f2 to high frequencies, it is possible to decrease the resolution $\Delta t$. Thus, it is possible to realize the time-to-digital conversion with a high resolution. Then, when the clock signals CK1 and CK2 of the clock frequencies f1 and f2 are generated using the oscillation elements XTAL1 and XTAL2, an improvement in the precision of the time-to-digital conversion is also achieved compared to a case in which delay elements which are semiconductor elements are used.

In particular, in the embodiment, quartz crystal resonators are used as the oscillation elements XTAL1 and XTAL2 (first and second oscillation elements). For example, thickness sliding oscillation type quartz crystal resonators, such as an AT cut type or an SC cut type are used. When the clock signals CK1 and CK2 are generated using the quartz crystal resonators in this way, high precision of the clock frequencies f1 and f2 are achieved. A change in the clock frequencies f1 and f2 caused due to, for example, a manufacturing variation or an environment change such as a temperature change can be minimized. Accordingly, a change in the resolution $\Delta t=|f1-f2|/(f1 \times f2)$ can also be minimized, and thus it is possible to realize higher performance of the time-to-digital conversion.

Figure 3:
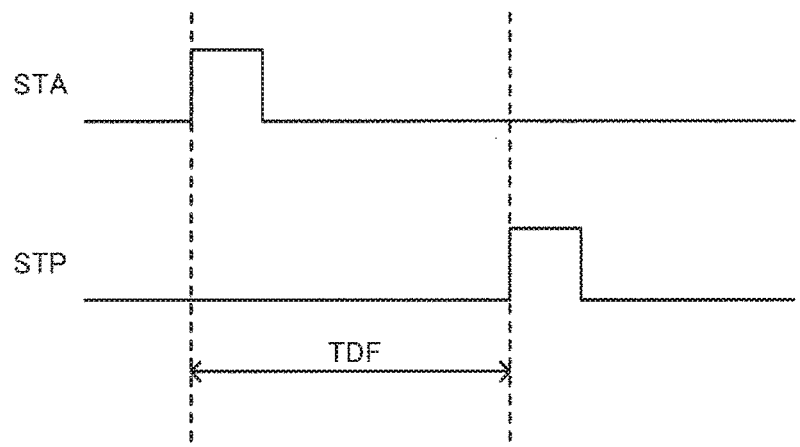
FIG. 3 is a diagram illustrating a relation between signals STA and STP.

FIG. 3 is a diagram illustrating a relation between the signal STA (a first signal such as a start signal) and the signal STP (a second signal such as a stop signal). The time-to-digital conversion circuit 20 according to the embodiment converts a time difference TDF between transition timings of the signals STA and STP into a digital value. In FIG. 3, TDF is a time difference between transition timings of rises (between rising edges) of the signals STA and STP, but may be a time difference between transition timings of falls (between falling edges) of the signals STA and STP.

Figure 4:
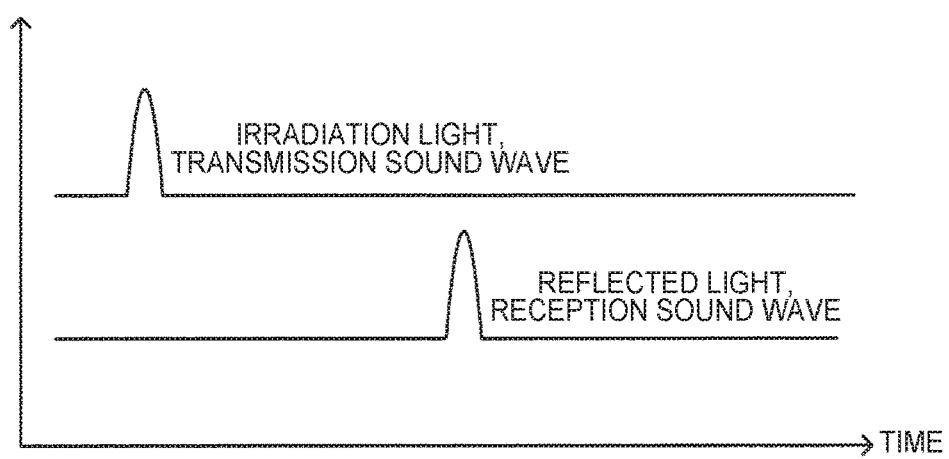
FIG. 4 is a diagram illustrating an example of a physical quantity measurement in which the signals STA and STP are used.

FIG. 4 is a diagram illustrating an example of physical quantity measurement in which the signals STA and STP are used. For example, a physical quantity measurement apparatus including the integrated circuit device 10 according to the embodiment emits irradiation light (for example, a laser beam) to a target object (for example, an object around a vehicle) using the signal STA. Then, the signal STP is generated by receiving reflected light from the target object. For example, the physical quantity measurement apparatus generates the signal STP by shaping a waveform of a light-received signal. In this way, a distance to the target object can be measured as a physical quantity, for example, in a time of flight (TOF) scheme, by converting the time difference TDF between the transition timings of the signals STA and STP into a digital value. Thus, for example, automatic driving of a vehicle or the like can be implemented.

Alternatively, the physical quantity measurement apparatus transmits a transmission sound wave (for example, an ultrasonic wave) to a target object (for example, an organism) using the signal STA. Then, the signal STP is generated by receiving a reception sound wave from the target object. For example, the physical quantity measurement apparatus generates the signal STP by shaping a waveform of the reception sound wave. In this way, a distance to the target object or the like can be measured by converting the time difference TDF between the transition timings of the signals STA and STP into a digital value. Thus, organism information can be measured with an ultrasonic wave.

In FIGS. 3 and 4, transmission data may be transmitted with the signal STA and a time in which reception data is received after the transmission of the transmission data may be measured using the signal STP in reception of the reception data. A physical quantity measured by the physical quantity measurement apparatus according to the embodiment is not limited to a time or a distance. Various physical quantities such as a flow quantity, a flow rate, a frequency, a speed, an acceleration, an angular velocity, and an angular acceleration can be measured instead.

2. First Configuration Example

Figure 5:
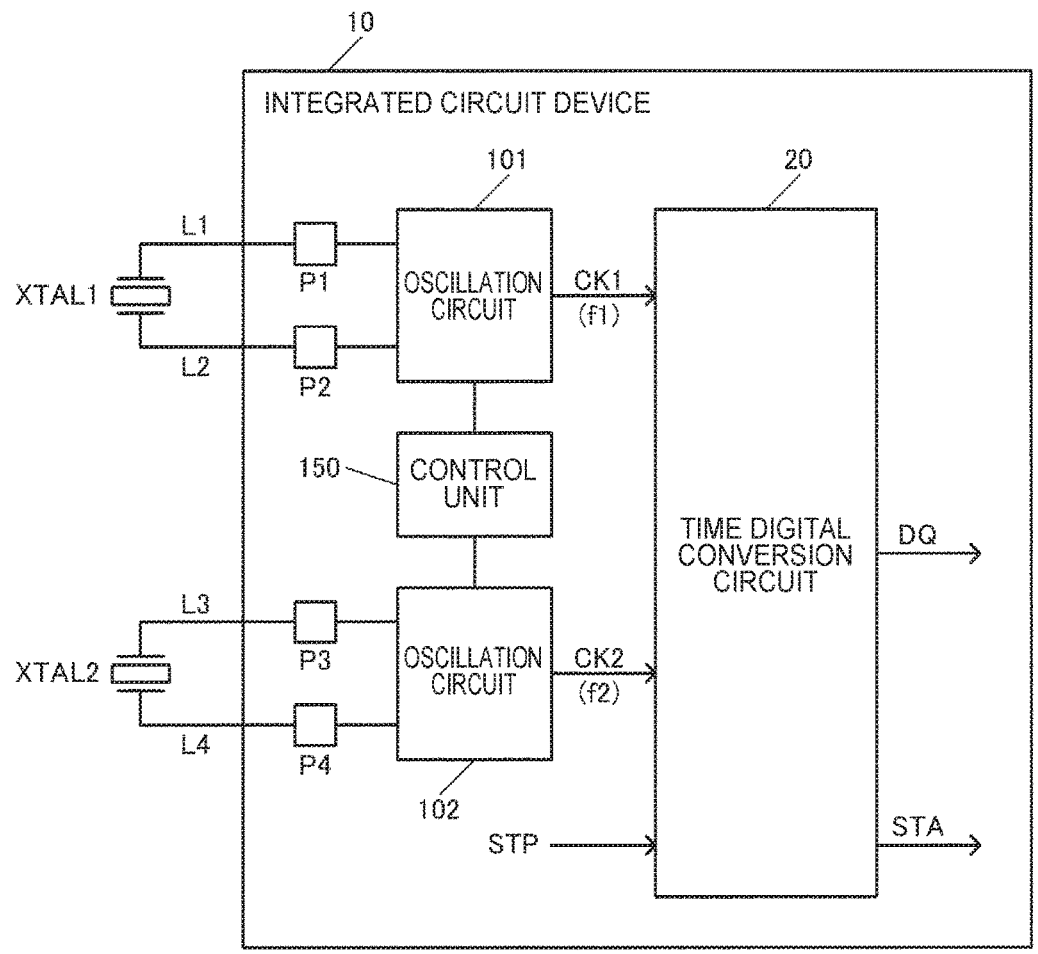
FIG. 5 is a diagram illustrating a first configuration example of the integrated circuit device according to the embodiment.

FIG. 5 illustrates a first configuration example of the integrated circuit device 10 according to the embodiment. In the first configuration example of FIG. 5, a control unit 150 is further installed in the configuration of FIG. 1. The control unit 150 controls at least one of the oscillation circuits 101 and 102. For example, both of the oscillation circuits 101 and 102 are controlled or one of the oscillation circuits 101 and 102 is controlled.

For example, in the scheme of the related art of the above-described JP-A-5-87954, the first and second quartz crystal oscillators operate in a free-running manner without being subjected to any control. In contrast, in the integrated circuit device 10 in FIG. 5, the control unit 150 controls an operation or setting of at least one of the oscillation circuits 101 and 102. For example, the control unit 150 controls a circuit operation such as an oscillation operation of at least one oscillation circuit or controls setting of a circuit constant such as an oscillation frequency or a phase. In this way, under the control of the control unit 150, for example, a frequency relation or a phase relation between the clock signals CK1 and CK2 can be set to a frequency relation or a phase relation appropriate for the time-to-digital conversion. Thus, it is possible to realize high performance or simplification of the process for the time-to-digital conversion.

Figure 6:
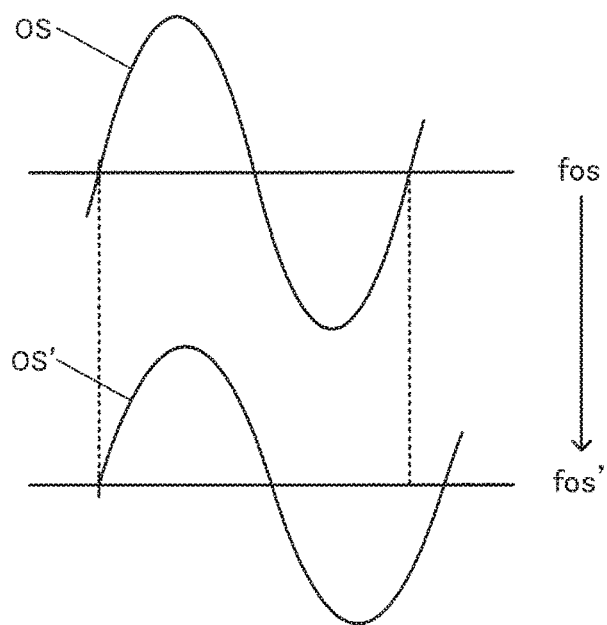
FIG. 6 is a diagram illustrating control of an oscillation frequency of an oscillation signal.

Specifically, the control unit 150 controls at least one of an oscillation frequency and a phase of an oscillation signal of at least one of the oscillation circuits 101 and 102. For example, in FIG. 6, the control unit 150 performs control so that an oscillation frequency of an oscillation signal OS (OS1 or OS2 to be described below) of at least one oscillation circuit is changed from fos to fos'. For example, the control unit 150 performs control so that the oscillation frequency is changed so that the clock signals CK1 and CK2 have a given frequency relation. For example, the oscillation frequency of at least one oscillation circuit is controlled so that the phases of the clock signals CK1 and CK2 are synchronized at a phase synchronization timing as in FIG. 14 to be described below.

Figure 7:
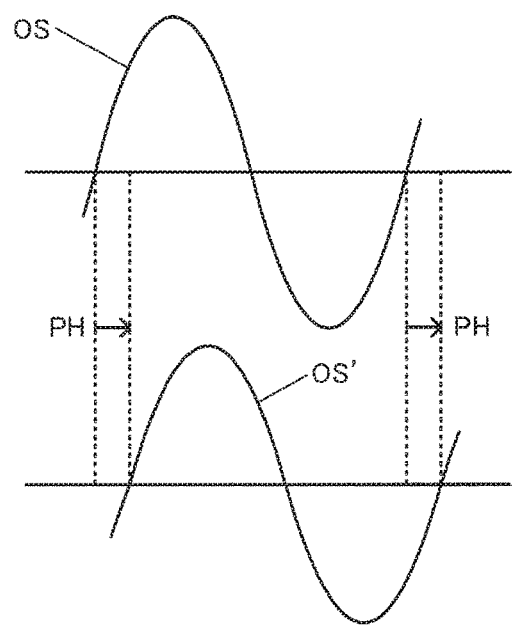
FIG. 7 is a diagram illustrating control of a phase of an oscillation signal.

In FIG. 7, the control unit 150 performs control so that the phase of the oscillation signal OS of at least one oscillation circuit is changed as indicated by PH. For example, the control unit 150 performs control so that the phases are changed so that the clock signals CK1 and CK2 have a given phase relation. For example, as in FIG. 12 to be described below, the phase of at least one oscillation circuit is controlled so that the phases of the clock signals CK1 and CK2 are synchronized at the phase synchronization timing.

When the control unit 150 controls the oscillation frequency or the phase of the oscillation signal in this way, for example, the frequency relation or the phase relation between the clock signals CK1 and CK2 can be set to the frequency relation or the phase relation appropriate for the time-to-digital conversion. Accordingly, since the time-to-digital conversion can be realized using the clock signals CK1 and CK2 set to have the appropriate frequency relation or phase relation, it is possible to realize high performance or simplification of the process for the time-to-digital conversion.

The control of the oscillation frequency of the oscillation signal can be realized as, for example, control of a capacitance value of a variable capacitance circuit installed in the oscillation circuit. The control of the phase of the oscillation signal can be realized, for example, by connecting an oscillation loop to a phase synchronization timing by the synchronization circuit 110 to be described below.

The control unit 150 controls at least one of the oscillation circuits 101 and 102 so that the clock signals CK1 and CK2 have a given frequency relation or a given phase relation. For example, the control unit 150 controls at least one oscillation circuit so that the frequency relation or the phase relation appropriate for the time-to-digital conversion is obtained. For example, the control unit 150 controls at least one oscillation circuit so that a frequency difference or a phase difference between the clock signals CK1 and CK2 becomes a predetermined frequency difference or phase difference. Alternatively, the control unit 150 controls at least one oscillation circuit so that the phases of the clock signals CK1 and CK2 are synchronized at a phase synchronization timing. For example, the control unit 150 controls at least one oscillation circuit so that transition timings of the clock signals CK1 and CK2 match (substantially match) at the phase synchronization timing.

The frequency relation between the clock signals CK1 and CK2 is a relation of a frequency difference between the clock frequencies f1 and f2 of the clock signals CK1 and CK2, a relation of a frequency ratio, a predetermined relation equation indicated by the clock frequencies, or a magnitude relation between the frequencies. The phase relation between the clock signals CK1 and CK2 is a relation of a phase difference or a phase anteroposterior relation between the clock signals CK1 and CK2. For example, even when a manufacturing variation or an environment change such as a temperature change occurs, the control unit 150 controls at least one of the oscillation circuits 101 and 102 so that the frequency relation (the frequency difference, the magnitude relation, the frequency ratio, or the like) or the phase relation (the phase difference, the phase anteroposterior relation, or the like) between the clock signals CK1 and CK2 is maintained as a given relation. In this way, the time-to-digital conversion can be realized in a state in which the frequency relation or the phase relation between the clock signals CK1 and CK2 is appropriate, and thus high performance or simplification of the process for the time-to-digital conversion is achieved.

Specifically, when f1 and f2 are the clock frequencies of the clock signals CK1 and CK2, the control unit 150 controls at least one of the oscillation circuits 101 and 102 so that N/f1=M/f2 is satisfied. In this way, the clock signals CK1 and CK2 are set to have the appropriate frequency relation and it is possible to realize the time-to-digital conversion.

Figure 8:
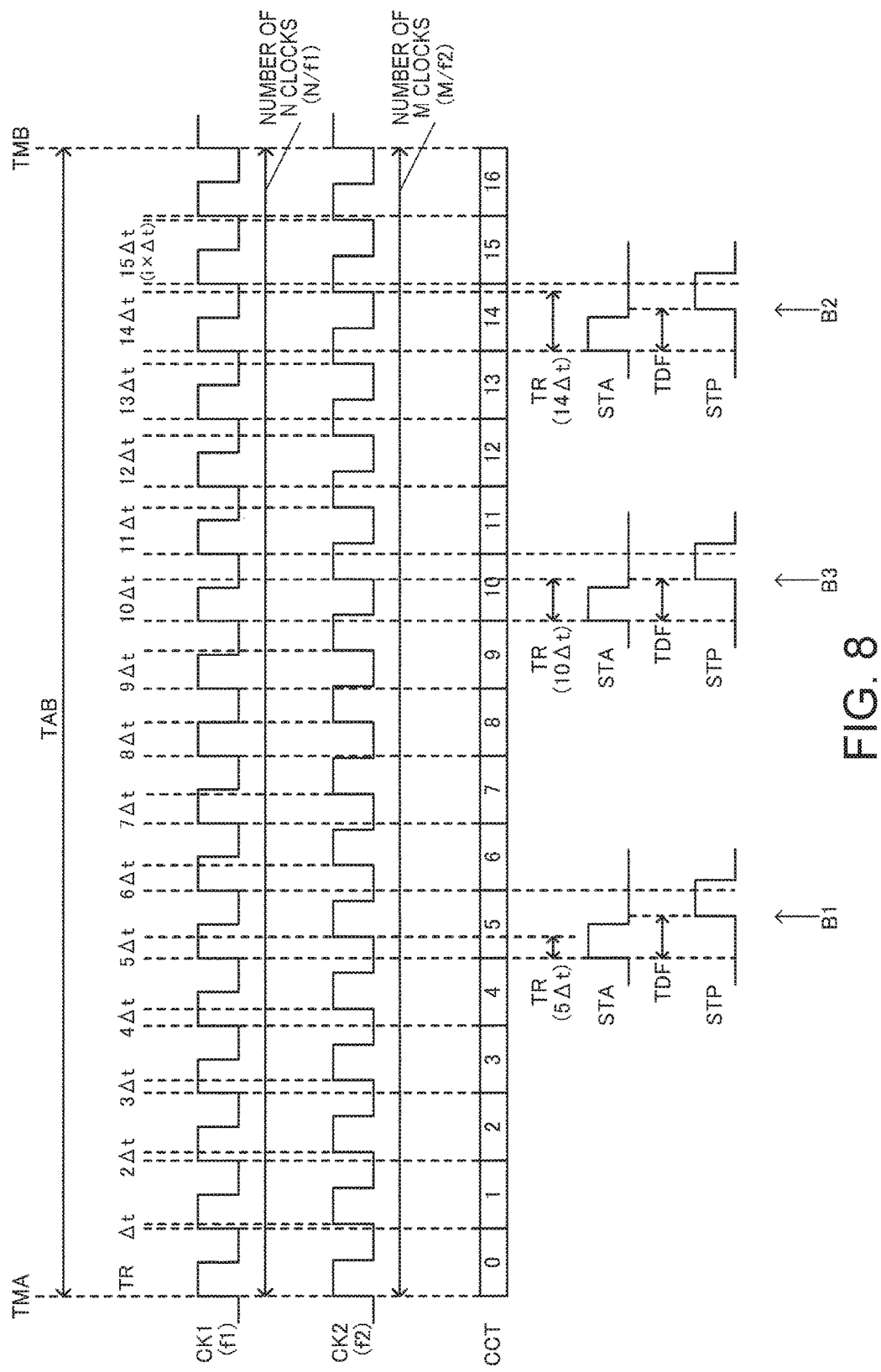
FIG. 8 is a diagram illustrating signal waveforms for describing time-to-digital conversion according to the embodiment.

FIG. 8 is a diagram illustrating signal waveforms for describing time-to-digital conversion according to the embodiment. In FIG. 8, at a phase synchronization timing TMA, the phases of the clock signals CK1 and CK2 are synchronized and transition timings of the clock signals CK1 and CK2 match. Thereafter, as described with reference to FIG. 2, a time difference between the transition timings of the clock signals CK1 and CK2 increases by $\Delta t$ for each clock cycle (CCT), like $\Delta t$, $2\Delta t$, $3\Delta t$, and the like. Then, at a subsequent phase synchronization timing TMB, the phases of the clock signals CK1 and CK2 are synchronized and the transition timings of the clock signals CK1 and CK2 match.

As illustrated in FIG. 8, the length of a period TAB between the phase synchronization timings TMA and TMB is set to a length corresponding to the number of N clocks of the clock signal CK1. The length of the period TAB is a length corresponding to the number of M clocks of the clock signal CK2. Here, N and M are mutually different integers equal to or greater than 2. For example, N=17 and M=16 are set and N−M=1 is satisfied in FIG. 8.

For example, when the length of the period TAB is expressed with the same reference sign TAB, TAB=N/f1=M/f2 is satisfied in FIG. 8. That is, a relation of N/f1=M/f2 is established between the clock frequencies f1 and f2. For example, when the clock frequency f2 is set to f2=16 MHz and N=17 and M=16 are set, f1=17 MHz is obtained and a relation equation of N/f1=M/f2 is established. The control unit 150 controls at least one of the oscillation circuits 101 and 102 so that the relation of N/f1=M/f2 is established.

In this way, as illustrated in FIG. 8, after the transition timings of the clock signals CK1 and CK2 match at the phase synchronization timing TMA, the inter-clock time difference TR between the clock signals CK1 and CK2 increases by $\Delta t$ like $\Delta t$, $2\Delta t$, $3\Delta t$, and the like. That is, the inter-clock time difference TR between the clock signals CK1 and CK2 increasing by $\Delta t$ for each clock cycle can be produced. Then, at the subsequent phase synchronization timing TMB, the transition timings of the clock signals CK1 and CK2 match and the inter-clock time difference TR becomes 0. Thereafter, the inter-clock time difference TR increases by $\Delta t$ for each clock cycle.

In this way, a process of time-to-digital conversion (a first scheme, a second scheme, a repeating scheme, an updating scheme, or a binary scheme) can be realized in such a manner that the phase synchronization timing becomes 0 and the inter-clock time difference TR increasing by $\Delta t$ (a resolution) is subsequently produced. That is, it is possible to realize the time-to-digital conversion in which a time is converted into a digital value at the resolution $\Delta t$. Then, in the process for the time-to-digital conversion at the resolution $\Delta t$, as illustrated in FIG. 8, the inter-clock time difference TR at each clock cycle (CCT) within the period TAB can be uniquely specified. Therefore, the process for the time-to-digital conversion or the simplification of the circuit configuration is achieved. An improvement in the precision of the time-to-digital conversion is achieved by matching (substantially matching) the transition timings of the clock signal CK1 and CK2 at the phase synchronization timings TMA and TMB.

For example, as a scheme of a comparison example according to the embodiment, a scheme of setting a clock frequency designed to establish the relation of N/f1=M/f2 without controlling at least one oscillation circuit by the control unit 150 is considered. For example, a scheme of establishing the relation of N/f1=M/f2 as a relation between clock frequencies designed for the first and second quartz crystal oscillators in the scheme of the related art of the above-described JP-A-5-87954 is considered.

However, clock frequencies in the first and second quartz crystal oscillators are changed due to a manufacturing variation or an environment change such as a temperature change. Accordingly, even when the relation of N/f1=M/f2 is established in design, the relation of N/f1=M/f2 may not be established in an actual product. Therefore, since a deviation occurs in transition timings, conversion precision of the time-to-digital conversion may degrade.

In contrast, in the embodiment, even when clock frequencies are changed due to a manufacturing variation or an environment change, the control unit 150 controls at least one of the oscillation circuits 101 and 102 so that the clock signals CK1 and CK2 have a given frequency relation or phase relation. For example, the control unit 150 controls at least one oscillation circuit so that N/f1=M/f2 is established. Thus, the frequency relation or the phase relation between the clock signals CK1 and CK2 is adjusted so that a change caused due to a manufacturing variation or an environment change is compensated. Accordingly, even when such a change occurs, it is possible to realize the appropriate time-to-digital conversion. It is possible to prevent a drop of a conversion error caused due to a deviation between the transition timings of the clock signals CK1 and CK2 at the phase synchronization timings TMA and TMB, and thus high performance time-to-digital conversion is achieved.

In this way, in the embodiment, the control unit 150 controls the oscillation circuit so that the relation equation of N/f1=M/f2 is established. As described with reference to FIG. 2, the resolution $\Delta t$ of the time-to-digital conversion according to the embodiment can be expressed as a relation equation of $\Delta t=|f1-f2|/(f1 \times f2)$. Accordingly, Equation (1) below is established from the two relation equations.

$$\Delta t=|N-M|/(N \times f2)=|N-M|/(M \times f1) \qquad (1)$$

In this way, N and M are set in accordance with the resolution $\Delta t$ calculated in the time-to-digital conversion and the clock signals CK1 and CK2 can be generated.

For example, a resolution of $\Delta t=2$ nanoseconds (ns) is assumed to be calculated as the resolution of the time-to-digital conversion. Then, the clock frequency of the clock signal CK2 is assumed to be f2=100 MHz. In this case, by setting N=5 and M=4 in Equation (1) above, the time-to-digital conversion can be realized at the resolution $\Delta t=|5-$ 4|/(5×f2)=2 ns. At this time, the clock frequency of the clock signal CK1 becomes f1=(N/M)×f2=125 MHz from the relation equation of N/f1=M/f2. p A resolution of Δt=1 picoseconds (ps) is assumed to be calculated as the resolution of the time-to-digital conversion. Then, the clock frequency of the clock signal CK2 is assumed to be f2=122.865 MHz. In this case, by setting N=8139 and M=8138 in Equation (1) above, the time-to-digital conversion can be realized at the resolution Δt=|8139−8138|/(8139×f2)=1 ps. At this time, the clock frequency of the clock signal CK1 becomes f1=(N/M)×f2=122.880 MHz from the relation equation of N/f1=M/f2.

In the embodiment, the time-to-digital conversion circuit 20 converts the time difference TDF between the transition timings of the signals STA and STP into a digital value. In this case, in FIG. 8, after the phase synchronization timing TMA of the clock signals CK1 and CK2, the inter-clock time difference TR which is a time difference between the transition timings of the clock signals CK1 and CK2 at first to i-th clock cycles (where i is an integer equal to or greater than 2) is Δt to i×Δt. For example, after the phase synchronization timing TMA, the inter-clock time difference is TR=Δt at the first clock cycle (CCT=1). Similarly, the inter-clock time difference is TR=2Δt to 14Δt at the second to fourteenth clock cycles (CCT=2 to 14). Then, at the fifteenth clock cycle (in a broad sense, an i-th clock cycle or CCT=i=15), the inter-clock time difference is TR=15Δt (i×Δt). In this way, after the phase synchronization timing TMA, the inter-clock time difference between the clock signals CK1 and CK2 increases by Δt and the inter-clock time difference at a j-th clock cycle (where i≤j≤i) is TR=j×Δt.

Then, in the time-to-digital conversion scheme according to the embodiment, the time-to-digital conversion circuit 20 calculates the digital value DQ by specifying whether the time difference TDF between the transition timings of the signals STA and STP corresponds to one of TR=Δt to i×Δt which is the inter-clock time difference of the transition timings of the clock signals CK1 and CK2.

For example, the inter-clock time difference at a clock cycle (CCT=5) indicated by B1 of FIG. 8 is TR=5Δt. As indicated by B1, the time difference TDF between the signals STA and STP is longer than the inter-clock time difference TR=5Δt. That is, TDF>TR=5Δt is satisfied.

The inter-clock time difference at a clock cycle (CCT=14) indicated by B2 is TR=14Δt. As indicated by B2, the time difference TDF between the signals STA and STP is shorter than the inter-clock time difference TR=14Δt. That is, TDF<<TR=14Δt is satisfied.

The inter-clock time difference is TR=10Δt at a clock cycle (CCT=10) indicated by B3. As indicated by B3, the time difference TDF between the signals STA and STP is equal (substantially the same as) to the inter-clock time difference TR=10Δt. That is, TDF=TR=10Δt is satisfied. Accordingly, the time difference TDF between the signals STA and STP is specified when the inter-clock time difference corresponds to the TR=10Δt. As a result, the digital value DQ corresponding to the time difference TDF can be determined to be a digital value corresponding to, for example, TR=10Δt.

In this way, the time difference TDF between the signals STA and STP can be calculated using the inter-clock time difference TR increasing by Δt after the phase synchronization timing TMA. Accordingly, it is possible to realize the time-to-digital conversion in which the clock signals CK1 and CK2 with different clock frequencies are effectively utilized.

Figure 9:
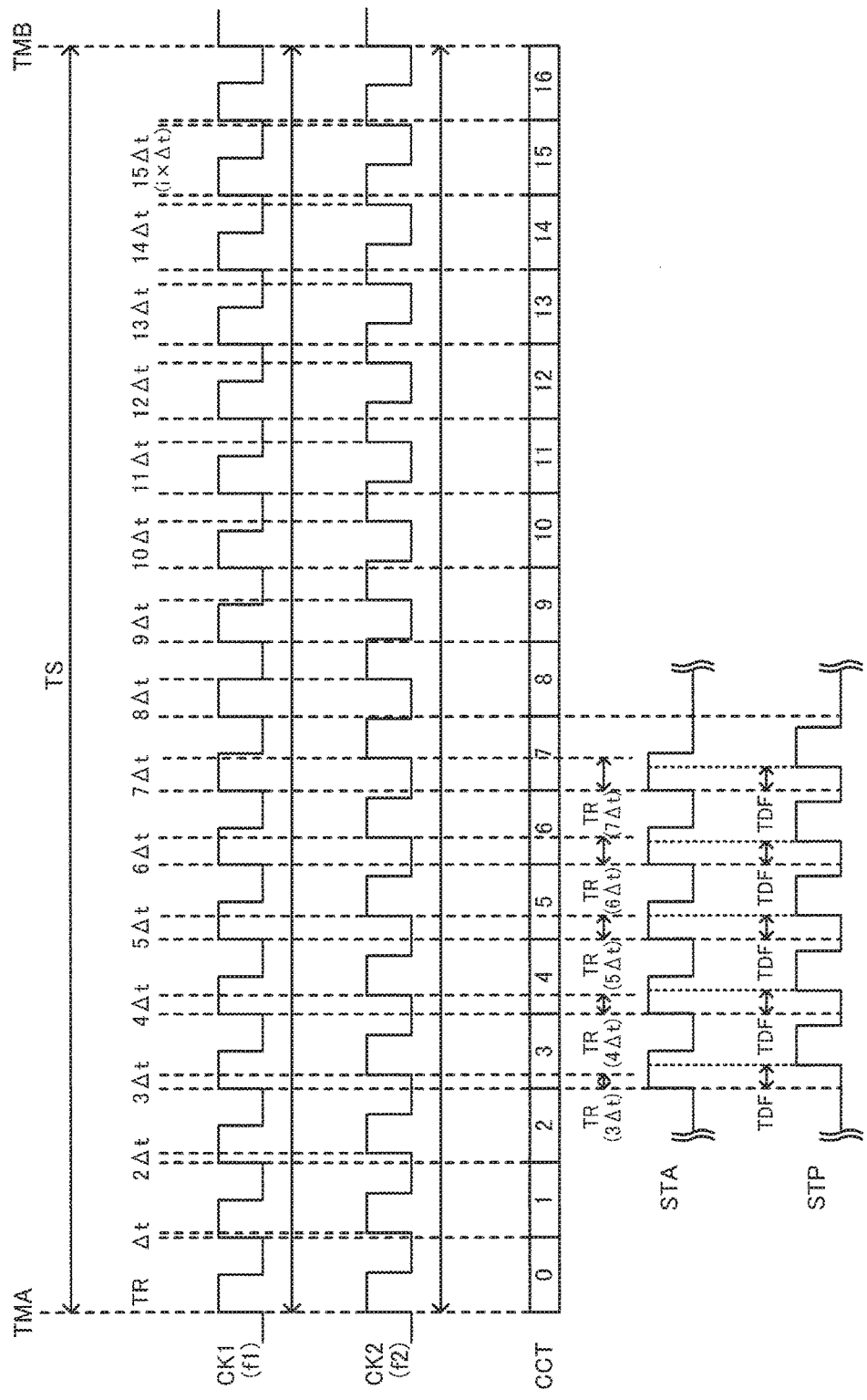
FIG. 9 is a diagram illustrating signal waveforms for describing a first scheme of the time-to-digital conversion.

Here, as a scheme for realizing the time-to-digital conversion according to the embodiment in FIG. 8, there are first and second schemes. FIG. 9 is a diagram illustrating signal waveforms for describing the first scheme. As the time-to-digital conversion of the first scheme, there is a repeating scheme or the like to be described below.

For example, in FIG. 9, a period between the phase synchronization timings TMA and TMB of the clock signals CK1 and CK2 (a period between first and second phase synchronization timings) is referred to as a measurement period TS. The phase synchronization timing TMB is a subsequent phase synchronization timing of the phase synchronization timing TMA.

In this case, the time-to-digital conversion circuit 20 generates the plurality of signals STA at a plurality of clock cycles of the measurement period TS. For example, in FIG. 9, pulse signals of the signals STA are generated at third to seventh clock cycles (CCT=3 to 7). Then, the time-to-digital conversion circuit 20 acquires (receives) the plurality of signals STP of which a signal level is changed to correspond to the plurality of generated signals STA. For example, the time-to-digital conversion circuit 20 acquires (receives) the signal STP of which the signal level is changed to correspond to the signal STA generated at the third clock cycle (CCT=3). Similarly, the time-to-digital conversion circuit 20 acquires the signals STP of which the signal level is changed to correspond to the signals STA generated at the fourth, fifth, sixth, and seventh clock cycles (CCT=4, 5, 6, and 7).

Then, the time-to-digital conversion circuit 20 calculates the digital value DQ in accordance with a result of a comparison process of comparing the time difference TDF between the signals STA and STP at each of the plurality of clock cycles to the inter-clock time difference TR at each clock cycle. For example, in FIG. 9, the comparison process of comparing each of the inter-clock time difference TR=3Δt, 4Δt, 5Δt, 6Δt, and 7Δt at the third, fourth, fifth, sixth, and seventh clock cycles (CCT=3, 4, 5, 6, and 7) to the time difference TDF is performed. Then, results of TDF>3Δt, TDF>4Δt, TDF=5Δt, TDF<6Δt, and TDF<7Δt can be obtained through the comparison process at each clock cycle. Accordingly, the digital value DQ corresponding to the time difference TDF between the signals STA and STP is determined to be a digital value corresponding to, for example, TR=5Δt.

In this way, in the first scheme of FIG. 9, the plurality of signals STA are continuously generated across the plurality of clock cycles. Then, the plurality of signals STP of which the signal level is transitioned to correspond to the plurality of signals STA are acquired and the comparison process of comparing the time difference TDF between each signal STA and each corresponding signal STP to the inter-clock time difference TR at each clock cycle is performed. Since the inter-clock time difference TR at each clock cycle increases by Δt, as illustrated in FIG. 9, the digital value corresponding to the time difference TDF can be obtained through the comparison process. In this way, it is possible to specify whether the time difference TDF corresponds to one of the inter-clock time difference TR=Δt to 15Δt (where Δt to i×Δt) in FIG. 9 during the one-time measurement period TS. Accordingly, it is possible to realize acceleration of the time-to-digital conversion.

Figure 10:
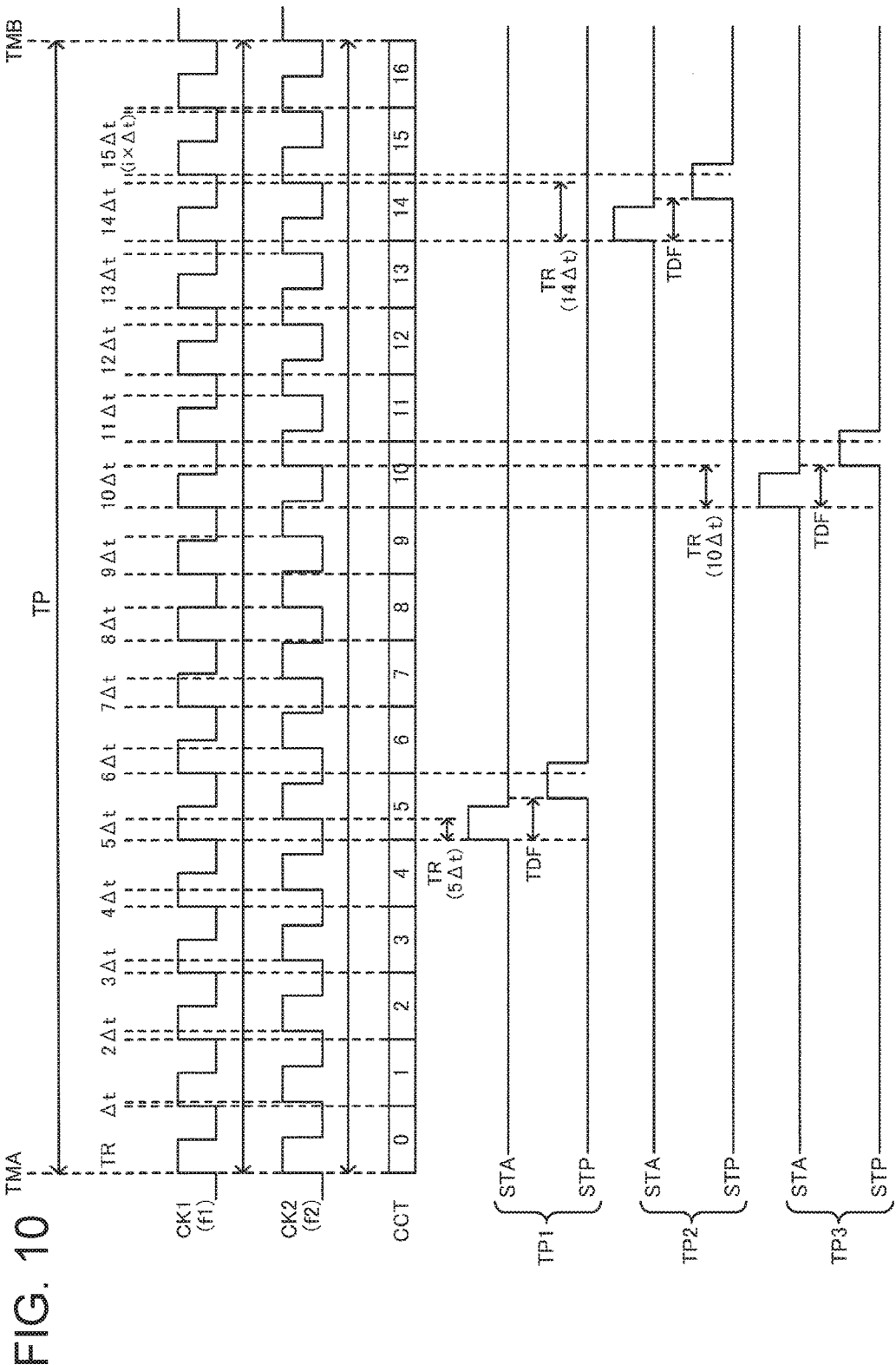
FIG. 10 is a diagram illustrating signal waveforms for describing a second scheme of the time-to-digital conversion.

FIG. 10 is a diagram illustrating signal waveforms for describing the second scheme of the time-to-digital conversion according to the embodiment. As the time-to-digital conversion of the second scheme, there is an updating scheme or a binary searching scheme to be described below.

For example, in FIG. 10, a period between the phase synchronization timings TMA and TMB of the clock signals CK1 and CK2 is referred to as an updating period TP. Specifically, in FIG. 10, a period between the first and second phase synchronization timings of the clock signals CK1 and CK2 is an updating period TP1 (a first updating period). A period between second and third phase synchronization timings is an updating period TP2 (a second updating period). A period between third and fourth phase synchronization timings is an updating period TP3 (a third updating period). The updating period TP2 is a subsequent updating period of TP1 and the updating period TP3 is a subsequent updating period of TP2. The same applies to subsequent updating periods.

In this case, as illustrated in FIG. 10, during the updating period TP1, the time-to-digital conversion circuit 20 generates the signal STA, for example, at the fifth clock cycle (in a broad sense, an m-th clock cycle (where m is an integer equal to or greater than 1) and CCT=5) and acquires the signal STP of which the signal level is changed to correspond to the generated signal STA. Then, the comparison process of comparing the time difference TDF between the signals STA and STP at the fifth clock cycle (the m-th clock cycle) to the inter-clock time difference TR=5Δt is performed. Here, TDF>TR=5Δt is satisfied and a result of the comparison process in which the time difference TDF is longer than the inter-clock time difference TR=5Δt is obtained.

During the updating period TP2 subsequent to the updating period TP1, the time-to-digital conversion circuit 20 generates the signal STA at the fourteenth clock cycle (in a broad sense, an n-th clock cycle (where n is an integer equal to or greater than 1), m and n are mutually different integers, and CCT=14) set in accordance with the result of the comparison process during the updating period TP1 and acquires the signal STP of which the signal level is changed to correspond to the generated signal STA. For example, during the updating period TP1, a result of the comparison process in which the time difference TDF is longer than the inter-clock time difference TR=5Δt is obtained. Therefore, during the updating period TP2 subsequent thereto, a clock cycle at which the inter-clock time difference TR is longer is set. For example, the signal STA is generated at the fifth clock cycle at which the inter-clock time difference is TR=5Δt during the updating period TP1, but the signal STA is generated at the fourteenth clock cycle at which the inter-clock time difference is TR=14Δt during the updating period TP2. Then, the comparison process of comparing the time difference TDF between the signals STA and STP at the fourteenth clock cycle (the n-th clock cycle) to the inter-clock time difference TR=14Δt is performed. Here, TDF<TR=14Δt is satisfied and a result of the comparison process in which the time difference TDF is shorter than the inter-clock time difference TR=14Δt is obtained.

During the updating period TP3 subsequent to the updating period TP2, the time-to-digital conversion circuit 20 generates the signal STA at the tenth clock cycle (CCT=10) set in accordance with the result of the comparison process during the updating period TP2 and acquires the signal STP of which the signal level is changed to correspond to the generated signal STA. For example, during the updating period TP2, a result of the comparison process in which the time difference TDF is shorter than the inter-clock time difference TR=14Δt is obtained. Therefore, during the updating period TP3 subsequent thereto, a clock cycle at which the inter-clock time difference TR is shorter is set. For example, the signal STA is generated at the fourteenth clock cycle at which the inter-clock time difference is TR=14Δt during the updating period TP2, but the signal STA is generated at the tenth clock cycle at which the inter-clock time difference is TR=10Δt during the updating period TP3. Then, the comparison process of comparing the time difference TDF between the signals STA and STP at the tenth clock cycle to the inter-clock time difference TR=10Δt is performed. Here, TDF=TR=10Δt is satisfied and a result of the comparison process in which the time difference TDF is the same (substantially the same) as the inter-clock time difference TR=10Δt is obtained. Accordingly, the digital value DQ corresponding to the time difference TDF between the signals STA and STP is determined to be a digital value corresponding to, for example, the inter-clock time difference TR=10Δt.

In this way, in the second scheme of FIG. 10, the result of the comparison process during the previous updating period is fed back, the clock cycle at which the signal STA is generated during the current updating period is set, and the comparison process of comparing the time difference TDF to the inter-clock time difference TR is performed. In this case, by feeding the result of the comparison process back during the previous updating period, the time-to-digital conversion can be further accelerated compared to, for example, the scheme of the related art of the above-described JP-A-5-87954. Even when a time or a physical quantity which is a measurement target is dynamically changed, the time-to-digital conversion following the dynamic change can be realized.

The comparison process of comparing the time difference TDF to the inter-clock time difference TR can be realized comparing the phases of the signal STP and the clock signal CK2 to be described in a repeating scheme, an updating scheme, and a binary searching scheme to be described below. Alternatively, the comparison process may also be realized using a first count value which is based on the clock signal CK1 and a second count value which is based on the clock signal CK2. For example, the comparison process may also be realized using first and second count values at a timing at which the signal level of the signal STP is changed.

3. Second Configuration Example

Figure 11:
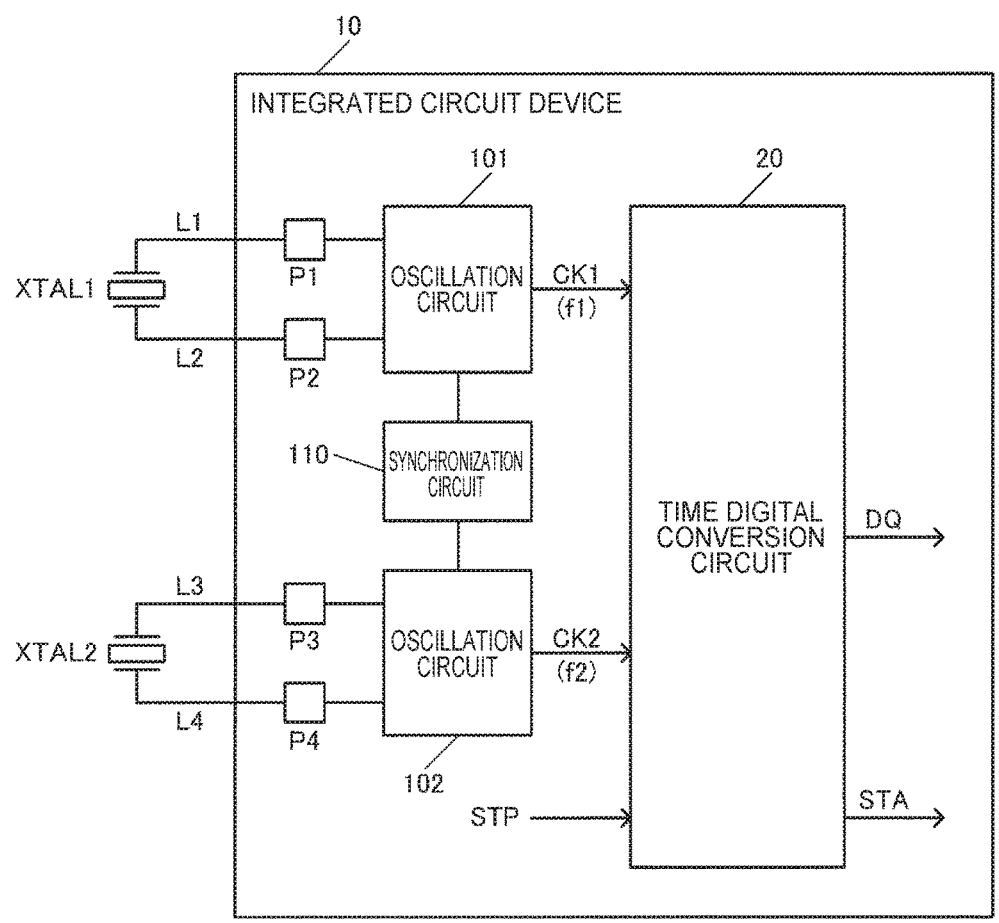
FIG. 11 is a diagram illustrating a second configuration example of the integrated circuit device according to the embodiment.

FIG. 11 illustrates a second configuration example of the integrated circuit device 10 according to the embodiment. In the second configuration example of FIG. 11, a synchronization circuit 110 is installed as the control unit 150 in FIG. 5.

The synchronization circuit 110 synchronizes phases of the clock signals CK1 and CK2. For example, the synchronization circuit 110 synchronizes the phases of the clock signals CK1 and CK2 at each phase synchronization timing (each given timing). Specifically, the synchronization circuit 110 performs phase synchronization to match the transition timings of the clock signals CK1 and CK2 with each other at each phase synchronization timing.

Figure 12:
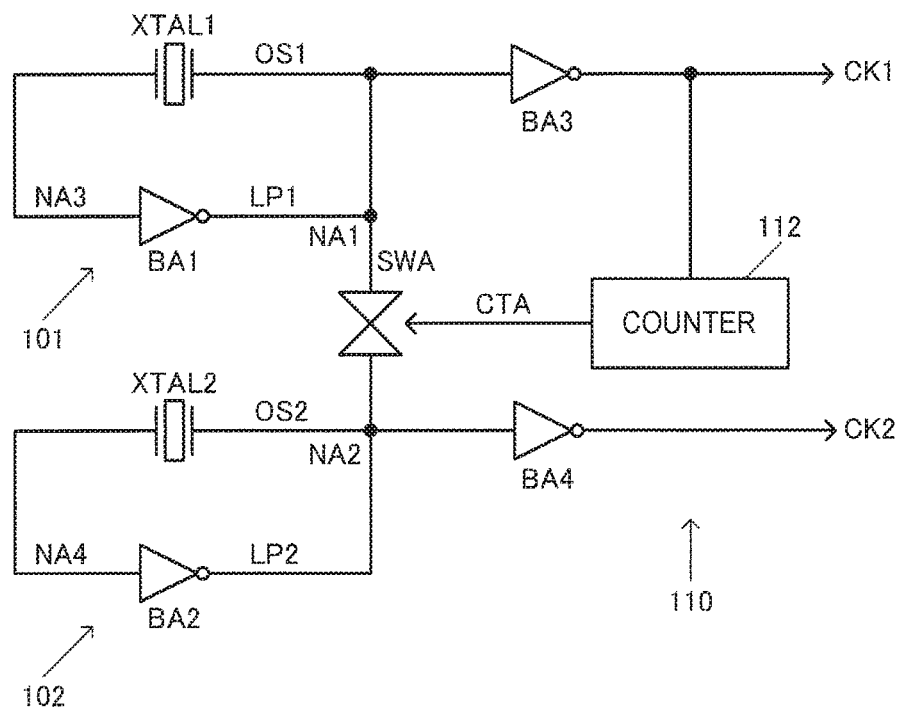
FIG. 12 is a diagram illustrating a first configuration example of a synchronization circuit.
Figure 13:
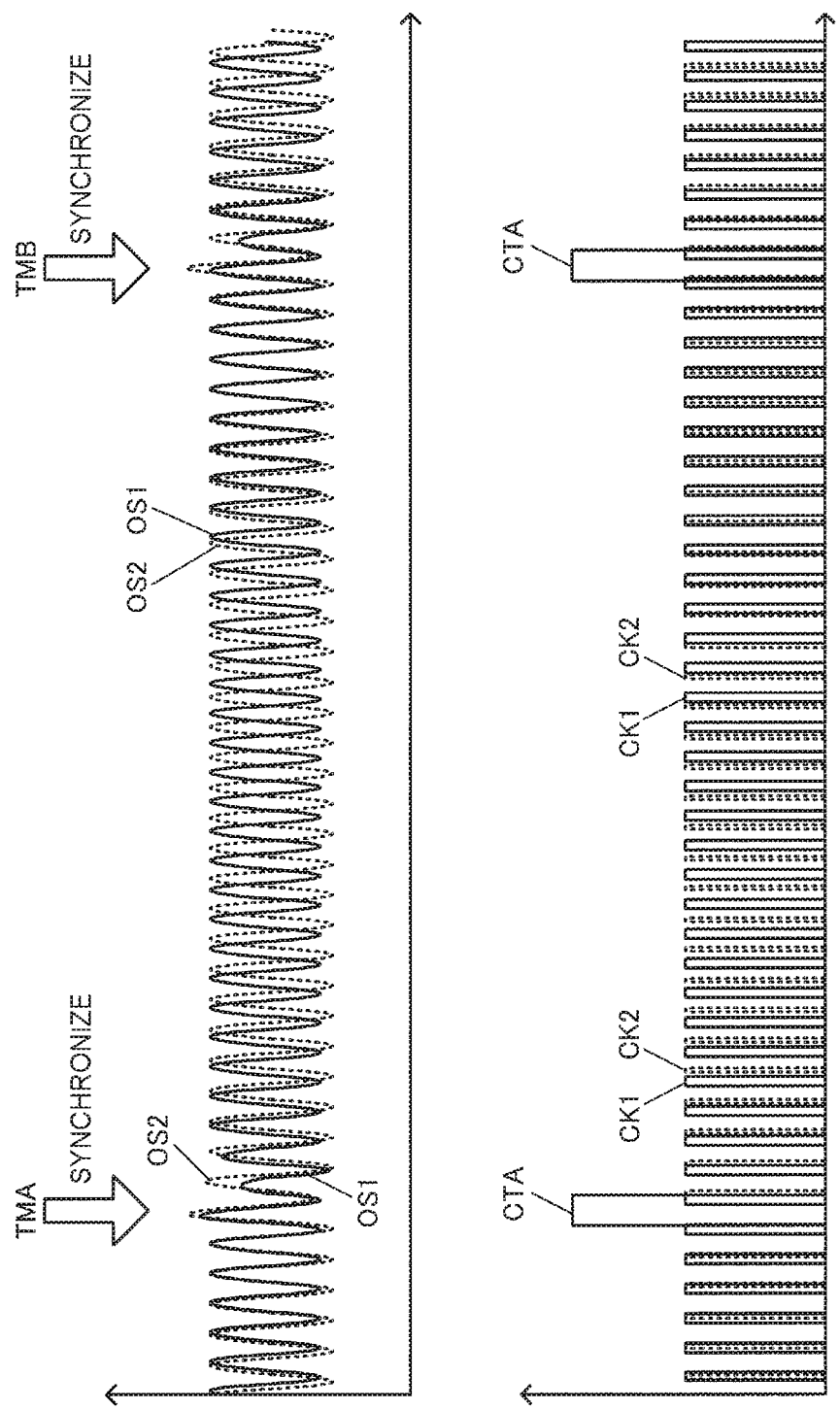
FIG. 13 is a diagram illustrating signal waveforms for describing an operation of the synchronization circuit.

FIG. 12 illustrates a first configuration example of the synchronization circuit 110. FIG. 13 illustrates signal waveforms for describing an operation of the synchronization circuit 110. The oscillation circuits 101 and 102 generate the clock signals CK1 and CK2 by oscillating the oscillation elements XTAL1 and XTAL2. For example, oscillation signals OS1 and OS2 at the oscillation circuits 101 and 102 are buffered by buffer circuits BA3 and BA4 to be output as the clock signals CK1 and CK2.

Then, the synchronization circuit 110 in FIG. 12 synchronizes the phases of the oscillation signal OS1 (first oscillation signal) in the oscillation circuit 101 and the oscillation signal OS2 (second oscillation signal) in the oscillation circuit 102. For example, the synchronization circuit 110 synchronizes the phases of the oscillation signals OS1 and OS2 at each phase synchronization timing. For example, in FIG. 13, the phases of the oscillation signals OS1 and OS2 are synchronized at the phase synchronization timing TMA and the phases of the oscillation signals OS1 and OS2 are also synchronized at the phase synchronization timing TMB subsequent thereto. The same applies to subsequent phase synchronization timings. Through the phase synchronization, the phases of the oscillation signals OS1 and OS2 are uniform at the phase synchronization timings.

In this way, the synchronization circuit 110 in FIG. 12 controls the oscillation circuits 101 and 102 so that the clock signals CK1 and CK2 have a given phase relation.

More specifically, the synchronization circuit 110 performs phase synchronization to match the transition timing of the clock signal CK1 with the transition timing of the clock signal CK2 at each phase synchronization timing. For example, at the phase synchronization timing TMA in FIG. 13, the phase synchronization is performed by the synchronization circuit 110, thereby matching the transition timings (edges) of the clock signals CK1 and CK2. In addition, at the phase synchronization timing TMB, the phase synchronization is performed by the synchronization circuit 110, thereby matching the transition timings of the clock signals CK1 and CK2.

As illustrated in FIG. 12, the synchronization circuit 110 electrically connects an oscillation loop LP1 (a first oscillation loop) of the oscillation circuit 101 to an oscillation loop LP2 (a second oscillation loop) of the oscillation circuit 102 at each phase synchronization timing. For example, the synchronization circuit 110 connects an output node NA1 of an oscillation buffer circuit BA1 (a first buffer circuit) included in the oscillation circuit 101 to an output node NA2 of an oscillation buffer circuit BA2 (a second buffer circuit) included in the oscillation circuit 102.

Specifically, the synchronization circuit 110 includes a counter 112 that performs a counting operation based on one of the clock signals CK1 and CK2. The counter 112 in FIG. 12 performs the counting operation based on, for example, the clock signal CK1. Then, the synchronization circuit 110 performs the phase synchronization whenever a count value of the counter 112 reaches a given set value. The set value is, for example, a value corresponding to the number of clocks (instances) of the clock signal CK1 (or the clock signal CK2) between the phase synchronization timings TMA and TMB in FIG. 13.

More specifically, the synchronization circuit 110 includes a switch circuit SWA that electrically connects the oscillation loop LP1 of the oscillation circuit 101 to the oscillation loop LP2 of the oscillation circuit 102. The switch circuit SWA is turned on based on a signal CTA from the counter 112 to electrically connect the oscillation loop LP1 to the oscillation loop LP2. For example, as illustrated in FIG. 13, the signal CTA is a pulse signal that becomes active (for example, an H level) at each phase synchronization timing. When the signal CTA is activated, the switch circuit SWA is turned on. Specifically, when the count value reaches the set value, the counter 112 activates the signal CTA to turn the switch circuit SWA on. Thereafter, the count value of the counter 112 is reset.

In FIG. 12, when the switch circuit SWA is turned on, there is a concern of a problem occurring in that oscillation could stop when the phases of the oscillation signals OS1 and OS2 deviates exactly at 180 degrees.

Accordingly, in the synchronization circuit 110, it is preferable that one of the oscillation circuits 101 and 102 is activated and the other oscillation circuit is activated at a phase synchronization timing after the activation of the one oscillation circuit (for example, an initial phase synchronization timing). For example, in FIG. 12, the oscillation circuit 101 is activated and the oscillation circuit 102 is activated at a phase synchronization timing after the activation of the oscillation circuit 101. The activation of the oscillation circuit 101 can be realized by, for example, a circuit (e.g., a seed circuit, not illustrated) installed in the oscillation circuit 101. Then, when the switch circuit SWA is turned on at the phase synchronization timing after the activation of the oscillation circuit 101, the oscillation signal OS1 in the oscillation circuit 101 is delivered to the oscillation loop LP2 of the oscillation circuit 102. Then, the delivered oscillation signal OS1 becomes a signal and oscillation of the oscillation circuit 102 is activated. In this way, it is possible to prevent the foregoing problem occurring in that the oscillation stops.

Figure 14:
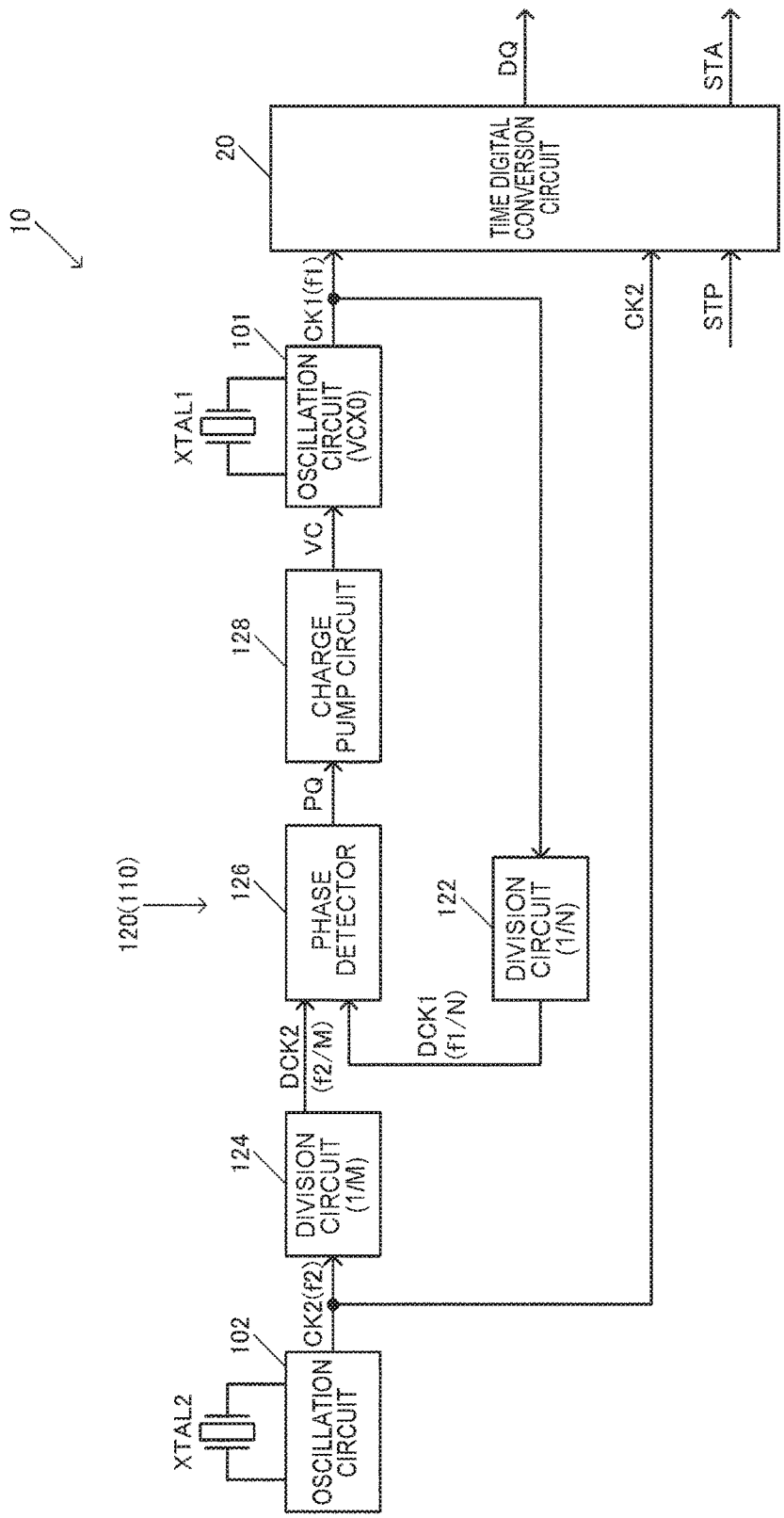
FIG. 14 is a diagram illustrating a second configuration example of the synchronization circuit.

FIG. 14 illustrates a second configuration example of the synchronization circuit 110. In FIG. 14, a PLL circuit 120 is used as the synchronization circuit 110. The PLL circuit 120 synchronizes the phases of the clock signals CK1 and CK2 to be input to the time-to-digital conversion circuit 20. The PLL circuit 120 controls the oscillation circuit 101 so that the clock signals CK1 and CK2 have a given frequency relation.

Specifically, as illustrated in FIG. 14, the PLL circuit 120 includes division circuits 122 and 124 (first and second division circuits) and a phase detector 126 (a phase comparator). The division circuit 122 divides the clock signal CK1 and outputs a divided clock signal DCK1 (a first divided clock signal). Specifically, the division circuit 122 performs division so that the clock frequency f1 of the clock signal CK1 becomes 1/N and outputs the divided clock signal DCK1 with the clock frequency of f1/N.

The division circuit 124 divides the clock signal CK2 and outputs a divided clock signal DCK2 (a second divided clock signal). Specifically, the division circuit 124 performs division so that the clock frequency f2 of the clock signal CK2 becomes 1/M and outputs the divided clock signal DCK2 with the clock of becomes f2/M. For example, the integrated circuit device 10 includes the oscillation circuit 102. The oscillation circuit 102 oscillates the oscillation element XTAL2, generates the clock signal CK2, and outputs the clock signal CK2 to the division circuit 124. Then, the phase detector 126 compares the phases the divided clock signal DCK1 and the divided clock signal DCK2.

The integrated circuit device 10 includes the oscillation circuit 101. The oscillation circuit 101 is controlled based on a phase comparison result of the phase detector 126 of the PLL circuit 120 and oscillates the oscillation element XTAL1. The oscillation circuit 101 is also a constituent element of the PLL circuit 120, for example. Specifically, the oscillation circuit 101 is, for example, a voltage-controlled oscillation circuit (VCXO) of which an oscillation frequency is controlled through voltage control. The PLL circuit 120 includes a charge pump circuit 128. The phase detector 126 outputs a signal PQ which is the phase comparison result to the charge pump circuit 128. The signal PQ is, for example, an up/down signal. The charge pump circuit 128 outputs a control voltage VC based on the signal PQ to the oscillation circuit 101. For example, the charge pump circuit 128 includes a loop filter. The up/down signal which is the signal PQ is converted into the control voltage VC by the loop filter. The oscillation circuit 101 performs an oscillation operation of the oscillation element XTAL1 of which an oscillation frequency is controlled based on the control voltage VC to generate the clock signal CK1. For example, the oscillation circuit 101 includes a variable capacitance circuit. The oscillation frequency is controlled by controlling a capacitance value of the variable capacitance circuit based on the control voltage VC.

In the second configuration example of FIG. 14, the phase synchronization of the clock signals CK1 and CK2 can be realized by effectively using the PLL circuit 120. That is, as in FIG. 13, it is possible to realize the phase synchronization in which the transition timings of the clock signals CK1 and CK2 are matched at each phase synchronization timing.

As described above, when the synchronization circuit 110 is included in the integrated circuit device 10, it is possible to match the transition timings of the clock signals CK1 and CK2 at each phase synchronization timing. Accordingly, since circuit processing can start using the phase synchronization timing as a reference timing, simplification of circuit processing or the circuit configuration is achieved. It is possible to start the process for the time-to-digital conversion immediately from the phase synchronization timing by the synchronization circuit 110 without waiting for accidental matching of the transition timings of the clock signals CK1 and CK2. Accordingly, acceleration of the time-to-digital conversion is achieved. By including the synchronization circuit 110, it is possible to minimize an error caused due to a time difference between the transition timings of the clock signals CK1 and CK2 at the phase synchronization timing. Accordingly, an error occurring systematically due to the time difference is sufficiently reduced and an improvement in precision is achieved.

For example, in the scheme of the related art of the above-described JP-A-5-87954, matching of edges of first and second clock pulses is detected by an edge matching detection circuit and time measurement starts under the condition that the matching of the edges is detected. In the scheme of the related art, however, the time measurement may not start as long as the matching of the edges of the first and second clock pulses is not detected. Therefore, there is a first problem that start of the time measurement may be late and a conversion time of time-to-digital conversion becomes long. When a relation between clock frequencies of the first and second clock pulses is a relation between frequencies in which edges are not matched at a synchronization point, the edges are matched only accidentally. Thus, there is a second problem that it is difficult to realize the time-to-digital conversion. Since a timing of the synchronization point of the first and second clock pulses may not be confirmed systematically, there is a third problem that circuit processing or a circuit configuration may be complicated. Further, when there is an error in the detection of the matching of the edges of the first and second clock pulses, there is a fourth problem that precision may degrade due to the error.

In contrast, in the embodiment, by including the synchronization circuit 110, it is possible to forcibly match the transition timings of the clock signals CK1 and CK2 at each phase synchronization timing. Accordingly, since the process for the time-to-digital conversion can start immediately after the phase synchronization timing, the above-described first problem of the scheme of the related art can be resolved. According to the embodiment, even when the relation between the clock frequencies of the clock signals CK1 and CK2 is the relation between the frequencies in the transition timings are not matched, the transition timings of the clock signals CK1 and CK2 are forcibly matched at each phase synchronization timing by the synchronization circuit 110. Accordingly, the second problem of the scheme of the related art can be resolved. Since the phase synchronization timing can be confirmed systematically through the phase synchronization of the synchronization circuit 110, circuit processing or the integrated circuit device can be simplified, and thus the third problem of the scheme of the related art can be resolved. By matching the transition timings of the clock signals CK1 and CK2 at each phase synchronization timing, a conversion error caused due to a deviation between the transition timings of the clock signals CK1 and CK2 can be reduced, and thus the fourth problem of the scheme of the related art can also be resolved.

4. Oscillation Circuit

Figure 15:
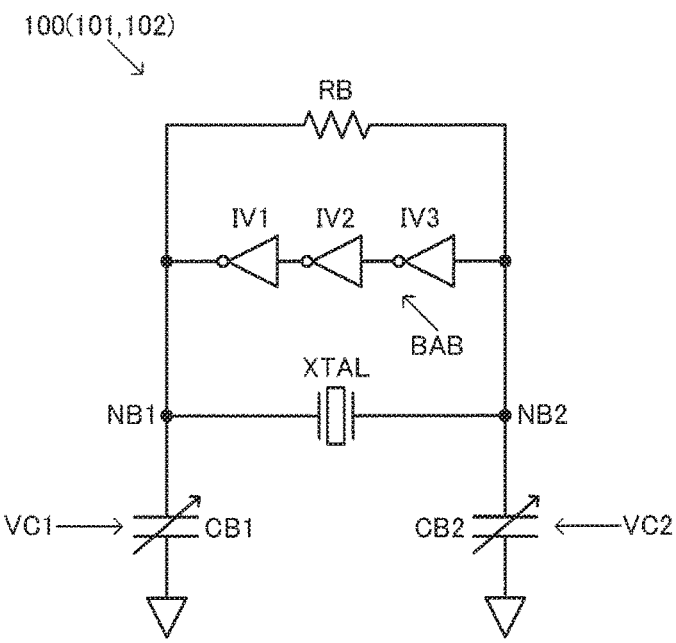
FIG. 15 is a diagram illustrating a first configuration example of an oscillation circuit.

FIG. 15 illustrates a first configuration example of an oscillation circuit 100. Here, the oscillation circuit 100 is described as a representative of the oscillation circuits 101 and 102.

The oscillation circuit 100 (101 and 102) in FIG. includes an oscillation buffer circuit BAB, variable capacitance circuits CB1 and CB2 (variable capacitance capacitors or capacitors in a broad sense), and a feedback resistor RB. The buffer circuit BAB can be configured with inverter circuits at one end or a plurality of stages (odd stages). In FIG. 15, the buffer circuit BAB is configured with inverter circuits IV1, IV2, and IV3 of three stages. The buffer circuit BAB (IV1 to IV3) may also be a circuit that can perform oscillation enabled or disabled control or control of a flowing current.

The variable capacitance circuits CB1 and CB2 are installed at one end (NB1) and the other end (NB2) of the oscillation element XTAL, respectively. The feedback resistor RB is installed between one end and the other end of the oscillation element XTAL. The capacitance values of the variable capacitance circuits CB1 and CB2 are controlled based on control voltages VC1 and VC2 (in a broad sense, control signals). The variable capacitance circuits CB1 and CB2 are realized by variable capacitance diodes or the like (varactors). By controlling the capacitance values in this way, it is possible to adjust (minutely adjust) an oscillation frequency (a clock frequency) of the oscillation circuit 100.

The variable capacitance circuit may also be installed only at one of the one end and the other end of the oscillation element XTAL. Instead of the variable capacitance circuit, a normal capacitor of which a capacitance value is not variable may be installed.

Figure 16:
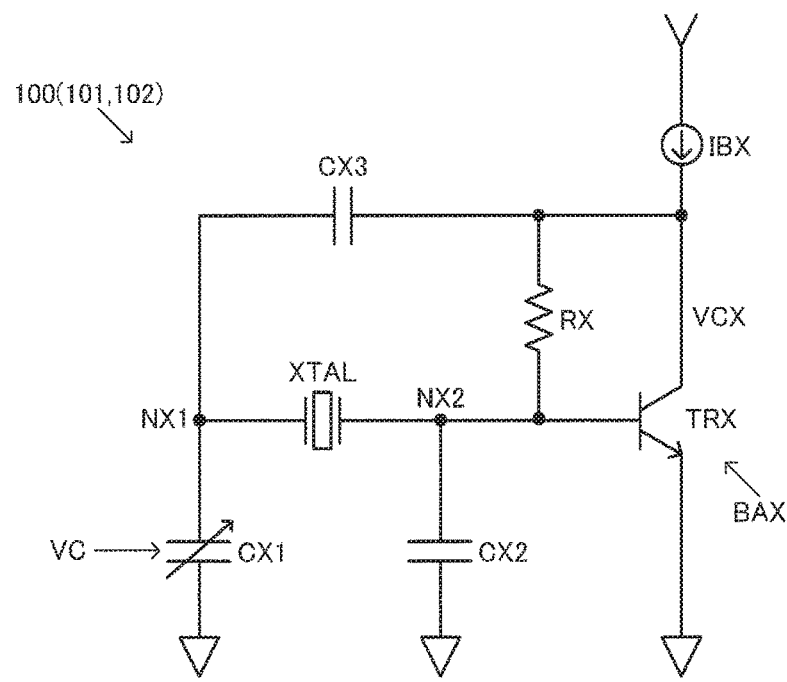
FIG. 16 is a diagram illustrating a second configuration example of an oscillation circuit.

FIG. 16 illustrates a second configuration example of the oscillation circuit 100. The oscillation circuit 100 includes a current source IBX, a bipolar transistor TRX, a resistor RX, capacitors CX2 and CX3, and a variable capacitance circuit CX1 (variable capacitance capacitor). For example, an oscillation buffer circuit BAX is configured by the current source IBX, the bipolar transistor TRX, the resistor RX, and the capacitor CX3.

The current source IBX supplies a bias current to a collector of the bipolar transistor TRX. The resistor RX is installed between a base and the collector of the bipolar transistor TRX.

One end of the variable capacitance circuit CX1 which has variable capacitance is connected to one end (NX1) of the oscillation element XTAL. Specifically, one end of the variable capacitance circuit CX1 is connected to one end of the oscillation element XTAL via a first terminal (oscillation element pad) for the oscillation element of the integrated circuit device 10. One end of the capacitor CX2 is connected to the other end (NX2) of the oscillation element XTAL. Specifically, the one end of the capacitor CX2 is connected to the other end of the oscillation element XTAL via a second terminal (oscillation element pad) for the oscillation element of the integrated circuit device 10. One end of the capacitor CX3 is connected to the one end of the oscillation element XTAL and the other end of the capacitor CX3 is connected to the collector of the bipolar transistor TRX.

A current between a base and an emitter produced through oscillation of the oscillation element XTAL flows in the bipolar transistor TRX. When the current between the base and the emitter increases, a current between the collector and the emitter of the bipolar transistor TRX increases and a bias current branched from the current source IBX to the resistor RX decreases. Therefore, a collector voltage VCX is reduced. Conversely, when the current between the base and the emitter of the bipolar transistor TRX decreases, the current between the collector and the emitter decreases and the bias current branched from the current source IBX to the resistor RX increases. Therefore, the collector voltage VCX is raised. The collector voltage VCX is fed back to the one end of the oscillation element XTAL via the capacitor CX3. That is, an AC component is cut by the capacitor CX3 and a DC component is fed back. In this way, the oscillation buffer circuit BAX configured by the bipolar transistor TRX and the like operates an inversion circuit (an inversion amplification circuit) that outputs an inverted signal (a signal with a phase difference of 180 degrees) of a signal of the node NX2 to the node NX1.

A capacitance value of the variable capacitance circuit CX1 configured by the variable capacitance diode (varactor) and the like is controlled based on the control voltage VC (control signal). Thus, it is possible to adjust the oscillation frequency of the oscillation circuit 100. For example, when the oscillation frequency of the oscillation element XTAL has temperature characteristics, temperature compensation of the oscillation frequency is also possible.

The oscillation circuit 100 (101 and 102) is not limited to the configurations of FIGS. 15 and 16, but various modification can be realized. For example, various configurations can be adopted as the configuration of a buffer circuit or the connection configuration of the variable capacitance circuit or a capacitor. For example, the capacitance value of the variable capacitance circuit (CB1, CB2, or CX1) may be adjusted to a digital value. In this case, the variable capacitance circuit is configured by a plurality of capacitors (a capacitor array) and a plurality of switch elements (a switch array) in which the switch elements are controlled to be turned on or off based on frequency control data (in a broad sense, a control signal) which is a digital value. Each of the plurality of switch elements s electrically connected to each of the plurality of capacitors. By turning on and off the plurality of switch elements, the number of capacitors of which one ends are connected to one end of the oscillation element XTAL is changed among the plurality of capacitors. Thus, the capacitance value of the variable capacitance circuit is controlled and the capacitance value of one end of the oscillation element XTAL is changed. Accordingly, the capacitance value of the variable capacitance circuit is directly controlled with the frequency control data and the oscillation frequency of the oscillation signal can be controlled.

5. Configuration of Time-to-digital conversion Circuit

Figure 17:
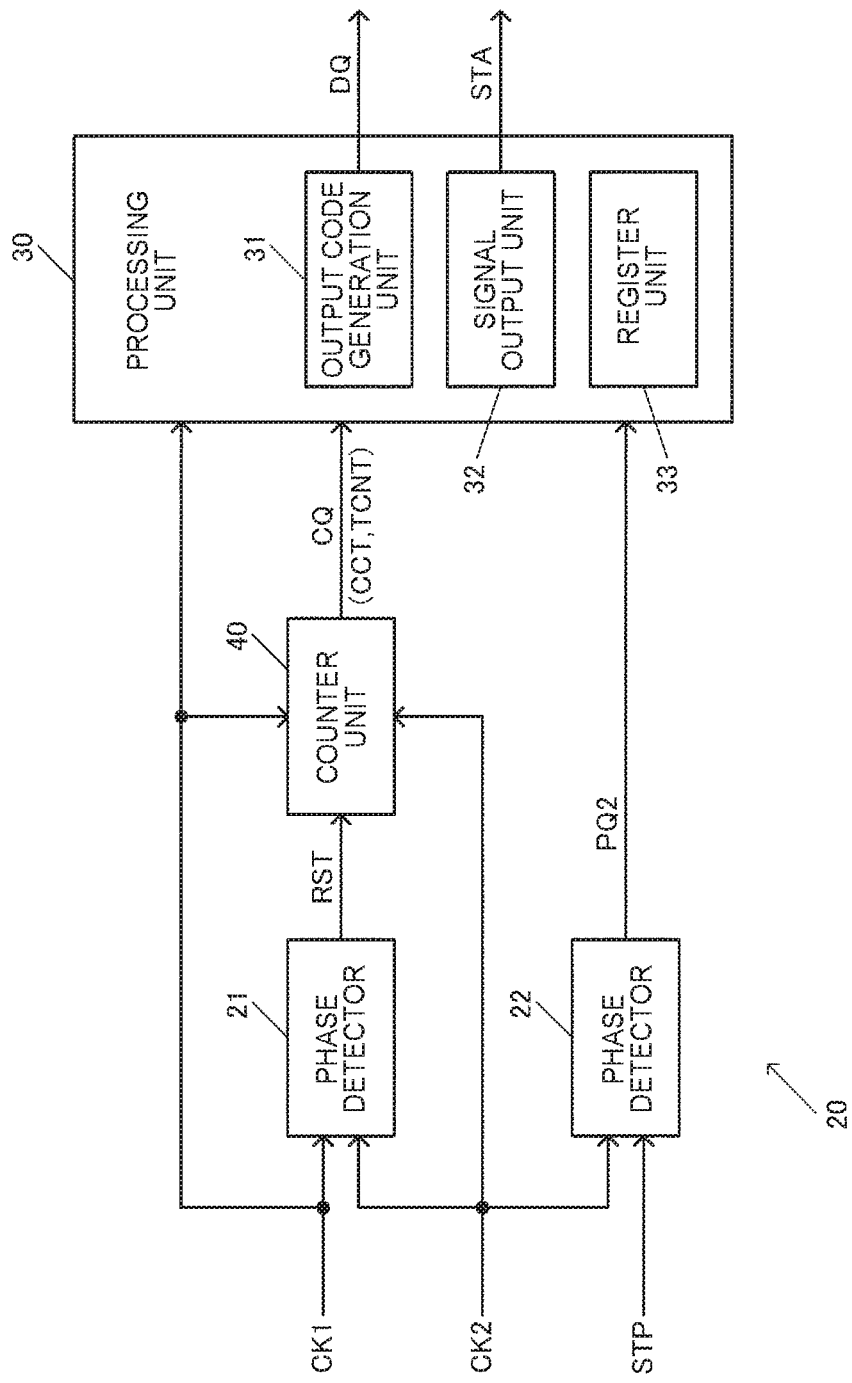
FIG. 17 is a diagram illustrating a configuration example of a time-to-digital conversion circuit.

FIG. 17 illustrates a configuration example of the time-to-digital conversion circuit 20. The time-to-digital conversion circuit 20 includes phase detectors 21 and 22, a processing unit 30, and a counter unit 40. The time-to-digital conversion circuit 20 is not limited to the configuration of FIG. 17, but various modifications can be realized in such a manner that some of the constituent elements may be omitted or other constituent elements may be added.

The clock signals CK1 and CK2 are input to the phase detector 21 (phase comparator) and the phase detector 21 outputs a reset signal RST to the counter unit 40. For example, the reset signal RST of the pulse signal activated at a phase synchronization timing is output.

The signal STP and the clock signal CK2 are input to the phase detector 22 (a phase comparator) and the phase detector 22 outputs a phase comparison signal PQ2 of a result of the phase comparison. The phase detector 22 compares the phases of the signal STP and the clock signal CK2, for example, by sampling one of the signal STP and the clock signal CK2 with the other signal. The signal PQ2 of the phase comparison result is output to the processing unit 30.

The counter unit 40 performs a process of counting count values. For example, the counter unit 40 includes at least one of a first counter that performs a counting process based on the clock signal CK1 and a second counter that performs a counting process based on the clock signal CK2. The count values of the first and second counters are reset, for example, based on the reset signal RST from the phase detector 22. Then, a count value CQ in the counter unit 40 is output to the processing unit 30. The count value CQ is a count value of at least one of the first and second counters that performs the counting process based on the clock signals CK1 and CK2 and is equivalent to CCT, TCNT, or the like to be described below.

The processing unit 30 performs a process of converting a time into the digital value DQ. That is, the processing unit 30 performs various arithmetic processes for the time-to-digital conversion. For example, the processing unit 30 performs an arithmetic process of calculating the digital value DQ corresponding to the time difference between the signals STA and STP. Specifically, the processing unit 30 performs an arithmetic process for the time-to-digital conversion based on the count value CQ from the counter unit 40 or the signal PQ2 of the phase comparison result from the phase detector 22. The processing unit 30 can be realized by, for example, an ASIC logic circuit or a processor such as a CPU.

The processing unit 30 includes an output code generation unit 31, a signal output unit 32, and a register unit 33. The output code generation unit 31 performs an arithmetic process for the time-to-digital conversion and outputs the final digital value DQ as a final output code. The signal output unit 32 generates and outputs the signal STA. The signal output unit 32 outputs the signal STA based on the clock signal CK1. For example, as will be described below, the signal output unit 32 outputs the signal STA at each clock cycle of the clock signal CK1, for example, based on the clock signal CK1. Alternatively, the signal output unit 32 outputs the signal STA, for example, at a clock cycle designated with a clock cycle designation value. The register unit 33 is configured to include one register or a plurality of registers. For example, the register unit 33 includes a register or the like that stores clock cycle designation information to be described below. The register unit 33 can be realized by, for example, a flip-flop circuit or a memory element.

Figure 18:
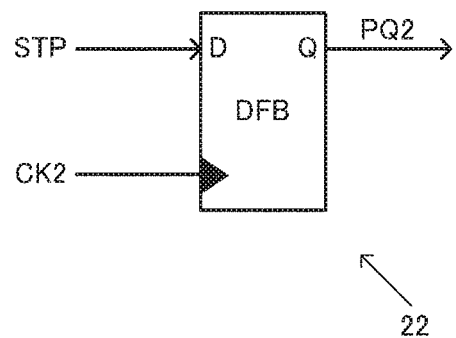
FIG. 18 is a diagram illustrating a configuration example of a phase detector.

FIG. 18 is a diagram illustrating a configuration example of the phase detector 22. The phase detector 22 is configured by, for example, a flip-flop circuit DFB. The signal STP is input to a data terminal of the flip-flop circuit DFB and the clock signal CK2 is input to a clock terminal of the flip-flop circuit DFB. Thus, it is possible to realize phase comparison by sampling the signal STP with the clock signal CK2. The clock signal CK2 may also be input to the data terminal of the flip-flop circuit DFB and the signal STP may also be input to the clock terminal of the flip-flop circuit DFB. Thus, it is possible to realize the phase comparison by sampling the clock signal CK2 with the signal STP.

6. Scheme of Repeating Signal STA

Next, various examples of the time-to-digital conversion scheme according to the embodiment will be described. First, a scheme of repeatedly generating the signal STA at each clock cycle will be described.

Figure 19:
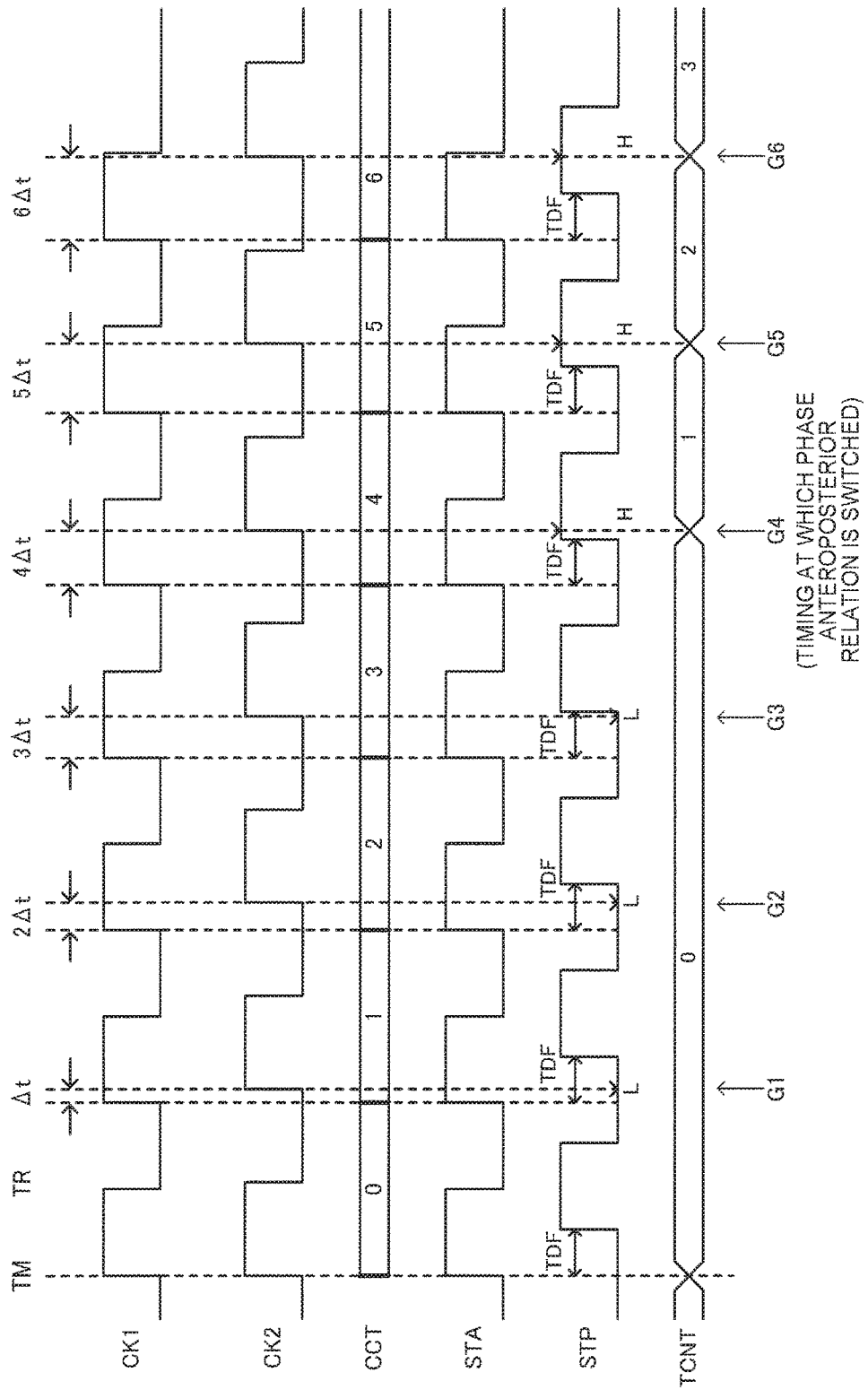
FIG. 19 is a diagram illustrating signal waveforms for describing a scheme of repeating the signal STA.

FIG. 19 is a diagram illustrating signal waveforms for describing the scheme of repeating the signal STA (hereinafter, appropriately simply referred to as a repeating scheme) according to the embodiment. In FIG. 19, the phases of the clock signals CK1 and CK2 are synchronized at a phase synchronization timing TM. The phase synchronization is performed by the synchronization circuit 110. At the phase synchronization timing TM, a count value TCNT of the counter unit 40 (the second counter) is reset to, for example, 0.

When the phase synchronization timing TM is a known timing in the system of the integrated circuit device 10, the phase synchronization timing TM is set by, for example, a timing control unit (not illustrated). In this case, the function of the phase detector 21 in FIG. 17 is realized by the timing control unit. That is, the timing control unit outputs the reset signal RST activated at the phase synchronization timing TM to the counter unit 40.

The time-to-digital conversion circuit 20 transitions the signal level of the signal STA based on the clock signal CK1 after the phase synchronization timing TM of the clock signals CK1 and CK2. Specifically the time-to-digital conversion circuit 20 transitions the signal level of the signal STA at each clock cycle of the clock signal CK1 after the phase synchronization timing TM. For example, the signal output unit 32 in FIG. 17 transitions the signal level of the signal STA at each clock cycle by outputting a signal obtained by buffering the clock signal CK1 in the buffer circuit as the signal STA.

In FIG. 19, CCT is a clock cycle value. The clock cycle value CCT is updated at each clock cycle of the clock signal CK1. Specifically, the clock cycle value CCT increases at each clock cycle. Here, to facilitate the description, the clock cycle value of the initial clock cycle is set to CCT=0. Therefore, the clock cycle value of the subsequent clock cycle is CCT=1. In FIG. 19, CCT is the clock cycle value of the clock signal CK1, but a clock cycle value of the clock signal CK2 may be used instead.

In this way, when the signal level of the signal STA is transitioned based on the clock signal CK1 after the phase synchronization timing TM, as described with reference to FIGS. 3 and 4, the signal level of the signal STP is transitioned to correspond to the signal STA. Here, a time difference between the transition timings of the signals STA and STP is TDF.

In this case, the time-to-digital conversion circuit 20 compares the phases of the signal STP and the clock signal CK2, as indicated by G1 to G6 of FIG. 19. Then, the digital value DQ corresponding to the time difference TDF between the transition timings of the signals STA and STP is calculated based on a result of the phase comparison. Specifically, the processing unit 30 in FIG. 17 performs an arithmetic process of calculating the digital value DQ based on the signal PQ2 of the result of the phase comparison from the phase detector 22.

For example, as described with reference to FIG. 2, after the phase synchronization timing TM, the inter-clock time difference TR which is the time difference between the transition timings of the clock signals CK1 and CK2 increases at each clock cycle of the clock signal CK1, for example, like $\Delta t$, $2\Delta t$, $3\Delta t$, ..., and $6\Delta t$. In the repeating scheme according to the embodiment, the time-to-digital conversion is realized focusing on the inter-clock time difference TR increasing by $\Delta t$ in this way after the phase synchronization timing TM.

For example, in G1 to G3 of FIG. 19, the signal PQ2 of the results of the phase comparison which is a signal obtained by sampling the signal STP with the clock signal CK2 is at an L level. That is, in G1 to G3, since the phase of the signal STP is later than the phase of the clock signal CK2, the signal PQ2 is at the L level.

In this way, in G1 to G3 of FIG. 19, the phase of the signal STP is determined to be behind the phase of the clock signal CK2 in accordance with the results of the phase comparison of the signal STP and the clock signal CK2. In other words, in G1, G2, and G3, TDF>TR=$\Delta t$, TDF>TR=$2\Delta t$, and TDF>TR=$3\Delta t$ are satisfied, respectively, and the time difference TDF between the transition timings of the signals STA and STP is longer than the inter-clock time difference TR between the clock signals CK1 and CK2.

Then, in G4 of FIG. 19, the phase anteroposterior relation between the signal STP and the clock signal CK2 is switched. For example, a state in which the phase of the signal STP is behind the phase of the clock signal CK2 is switched to a state in which the phase of the signal STP is in front of the phase of the clock signal CK2.

When the phase anteroposterior relation is switched in this way, as indicated by G4 to G6, the signal PQ2 of the results of the phase comparison which is the signal obtained by sampling the signal STP with the clock signal CK2 enters an H level. That is, in G4 to G6, since the phase of the signal STP is in front of the phase of the clock signal CK2, the signal PQ2 enters the H level. In other words, in G4, G5, and G6, TDF<TR=$4\Delta t$, TDF<TR=$5\Delta t$, and TDF<TR=$6\Delta t$ are satisfied and the time difference TDF between the transition timings of the signals STA and STP is shorter than the inter-clock time difference TR between the clock signals CK1 and CK2.

In G1 to G3 of FIG. 19, the signal PQ2 of the results of the phase comparison is at the L level and the phase of the signal STP is determined to be behind the phase of the clock signal CK2. In this case, the count value TCNT is not updated (e.g., is maintained). For example, the count value TCNT does not increase from 0. Conversely, in G4 to G6, the signal PQ2 of the results of the phase comparison is at the H level and the phase of the signal STP is determined to be in front of the phase of the clock signal CK2. In this case, the count value TCNT is updated. For example, the count value TCNT increases by, for example, 1 at each clock cycle.

The time-to-digital conversion circuit 20 (the processing unit 30) calculates the digital value DQ corresponding to the time difference TDF using the count value TCNT obtained in this way. For example, by performing a process of converting a code indicated by the count value TCNT, an output code which is the final digital value DQ is calculated and output.

Figure 20:
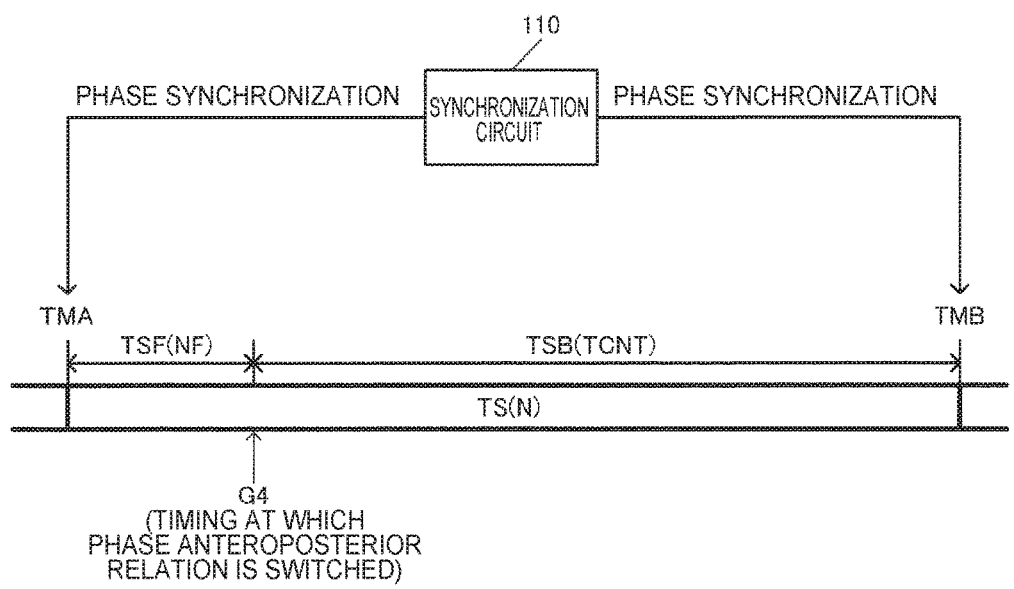
FIG. 20 is a diagram illustrating signal waveforms for describing the scheme of repeating the signal STA.

FIG. 20 is a diagram illustrating the repeating scheme according to the embodiment. At the phase synchronization timings TMA and TMB, the phases of the clock signals CK1 and CK2 are synchronized by the synchronization circuit 110. Thus, the transition timings of the clock signals CK1 and CK2 match at the phase synchronization timings TMA and TMB. Then, a space between the phase synchronization timings TMA and TMB is a measurement period TS. In the repeating scheme according to the embodiment, the digital value DQ corresponding to the time difference TDF is calculated during the measurement period TS.

Specifically, as indicated by G4 of FIGS. 19 and 20, the time-to-digital conversion circuit 20 calculates the digital value DQ corresponding to the time difference TDF by specifying a timing (a clock cycle) at which the phase anteroposterior relation between the signal STP and the clock signal CK2 is switched. For example, by specifying a clock cycle at which CCT=4 indicated by G4 is satisfied, the digital value DQ corresponding to the time difference TDF can be determined to be a digital value corresponding to, for example, TR=4Δt (or a digital value corresponding to a value between 3Δt and 4Δt). Accordingly, since the time difference TDF can be converted into the digital value DQ during the one-time measurement period TS in FIG. 20, acceleration of the time-to-digital conversion is achieved.

For example, in the scheme of the related art of the above-described JP-A-5-87954, only one start pulse is generated during the one-time measurement period in which time measurement is performed. To calculate the final digital value, it is necessary to repeat the measurement period a large number of times.

In contrast, according to the repeating scheme according to the embodiment, as illustrated in FIGS. 19 and 20, the digital value DQ is calculated by generating the signal STA a plurality of times during the one-time measurement period TS and performing the phase comparison a plurality of times (for example, 1000 times or more). Thus, since the final digital value DQ can be calculated within the one-time measurement period TS, the time-to-digital conversion can be considerably accelerated compared to the scheme of the related art.

In FIG. 20, the length of the measurement period TS is equivalent to, for example, the number of clocks N (the number of clock cycles) of the clock signal CK1 during the measurement period TS. For example, the synchronization circuit 110 synchronizes the phases of the clock signals CK1 and CK2 during each measurement period TS corresponding to the set number of clocks N. In the repeating scheme according to the embodiment, to realize the time-to-digital conversion with a high resolution, the number of clocks N during the measurement period TS is set to, for example, a very large number such as 1000 or more (or 5000 or more). For example, when f1 and f2 are clock frequencies of the clock signals CK1 and CK2, the resolution of the time-to-digital conversion according to the embodiment can be expressed as Δt=|f1−f2|/(f1×f2). Accordingly, as the frequency difference |f1−f2| is smaller or f1×f2 is larger, the resolution Δt is smaller. Thus, it is possible to realize time-to-digital conversion with high resolution. When the resolution Δt is smaller, the number of clocks N during the measurement period TS also increases.

The count value TCNT is equivalent to the length of the period TSB in FIG. 20. Here, TSF is set as a period of the first half from the phase synchronization timing TMA to the timing of G4 at which the phase anteroposterior relation is switched and TSB is set as a period of the second half from the timing of G4 to the phase synchronization timing TMB. For example, when NF is the number of clocks (the number of clock cycles) of the clock signal CK1 during the period TSF, for example, N=NF+TCNT is established. For example, since NF=4 is satisfied in FIG. 19, a value corresponding to the final digital value DQ=4×Δt is a digital value corresponding to the number of clocks NF. Therefore, the time-to-digital conversion circuit 20 (the processing unit 30) calculates the digital value corresponding to NF=N−TCNT based on the count value TCNT. For example, when the digital value DQ is 8 bits, the digital value corresponding to the number of clocks N is, for example, 11111111. However, the process of counting the number of clocks NF may be performed and the digital value DQ may be calculated.

When the number of clocks N corresponding to the measurement period TS is set to be large, the time difference TDF which can be measured in FIG. 19 is shorter. Thus, a dynamic range may decrease. In the repeating scheme according to the embodiment, the time-to-digital conversion is completed during the one-time measurement period TS while increasing the number of clocks N and raising the resolution. Thus, for example, it is possible to realize a high resolution, for example, while realizing acceleration of the conversion process such as a flash type A/D conversion.

In this case, in the repeating scheme according to the embodiment, the signal STA may usually not be generated at each clock cycle to perform the phase comparison, but the signal STA may be generated only during a specific period and the phase comparison may be performed. For example, according to a binary searching scheme to be described below, after a searching range of the digital value DQ is narrowed, the signal STA may be generated at each clock cycle during a period corresponding to the searching range to perform the phase comparison and the final digital value DQ may be calculated. In this case, only during the period corresponding to the narrowed searching range, for example, during the measurement period TS of FIG. 20, the time-to-digital conversion in which the signal STA is generated at each clock cycle and the phase comparison is performed may be performed. After the timing (G4) at which the phase anteroposterior relation is switched is specified, the signal STA may not be generated so that power saving can be achieved.

In the embodiment, as illustrated in FIG. 1, the clock signals CK1 and CK2 are clock signals generated using the oscillation elements XTAL1 and XTAL2. In this way, according to the scheme in which the clock signals CK1 and CK2 generated by the oscillation elements XTAL1 and XTAL2 are used, it is possible to considerably improve the precision of time (physical quantity) measurement compared to the scheme of the related art in which the time-to-digital conversion is realized using semiconductor elements such as vernier delay circuits.

For example, in the scheme of the related art in which the semiconductor elements are used, it is relatively easy to improve a resolution, but there is a problem that it is difficult to improve precision. That is, the delay times of the delay elements, which are the semiconductor elements, are considerably changed due to a manufacturing variation or an environment change. Therefore, there is a limit to the high precision of measurement due to the change. For example, relative precision can be ensured to some extent, but it is difficult to ensure absolute precision.

In contrast, a change in the oscillation frequency of the oscillation element is considerably small due to a manufacturing variation or an environment change compared to the delay times of the delay elements which are the semiconductor elements. Accordingly, according to the scheme of performing the time-to-digital conversion using the clock signals CK1 and CK2 generated by the oscillation elements XTAL1 and XTAL2, it is possible to considerably improve the precision compared to the scheme of the related art in which the semiconductor elements are used. By decreasing a frequency difference between the clock signals CK1 and CK2, it is possible to also improve the resolution.

For example, when a frequency difference between the clock signals CK1 and CK2 is Δf=|f1−f2|=1 MHz and f1 and f2 are set to about 100 MHz, the resolution $\Delta t=|f1-f2|/(f1 \times f2)$ of the time measurement can be set to about 100 picoseconds (ps). Similarly, when f1 and f2 are set to about 100 MHz and $\Delta f=100$ kHz, 10 kHz, and 1 kHz are set, the resolution can be set to about $\Delta t=10$ ps, 1 ps, and 0.1 ps, respectively. The change in the oscillation frequencies of the oscillation elements XTAL1 and XTAL2 is considerably small compared to the scheme in which the semiconductor elements are used. Accordingly, it is possible to realize compatibility of the improvement in the resolution and the precision.

In the scheme of the related art of the above-described JP-A-5-87954, the time-to-digital conversion is realized using quartz crystal oscillators. In the scheme of the related art, however, the start timings of time measurement are sequentially delayed from a timing of a synchronization point at which the edges of the first and second clock pulses match. Each time measurement is performed from the timing of the synchronization point at which the edges of the first and second clock pulses match, and thus it is necessary to repeat the time measurement several times. Therefore, there is a problem that a conversion time of the time-to-digital conversion is considerably lengthened.

In contrast, in the repeating scheme according to the embodiment, the time-to-digital conversion is realized by generating the signal STA a plurality of times during the measurement period TS and performing the phase comparison a plurality of times. Accordingly, it is possible to considerably accelerate the time-to-digital conversion compared to the scheme of the related art.

7. Scheme of Updating Clock Cycle Designation Value

Figure 21:
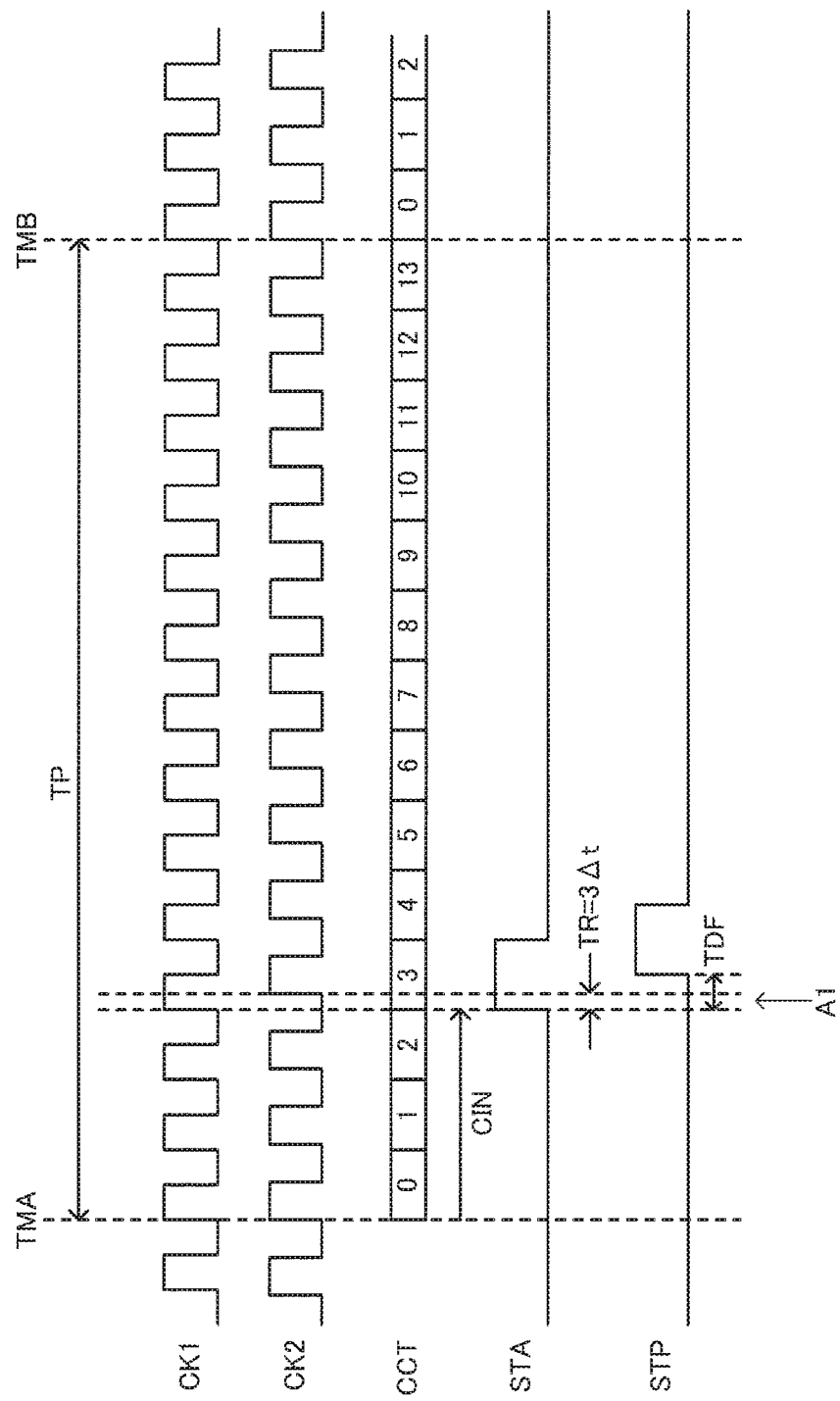
FIG. 21 is a diagram illustrating signal waveforms for describing an updating scheme for a clock cycle designation value.
Figure 22:
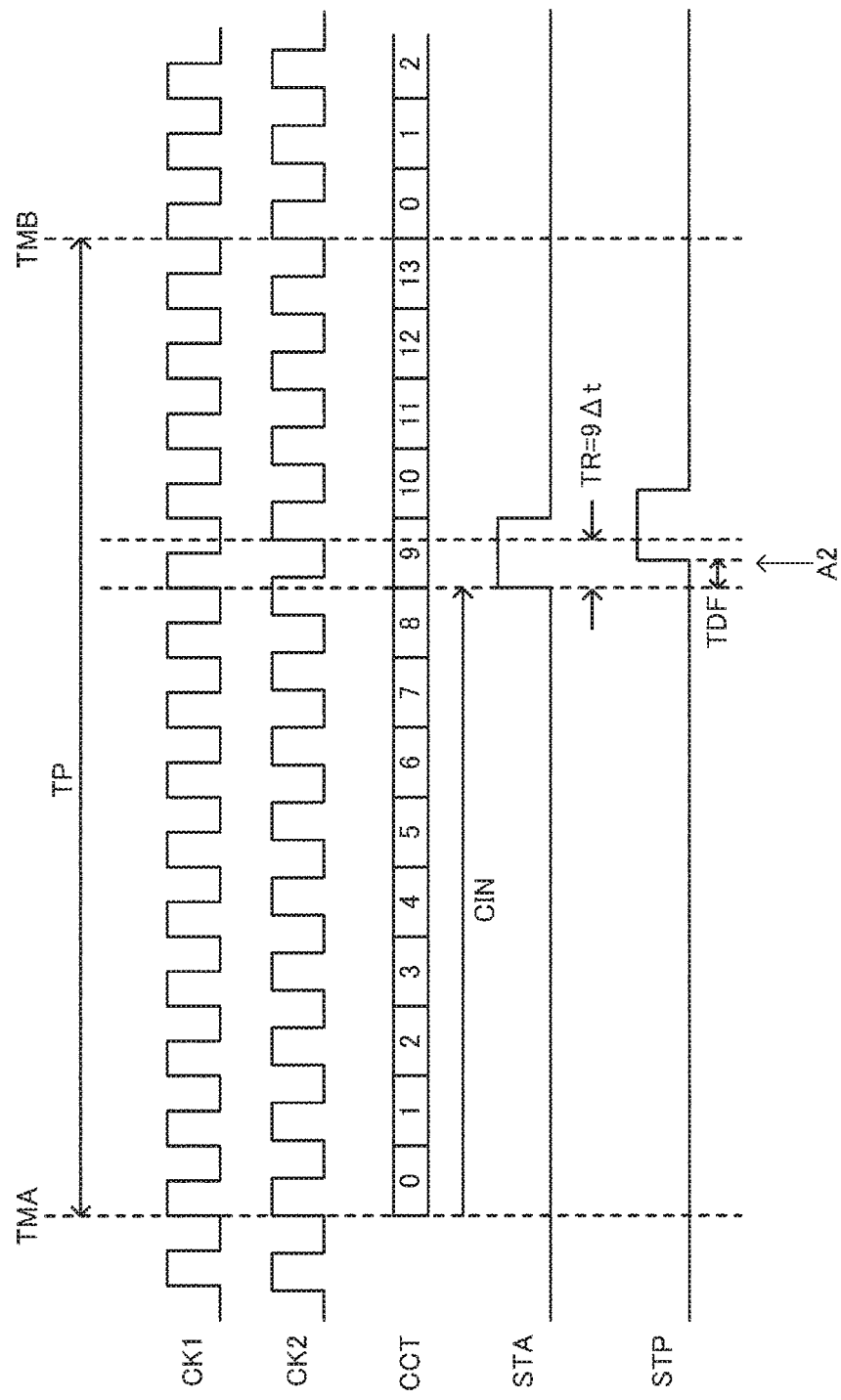
FIG. 22 is a diagram illustrating signal waveforms for describing the updating scheme for the clock cycle designation value.
Figure 23:
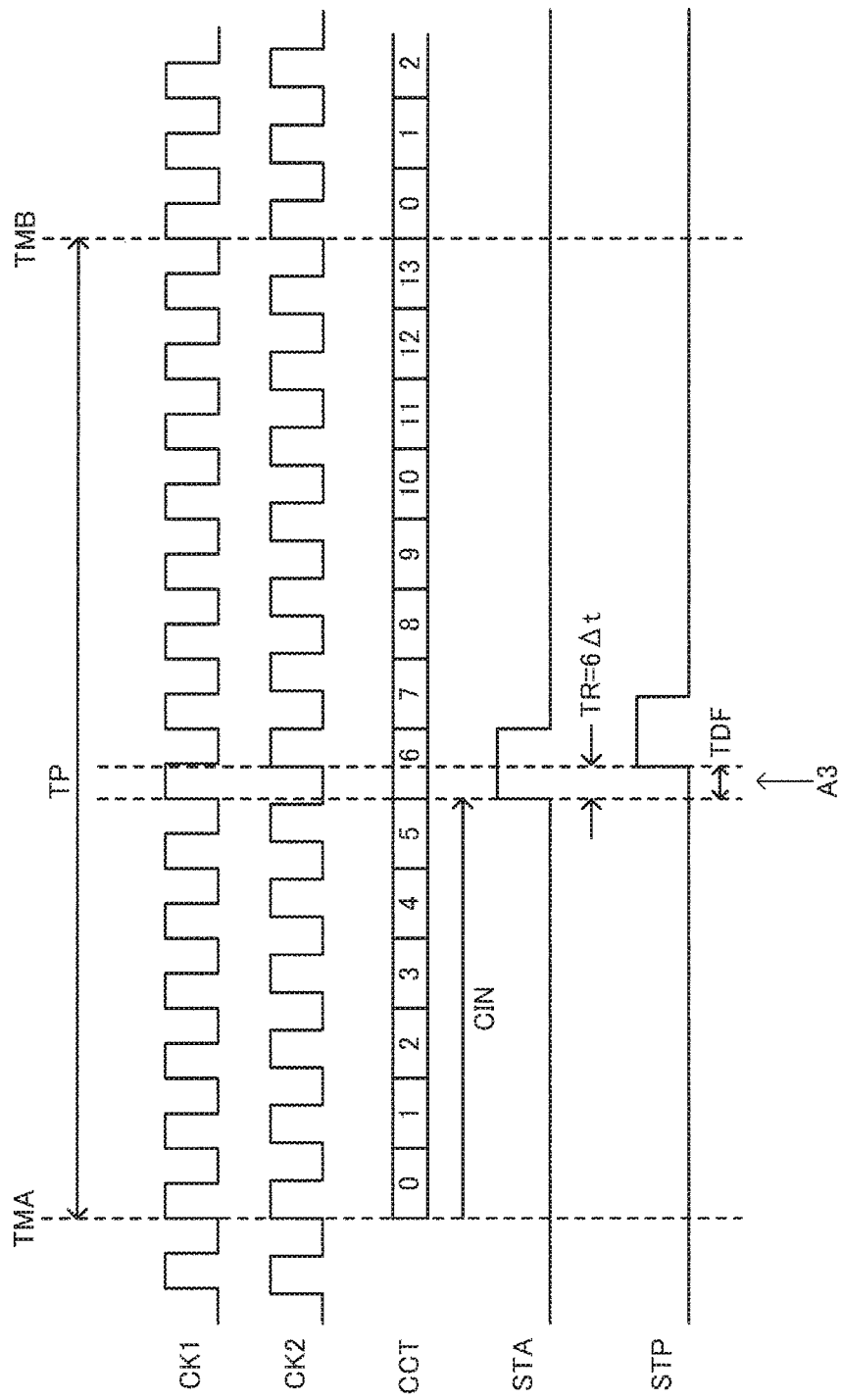
FIG. 23 is a diagram illustrating signal waveforms for describing the updating scheme for the clock cycle designation value.

Next, a scheme of realizing the time-to-digital conversion by updating a clock cycle designation value (in a broad sense, clock cycle designation information) will be described as the time-to-digital conversion scheme according to the embodiment. FIGS. 21 to 23 are diagrams illustrating signal waveforms for describing an updating scheme for the clock cycle designation value (hereinafter simply referred to as an updating scheme). CIN is clock cycle designation information. Hereinafter, the description will be made assuming CIN is a clock cycle designation value indicated by the clock cycle designation information.

TMA and TMB are phase synchronization timings. In FIGS. 21 to 23, the phase synchronization timings TMA and TMB are timings at which the transition timings of the clock signals CK1 and CK2 match. However, the updating scheme according to the embodiment is not limited thereto. The phase synchronization timings TMA and TMB may be timings at which the phase anteroposterior relation between the clock signals CK1 and CK2 is switched. The timing at which the phase anteroposterior relation is switched is a timing at which a state in which the phase of one clock signal is in front of the phase of the other clock signal is switched to a state in which the phase of the one clock signal is behind the phase of the other clock signal.

An updating period TP is a period between the phase synchronization timings TMA and TMB. In the updating scheme according to the embodiment, the clock cycle designation value is updated, for example, once during the updating period TP. FIGS. 21 to 23 illustrate a case in which the number of clocks of the clock signal CK1 during the updating period TP is 14 to facilitate the description. However, in order to set a high resolution, the number of clocks during the updating period TP is actually set to, for example, a considerably large number such as 1000 or more (or 5000 or more).

During the updating period TP (a first updating period) of FIG. 21, the clock cycle designation value is set to CIN=3. Accordingly, the signal level of the signal SAT is transitioned at a clock cycle (CCT=3) designated with CIN=3. In this way, in the updating scheme according to the embodiment, the signal level of the signal STA is transitioned at the clock cycle of the clock signal CK1 designated based on the clock cycle designation value CIN (the clock cycle designation information). As described with reference to FIGS. 3 and 4, the signal level of the signal STP is transitioned to correspond to the signal STA and the time difference between the transition timings of the signals STA and STP is TDF. On the other hand, at the clock cycle (CCT=3) designated with CIN=3, as described with reference to FIG. 2, the inter-clock time difference between the clock signals CK1 and CK2 is TR=CIN×$\Delta t$=3$\Delta t$.

In this case, in the updating scheme according to the embodiment, as indicated by A1 of FIG. 21, the phases of the signal STP and the clock signal CK2 are compared. The phase comparison can be realized, for example, by sampling one of the signal STP and the clock signal CK2 with the other signal.

In A1 of FIG. 21, a result of the phase comparison which is a result obtained by sampling the signal STP with the clock signal CK2 is at the L level. In accordance with the result of the phase comparison, the phase of the signal STP is determined to be behind the phase of the clock signal CK2. In other words, in A1 of FIG. 21, TDF>TR=3$\Delta t$ is set and the time difference TDF between the signals STA and STP is longer than the inter-clock time difference TR=3$\Delta t$ between the clock signals CK1 and CK2. In this case, updating is performed to increase the clock cycle designation value CIN.

During the updating period TP (the second updating period) of FIG. 22, the clock cycle designation value is set to CIN=9. For example, during the previous updating period TP illustrated in FIG. 21, updating is performed to increase the clock cycle designation value from CIN=3 to CIN=9, as described above. Accordingly, the signal level of the signal SAT is transitioned at a clock cycle (CCT=9) designated with CIN=9. The signal level of the signal STP is transitioned to correspond to the signal STA and the time difference between the transition timings of the signals STA and STP is TDF. On the other hand, at the clock cycle (CCT=9) designated with CIN=9, the inter-clock time difference between the clock signals CK1 and CK2 is TR=CIN×$\Delta t$=9$\Delta t$.

In this case, in the updating scheme according to the embodiment, as indicated by A2 of FIG. 22, the phases of the signal STP and the clock signal CK2 are compared. At this time, since a result of the phase comparison which is a result obtained by sampling the signal STP with the clock signal CK2 is the H level, the phase of the signal STP is determined to be in front of the phase of the clock signal CK2. In other words, in A2 of FIG. 22, TDF<TR=9$\Delta t$ is set and the time difference TDF is shorter than the inter-clock time difference TR=9$\Delta t$. In this case, updating is performed to decrease the clock cycle designation value CIN.

During the updating period TP (the third updating period) of FIG. 23, the clock cycle designation value is set to CIN=6. For example, during the previous updating period TP illustrated in FIG. 22, updating is performed to decrease the clock cycle designation value from CIN=9 to CIN=6, as described above. Accordingly, the signal level of the signal SAT is transitioned at a clock cycle (CCT=6) designated with CIN=6. The signal level of the signal STP is transitioned to correspond to the signal STA and the time difference between the transition timings of the signals STA and STP is TDF. On the other hand, at the clock cycle (CCT=6) designated with CIN=6, the inter-clock time difference between the clock signals CK1 and CK2 is TR=CIN×Δt=6Δt.

In this case, in the updating scheme according to the embodiment, as indicated by A3 of FIG. 23, the phases of the signal STP and the clock signal CK2 are compared. In this case, in A3 of FIG. 23, the transition timings (the phases) of the signal STP and the clock signal CK2 match (substantially match). In other words, in A3 of FIG. 23, TDF=TR=6Δt is set. Accordingly, the digital value corresponding to DQ=TR=6Δt is output as the digital value for converting the time difference TDF between the signals STA and STP.

In FIGS. 21 to 23, to facilitate the description, an increase or decrease value of the clock cycle designation value CIN during each updating period is a value greater than 1. However, the increase or decrease value of the clock cycle designation value CIN may be actually set to 1 or GK which is a small value equal to or greater than 1 as in Δ sigma type A/D conversion. GK is a gain coefficient and a value satisfying GK≤1.

For example, in FIGS. 21 and 22, the clock cycle designation value CIN is increased from 3 to 9. However, the updating is actually performed to increase the clock cycle designation value CIN by a given value GK, for example, during each updating period. For example, when GK is the gain coefficient satisfying GK≤1, updating is performed to set the clock cycle designation value CIN to +GK. When GK=0.1 is set and the updating of +GK is continued, for example, 10 times, the clock cycle designation value CIN increases by 1.

In FIGS. 22 and 23, the clock cycle designation value CIN decreases from 9 to 6. However, the updating is actually performed to decrease the clock cycle designation value CIN by the given value GK, for example, during each updating period. For example, updating is performed to set the clock cycle designation value CIN to −GK. When GK=0.1 is set and the updating of −GK is continued, for example, 10 times, the clock cycle designation value CIN decreases by 1.

In A3 of FIG. 23, even after the transition timings of the signal STP and the clock signal CK2 substantially match, the clock cycle designation value CIN is updated. For example, CIN is assumed to be changed like 6, 7, 6, 7, and the like. In this case, the digital value DQ output as a final result can be set to a value between 6Δt and 7Δt (for example, 6.5×Δt). In this way, in the updating scheme according to the embodiment, an actual resolution can also be decreased as in Δ sigma type A/D conversion.

In the updating scheme according to the embodiment, as described above, the phases of the signal STP of which the signal level is transitioned to correspond to the signal STA and the clock signal CK2 are compared and the clock cycle designation value CIN with which the signal level of the signal STA is transitioned is updated based on the result of the phase comparison. Specifically, the clock cycle designation value CIN is updated during each updating period. Then, the updated clock cycle designation value CIN is fed back. Accordingly, even when a time or a physical quantity which is a measurement target is dynamically changed, the time-to-digital conversion following the dynamic change can be realized. For example, as indicated in A3 of FIG. 23, when a measurement target time becomes close to the clock cycle designation value CIN corresponding to the time (the time difference TDF) and subsequently the time is dynamically changed, the clock cycle designation value CIN is sequentially updated in accordance with the dynamic change to correspond to the dynamic change.

In the updating scheme according to the embodiment, when an error component caused due to mismatch of the transition timings of the clock signals CK1 and CK2 is reduced, the time-to-digital conversion circuit 20 preferably performs a process of converting the time difference to the digital value DQ based on the clock cycle designation value and information regarding the number of clocks of the clock signals CK1 and CK2 during the updating period of the clock cycle designation value. For example, the digital value DQ is calculated by updating the clock cycle designation value CIN based on the result of the phase comparison of the signal STP and the clock signal CK2 and the information regarding the number of clocks.

That is, in the updating scheme according to the embodiment, even when the transition timings of the clock signals CK1 and CK2 do not precisely match at the phase synchronization timing, the time-to-digital conversion can be realized. For example, in the updating scheme according to the embodiment, the phase synchronization timings TMA and TMB may be timings at which the phase anteroposterior relation is switched between the clock signals CK1 and CK2 and the transition timings of the clock signals CK1 and CK2 may not completely match. That is, in the embodiment, a modification can also be realized in which the synchronization circuit 110 is not included.

For example, to precisely match the transition timings of the clock signals CK1 and CK2 at the phase synchronization timing, a relation of N/f1=M/f2 should be satisfied. Here, N and M are the numbers of clocks of the clock signals CK1 and CK2 during an updating period, respectively, and are integers equal to or greater than 2. Incidentally, it may be difficult in some cases to set a frequency at which the clock frequencies f1 and f2 in the oscillation elements XTAL1 and XTAL2 in FIG. 1 precisely satisfy the relation of N/f1=M/f2. When the relation of N/f1=M/f2 is not satisfied and the synchronization circuit 110 is not included, deviation occurs between the transition timings of the clock signals CK1 and CK2 at the phase synchronization timings TMA and TMB. The deviation may become a conversion error.

Accordingly, in the updating scheme according to the embodiment, the number of clocks N during each updating period is measured. When the deviation occurs between the transition timings of the clock signals CK1 and CK2 at the phase synchronization timings TMA and TMB, the number of clocks N is not usually the same number, and thus is changed in accordance with the updating period. The time-to-digital conversion circuit 20 updates the clock cycle designation value CIN based on the number of clocks N changed in this way and the result of the phase comparison of the signal STP and the clock signal CK2. In this way, it is possible to reduce the conversion error caused due to the deviation between the transition timings of the clock signals CK1 and CK2 at the phase synchronization timings TMA and TMB.

8. Binary Searching Scheme

Figure 24:
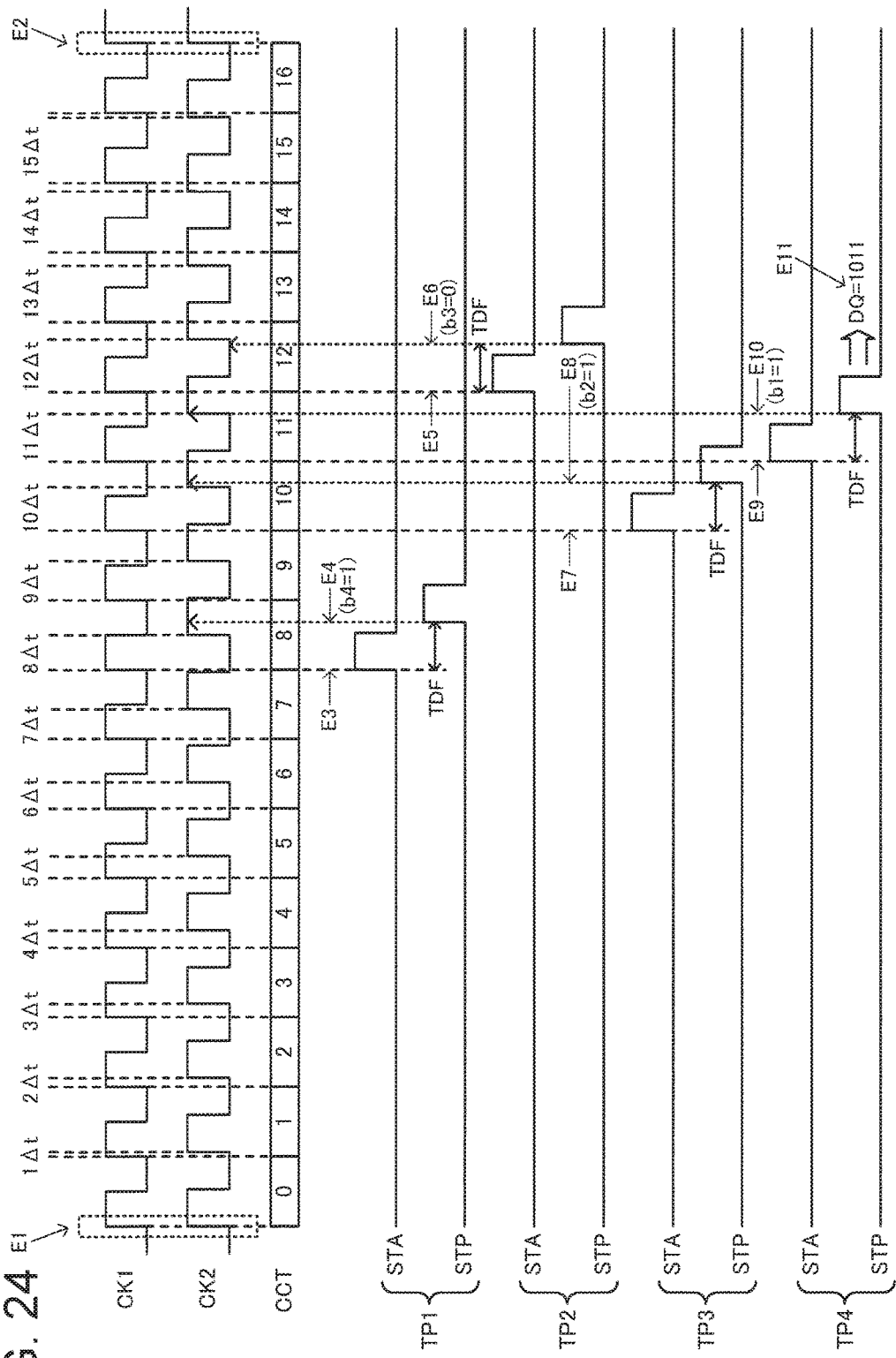
FIG. 24 is a diagram illustrating signal waveforms for describing a binary searching scheme.

Next, a binary searching scheme will be described as the time-to-digital conversion scheme according to the embodiment. FIG. 24 is a diagram illustrating signal waveforms for describing the binary searching scheme. In FIG. 24, a digital value corresponding to a time difference between the transition timings of the signals STA and STP is calculated with a resolution corresponding to the frequency difference between the clock frequencies f1 and f2 by binary searching. Specifically, the updating of the clock cycle designation value CIN based on the result of the phase comparison of the signal STP and the clock signal CK2 is realized by the binary searching.

The binary searching (a dichotomizing search or bisection method) is a method of calculating a final digital value by sequentially dividing (two-division) a searching range and narrowing the searching range. For example, the digital value DQ obtained by converting the time difference is assumed to be 4-bit data and 4 bits are assumed to be b4, b3, b2, and b1. Here, b4 is the MSB and b1 is the LSB. In FIG. 24, the bits b4, b3, b2, and b1 of the digital value DQ is obtained by the binary searching. For example, the bits b4, b3, b2, and b1 of the digital value DQ are sequentially calculated by the same scheme as A/D conversion of sequential comparison.

For example, in FIG. 24, the clock frequencies of the clock signals CK1 and CK2 are, for example, f1=100 MHz (a period=10 ns) and f2=94.12 MHz (a period=10.625 ns) and the resolution is Δt=0.625 ns. E1 and E2 in FIG. 24 are phase synchronization timings and are, for example, timings at which the transition timings of the clock signals CK1 and CK2 match. The clock cycle designation value CIN is set to, for example, CIN=8 which is an initial value. CIN=8 which is the initial value is equivalent to, for example, a value near the middle of the initial searching range.

In this way, when CIN=8 is set, the signal level of the signal STA is transitioned during the initial updating period TP1 (the first updating period) when the clock cycle value is CCT=8, as indicated by E3 of FIG. 24. When the signal level of the signal STP is transitioned to correspond to the signal STA, the phases of the signal STP and the clock signal CK2 are compared. For example, the phase comparison in which the clock signal CK2 is sampled with the signal STP is performed, the H level of the clock signal CK2 is sampled, as indicated by E4, and the H level is the result of the phase comparison. In this way, when the result of the phase comparison is the H level, a logic level of the bit b4 which is the MSB of the digital value DQ is determined to be b4=1.

In this way, when b4=1 is calculated, the searching range of the binary searching is narrowed and CIN corresponding to the final digital value DQ is determined to be within a searching range of, for example, 8 to 15. Then, the clock cycle designation value is updated to, for example, CIN=12 so that a value (for example, a value near the middle) within the searching range is set.

In this way, when the clock cycle designation value is updated to CIN=12, the signal level of the signal STA is transitioned during the updating period TP2 (the second updating period) subsequent to the updating period TP1, as indicated by E5, when the clock cycle value is CCT=12. Then, the phases of the signal STP and the clock signal CK2 are compared. For example, as indicated by E6, the L level of the clock signal CK2 is sampled. Therefore, the L level is the result of the phase comparison. In this way, when the result of the phase comparison is the L level, the logic level of the subsequent bit b3 of the digital value DQ is determined to be b3=0.

In this way, the searching range of the binary searching is narrowed by calculating b4=1 and b3=0, CIN corresponding to the final digital value DQ is determined to be within a searching range of, for example, 8 to 11. Then, the clock cycle designation value is updated to, for example, CIN=10 so that a value (for example, a value near the middle) within the searching range is set.

In this way, when the clock cycle designation value is updated to CIN=10, the signal level of the signal STA is transitioned during the updating period TP3 (the third updating period) subsequent to the updating period TP2, as indicated by E7, when the clock cycle value is CCT=10. Then, the phases of the signal STP and the clock signal CK2 are compared. For example, as indicated by E8, the H level of the clock signal CK2 is sampled. Therefore, the H level is the result of the phase comparison. In this way, when the result of the phase comparison is the H level, the logic level of the subsequent bit b2 of the digital value DQ is determined to be b2=1.

Finally, the cock cycle designation value is updated to CIN=11 and the signal level of the signal STA is transitioned during the updating period TP4 (the fourth updating period) subsequent to the updating period TP3, as indicated by E9, when the clock cycle value is CCT=11. Then, the phases of the signal STP and the clock signal CK2 are compared. For example, as indicated by E10, the H level of the clock signal CK2 is sampled. Therefore, the H level is the result of the phase comparison. In this way, when the result of the phase comparison is the H level, bit b1 which is the LSB of the digital value DQ is set to b1=1. Then, as indicated by E11, DQ=1011 (binary numbers) is output as an output code which is the final digital value.

When the binary searching scheme is used, the digital value DQ corresponding to the time difference between the transition timings of the signals STA and STP can be calculated at a high speed. For example, in the scheme of the related art of the above-described JP-A-5-87954, time measurement of 15 times is necessary to the maximum in order to calculate the final digital value DQ in the case of FIG. 24. In contrast, in the scheme according to the embodiment, as illustrated in FIG. 24, the final digital value DQ can be calculated during the updating periods of, for example, 4 times. Thus, acceleration of the time-to-digital conversion is achieved.

In particular, when the resolution Δt is decreased and the number of bits L of the digital value DQ is increased, for example, time measurement of about $2^L$ is necessary in the scheme of the related art. Thus, the conversion time may become considerably long. In contrast, in the scheme according to the embodiment, the final digital value DQ can be calculated during the updating periods of, for example, L times. Thus, considerable acceleration of the time-to-digital conversion is achieved compared to the scheme of the related art.

The high-order bit side of the digital value DQ may be calculated by the binary searching scheme of FIG. 24, and subsequently the low-order bit side (for example, low-order bits including the LSB or the low-order bit of the LSB) may be calculated by, for example, the updating scheme described with reference to FIGS. 21 to 23. For example, in FIG. 24, the clock cycle designation value CIN is updated so that a value within the searching range is obtained while sequentially narrowing the searching range (sequential comparison range) as in sequential comparison type A/D conversion. On the other hand, in the updating scheme of FIGS. 21 to 23, the updating is performed to increase or decrease CIN by±GK based on the result of the phase comparison as in A sigma type A/D conversion. GK is the gain coefficient and GK≤1 is satisfied. Specifically, in the case of the result of the phase comparison in which the phase of the signal STP is behind the phase of the clock signal CK2, updating (a digital arithmetic process) is performed to increase CIN by +GK. Conversely, in the case of the result of the phase comparison in which the phase of the signal STP is in front of the phase of the clock signal CK2, updating (a digital arithmetic process) is performed to decrease CIN by −GK. In this way, by combining the two schemes, it is possible to achieve compatibility of acceleration and high precision of the time-to-digital conversion.

9. Other Configuration Examples

Figure 25:
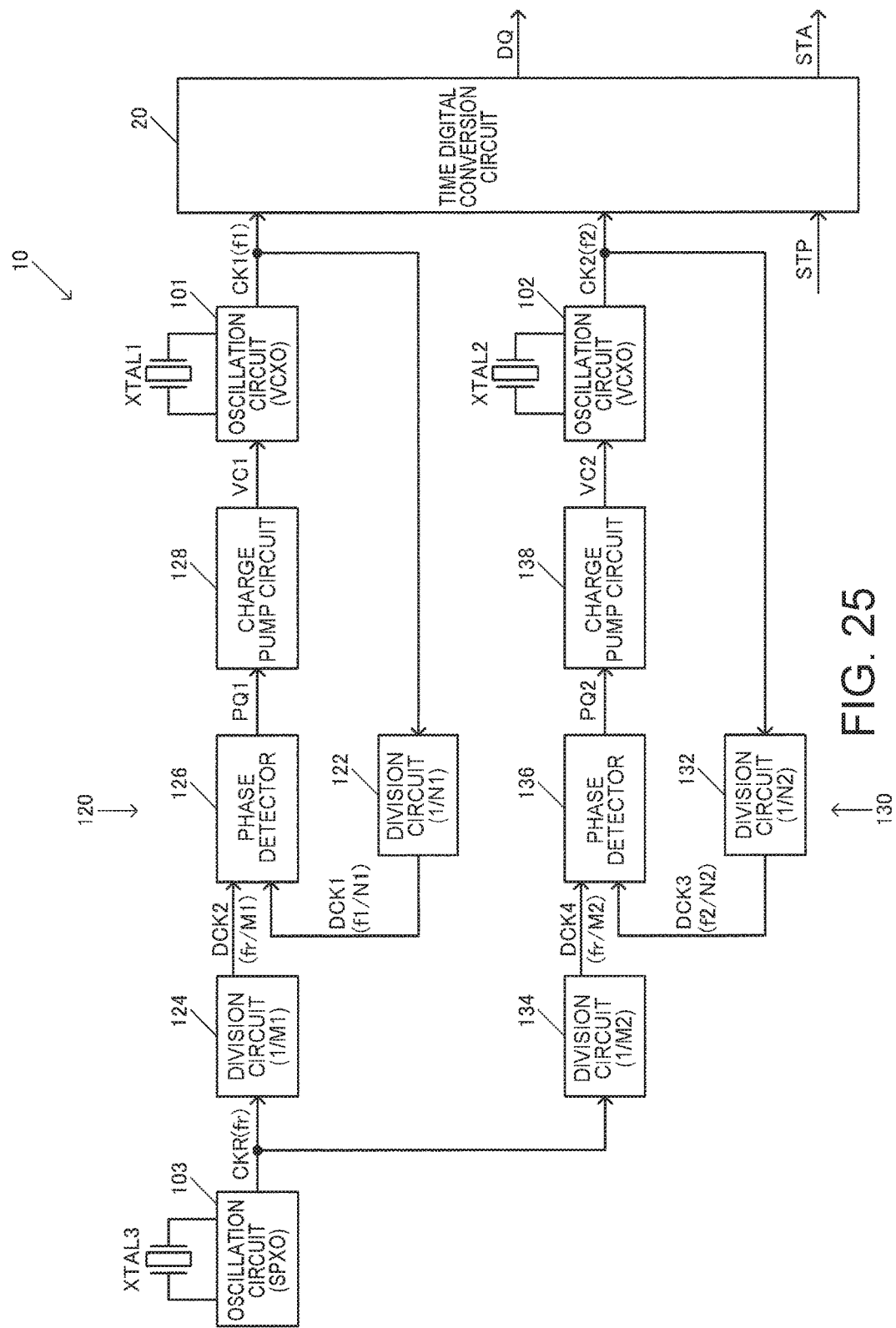
FIG. 25 is a diagram illustrating another configuration example of the integrated circuit device according to the embodiment.

FIG. 25 is a diagram illustrating another configuration example of the integrated circuit device 10 according to the embodiment. In the integrated circuit device 10 in FIG. 25, a plurality of PLL circuits 120 and 130 are installed as the synchronization circuit 110 in FIG. 11.

The PLL circuit 120 (a first PLL circuit) synchronizes the phases of the clock signal CK1 and a reference clock signal CKR. Specifically, the clock signal CK1 with the clock frequency f1 generated using the oscillation element XTAL1 (the first resonator) and the reference clock signal CKR are input to the PLL circuit 120. Then, the PLL circuit 120 synchronizes the phases of the clock signal CK1 and the reference clock signal CKR. For example, the PLL circuit 120 synchronizes the phases (matches the transition timings) of the clock signal CK1 and the reference clock signal CKR at each first phase synchronization timing (each first period).

The PLL circuit 130 (the second PLL circuit) synchronizes the phases of the clock signal CK2 and the reference clock signal CKR. Specifically, the clock signal CK2 with the clock frequency f2 generated using the oscillation element XTAL2 (the second oscillation element) and the reference clock signal CKR are input to the PLL circuit 130. Then, the PLL circuit 130 synchronizes the phases of the clock signal CK2 and the reference clock signal CKR. For example, the PLL circuit 130 synchronizes the phases (matches the transition timings) of the clock signal CK2 and the reference clock signal CKR at each second phase synchronization timing (each second period).

The reference clock signal CKR is generated, for example, by causing the oscillation circuit 103 to oscillate an oscillation element XTAL3 (a third oscillation element). A clock frequency fr is a different frequency from the clock frequencies f1 and f2 of the clock signals CK1 and CK2 and is, for example, a lower frequency than the clock frequencies f1 and f2. As the oscillation element XTAL3, the same element as the oscillation element XTAL1 or XTAL2 can be used. For example, a quartz crystal resonator can be used. The quartz crystal resonator can be used to generate the reference clock signal CKR with high precision in which jitter or a phase error is small. As a result, jitter or a phase error of the clock signals CK1 and CK2 can also be reduced, and thus high precision time-to-digital conversion is achieved.

In this way, in the embodiment, the phases of the clock signal CK1 and the reference clock signal CKR are synchronized by the PLL circuit 120 and the phases of the clock signal CK2 and the reference clock signal CKR are synchronized by the PLL circuit 130. Thus, the phases of the clock signals CK1 and CK2 are synchronized. A modification can also be realized in which three or more PLL circuits (three or more oscillation elements) are included to synchronize the phases of the clock signals CK1 and CK2.

Specifically, the PLL circuit 120 includes division circuits 122 and 124 (first and second division circuits) and a phase detector 126 (a first phase comparator). The division circuit 122 performs division so that the clock frequency f1 of the clock signal CK1 becomes 1/N1 and outputs the divided clock signal DCK1 with the clock frequency of f1/N1. The division circuit 124 performs division so that the clock frequency fr of the reference clock signal CKR becomes 1/M1 and outputs the divided clock signal DCK2 with the clock frequency of fr/M1. Then, the phase detector 126 compares the phases of the divided clock signal DCK1 and the divided clock signal DCK2 and outputs the signal PQ1 which is an up/down signal to the charge pump circuit 128. Then, the oscillation circuit 101 (VCXO) performs an oscillation operation of the oscillation element XTAL1 of which an oscillation frequency is controlled based on the control voltage VC1 from the charge pump circuit 128 to generate the clock signal CK1.

The PLL circuit 130 includes division circuits 132 and 134 (third and fourth division circuits) and a phase detector 136 (a second phase comparator). The division circuit 132 performs division so that the clock frequency f2 of the clock signal CK2 becomes 1/N2 and outputs the divided clock signal DCK3 with the clock frequency of f2/N2. The division circuit 134 performs division so that the clock frequency fr of the reference clock signal CKR becomes 1/M2 and outputs the divided clock signal DCK4 with the clock frequency of fr/M2. Then, the phase detector 136 compares the phases of the divided clock signal DCK3 and the divided clock signal DCK4 and outputs the signal PQ2 which is an up/down signal to the charge pump circuit 138. Then, the oscillation circuit 102 (VCXO) performs an oscillation operation of the oscillation element XTAL2 of which an oscillation frequency is controlled based on the control voltage VC2 from the charge pump circuit 138 to generate the clock signal CK2.

Figure 26:
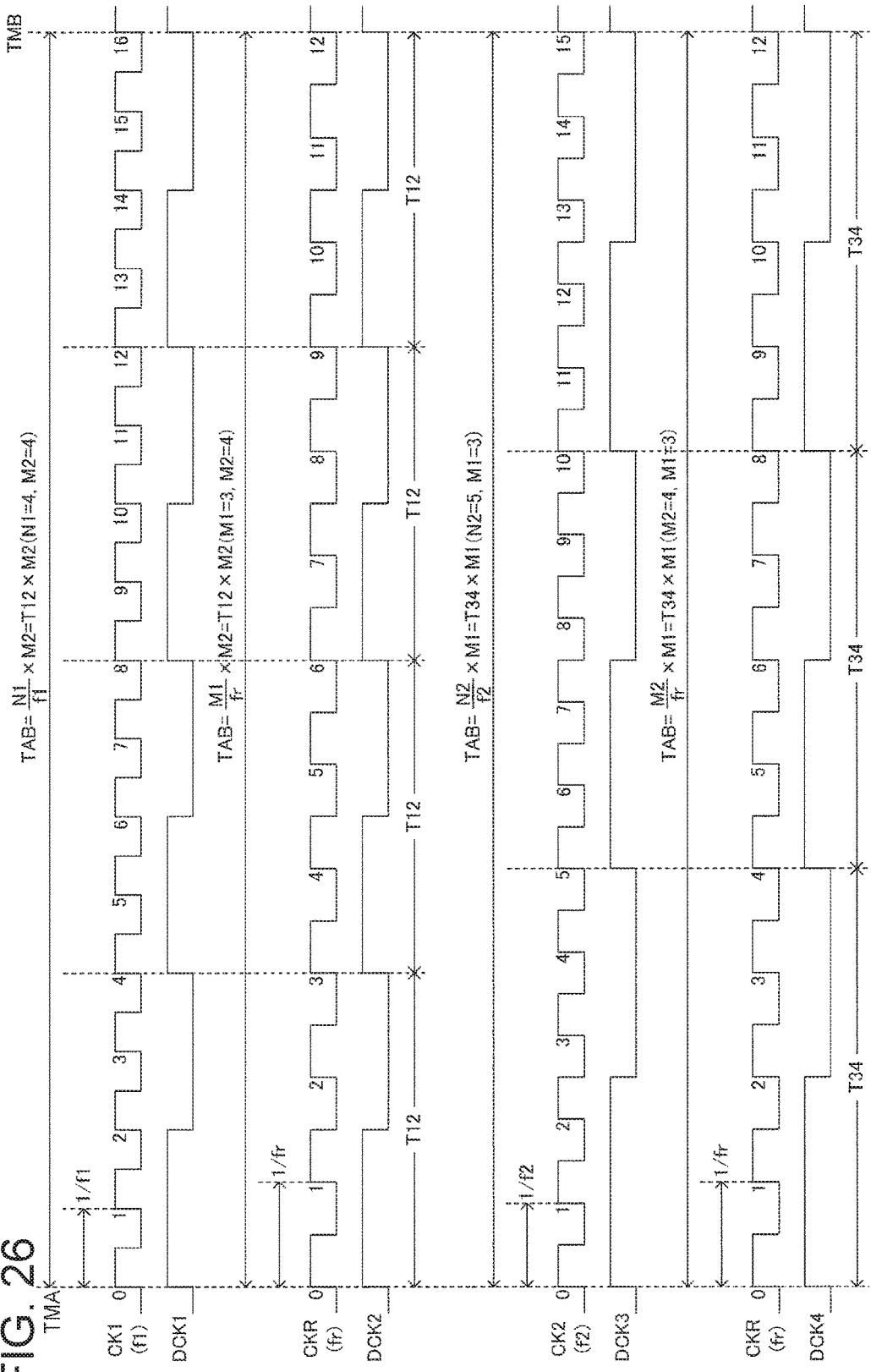
FIG. 26 is a diagram illustrating signal waveforms for describing an operation of the other configuration example of the integrated circuit device according to the embodiment.

FIG. 26 is a diagram illustrating signal waveforms for describing an operation of the integrated circuit device 10 in FIG. 25. In FIG. 26, to facilitate the description, setting examples of N1=4, M1=3, N2=5, and M2=4 are illustrated. However, N1, M1, N2, and M2 are actually set to considerably large numbers in order to improve the resolution of the time-to-digital conversion.

As illustrated in FIG. 26, the signal obtained by dividing the clock signal CK1 by N1=4 becomes the divided clock signal DCK1 and the signal obtained by the reference clock signal CKR by division of M1=3 becomes the divided clock signal DCK2. Then, the phases of these signals are synchronized during each period T12. That is, the PLL circuit 120 synchronizes the phases of the clock signal CK1 and the reference clock signal CKR so that a relation of T12=N1/f1=M1/fr is established.

The signal obtained by dividing the clock signal CK2 by N2=5 becomes the divided clock signal DCK3 and the signal obtained by the reference clock signal CKR by division of M2=4 becomes the divided clock signal DCK4. Then, the phases of these signals are synchronized during each period T34. That is, the PLL circuit 130 synchronizes the phases of the clock signal CK2 and the reference clock signal CKR so that a relation of T34=N2/f2=M2/fr is established. In this way, the phases of the clock signal CK1 and the reference clock signal CKR are synchronized for each period T12 and the phases of the clock signal CK2 and the reference clock signal CKR are synchronized for each period T34, so that the phases of the clock signals CK1 and CK2 are synchronized for each period TAB. Here, a relation of TAB=T12×M2=T34×M1 is established. For example, a relation of TAB=T12×4=T34×3 is satisfied in the case of M2=4 and M1=3.

Figures 27, 28:
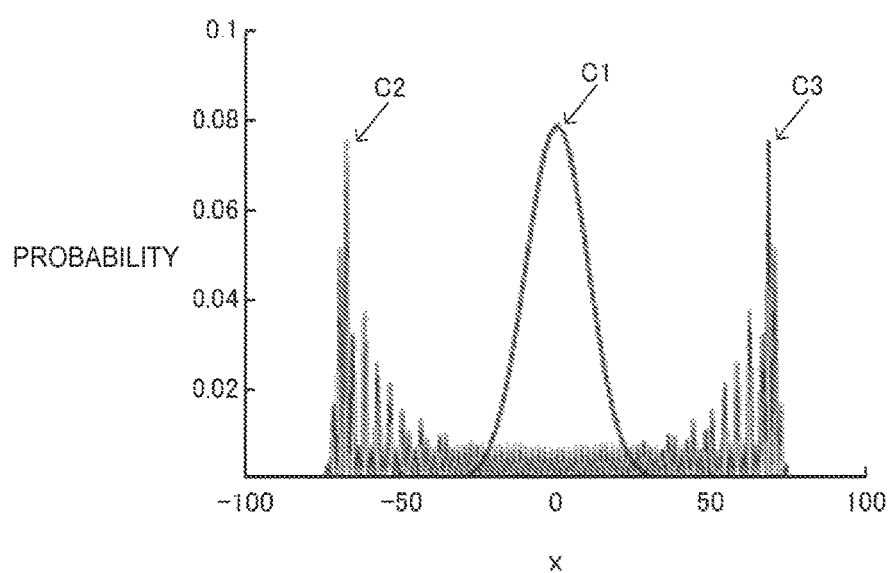
FIG. 27 is a diagram illustrating setting examples of division ratios.
FIG. 28 is a diagram illustrating a random walk and a quantum walk.

The division ratios N1, M1, N2, and M2 of the division circuits 122, 124, 132, and 134 in FIG. 25 are actually set to considerably large numbers. FIG. 27 illustrates setting examples of division ratios. For example, when the clock frequency of the reference clock signal CKR is fr=101 MHz, a division ratio of the division circuits 122 and 124 is set to N1=101 and M1=100. Thus, the clock signal CK1 with f1=102.01 MHz is generated by the PLL circuit 120. A division ratio of the division circuits 132 and 134 is set to N2=102 and M2=101. Thus, the clock signal CK2 with f2=102 MHz is generated by the PLL circuit 130. Thus, the resolution (time resolution) of the time-to-digital conversion described with reference to FIG. 2 can be set to Δt=|1/f1−1/f2|=0.96 picoseconds (ps). Thus, it is possible to achieve the time-to-digital conversion of a considerably high resolution.

As illustrated in FIGS. 27, N1 and M1 are two or more different integers and N2 and M2 are also two or more different integers. At least one of N1 and M1 and at least one of N2 and M2 are different integers. Preferably, the greatest common divisor of N1 and N2 is 1 and the least common multiple of N1 and N2 is N1×N2. The greatest common divisor of M1 and M2 is 1 and the least common multiple of M1 and M2 is M1×M2.

In FIG. 27, a relation of |N1×M2−N2×M1|=1 is established. That is, N1, M1, N2, and M2 are set so that the relation of |N1×M2−N2×M1|=1 is established. For example, when N1=4, M1=3, N2=5, and M2=4 are set in FIG. 26, |N1×M2−N2×M1|=|4×4−5×3|=1 is satisfied. This means that the length of 16 clock signals CK1 is the same as the length of 15clock signals CK2. In this way, the clock signals CK1 and CK2 deviate by one clock cycle (one clock period) during each period TAB. In this way, it is possible to easily realize the time-to-digital conversion using the principle of a caliper (vernier).

In FIGS. 25 and 26, the phases of the clock signal CK1 and the reference clock signal CKR are synchronized for each the period T12 shorter than the period TAB and the phases of the clock signal CK2 and the reference clock signal CKR are synchronized during each period T34 shorter than the period TAB. Accordingly, an incidence of the phase comparison is greater than in the configuration example of FIG. 14 described above, and thus a reduction in jitter (accumulative jitter) or phase noise of the clock signals CK1 and CK2 is achieved. In particular, when the N1, M1, N2, and M2 are set to large numbers in order to realize Δt of a high resolution, the length of the period TAB is considerably long in the configuration example of FIG. 14. Thus, errors are integrated and jitter or a phase error may increase. In contrast, in FIGS. 25 and 26, since the phase comparison is performed during each period T12 or each period T34 shorter than the period TAB, the integrated errors can be reduced. Thus, there is the advantage of improving the jitter or the phase error.

The PLL circuits 120 and 130 in FIG. 25 are configured as analog circuits, but digital (ADPLL) circuit configuration may be adopted. In this case, each PLL circuit (120 and 130) can be realized by a digital arithmetic unit and a phase detector including a counter and TDC. The counter generates digital data equivalent to an integer part of a result obtained by dividing the clock frequency (fr) of the reference clock signal (CKR) by the clock frequency (f1 or f2) of the clock signal (CK1 or CK2). The TDC generates digital data equivalent to a decimal part of the division result. The digital data corresponding to an addition result of the integer part and the decimal part is output to the digital arithmetic unit. The digital arithmetic unit generates frequency control data by detecting a phase error with set frequency data based on the digital data of the comparison result from the set frequency data (FCW1 and FCW2) and the phase detector and performing a process of smoothing the phase error, and then outputs the frequency control data to the oscillation circuits (101 and 102). The oscillation frequency is controlled based on the frequency control data and the oscillation circuit generates the clock signals (CK1 and CK2). Instead of using the TDC, the digital PLL circuit may be realized with a configuration in which a bang-bang type phase detector and PI control are used.

10. Jitter and Resolution

In the embodiment, as described above, time-to-digital conversion with high resolution is realized, but there is a problem that precision corresponding to the high resolution may not be realized due to accumulation of jitter of the clock signals. For example, when jitter is simply white noise, the accumulative jitter is, for example, a random walk. That is, the accumulative jitter which is an accumulative sum is a random walk and has autocorrelation with jitter (white noise) such as absolute noise with no autocorrelation.

For example, the random walk is distributed and converged on a normal distribution (Gauss distribution), as indicated by C1 of FIG. 28. A quantum walk is converged on a given probability density function that has a limited compact support, as indicated by C2 and C3.

For example, in FIG. 8, the phases of the clock signals CK1 and CK2 are synchronized for period TAB. As indicated by D1 of FIG. 29, there is jitter at each clock cycle in the clock signals CK1 and CK2. The phases of the clock signals CK1 and CK2 are synchronized during each period TK and D2 is accumulative jitter during the period TK. Here, J is assumed to be a jitter amount per clock cycle of the clock signals CK1 and CK2 and K is assumed to be the number of clocks during the period TK in one of the clock signals CK1 and CK2 (or the reference clock signal). At this time, when a random walk is assumed, an accumulative jitter amount (a jitter integrated error) can be expressed as, for example, $K^{1/2} \times J$. When a quantum walk is assumed, an accumulative jitter amount can be expressed as, for example, $K \times J$.

Here, the jitter amount J represents a deviation in the phase with respect to an ideal clock signal and is expressed with an RMS value and a unit is a time. For example, the jitter amount J is a standard value (maximum standard value) determined in accordance with performance or the like of the oscillation element and is, for example, an RMS value representing a deviation in an average phase per clock. The number of clocks K is the number of clocks (instances) of one clock signal during the period TK between a timing at which the phase of one of the clock signals CK1 and CK2 is synchronized with the phase of the other clock signal or the reference clock signal (CKR) and a timing at which the phases are subsequently synchronized. In the example of FIG. 8, the number of clocks K is equivalent to the numbers of clocks N and M of the clock signals CK1 and CK2. The period TK is equivalent to the period TAB of FIG. 8. When f (f1 or f2) is the frequency of one of the clock signals CK1 and CK2 and Δt is a resolution of the time-to-digital conversion, K=1/(f×Δt) can be expressed. On the other hand, in the example of FIG. 25, the number of clocks K is equivalent to N1 and N2 of FIG. 27. The period TK is equivalent to the periods T12 and T34 of FIG. 26.

Figure 29:
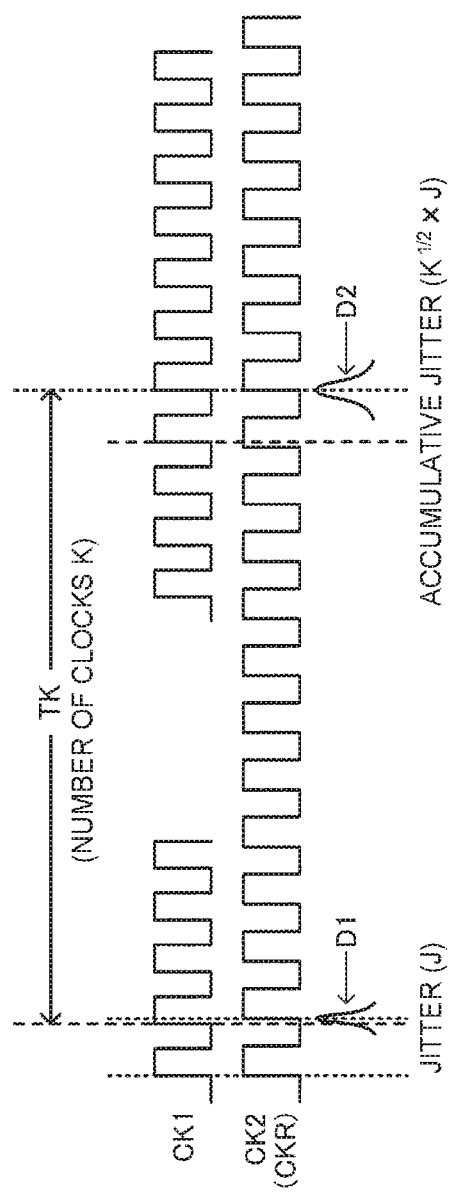
FIG. 29 is a diagram illustrating an accumulative jitter.

As illustrated in FIG. 29, as the number of clocks K during the period TK indicating a phase synchronization interval is larger, an error by the accumulative jitter is larger and the precision may degrade. The meaning is that the number of clocks K during the period TK can be decreased in the configuration example of FIG. 25. Therefore, an error by the accumulative jitter can be reduced and it is possible to improve the precision.

Figure 30:
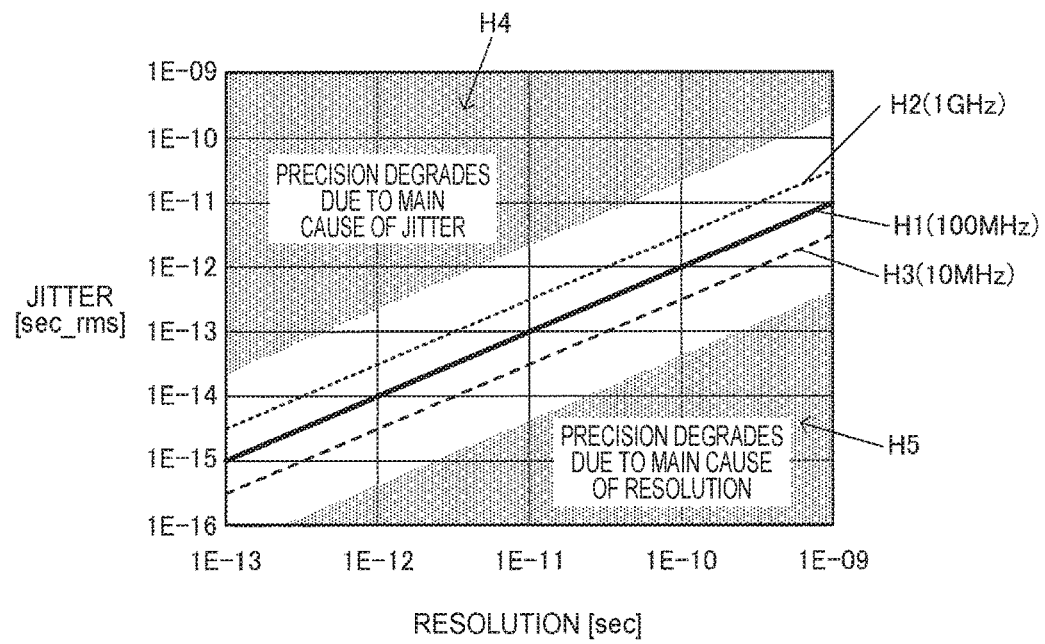
FIG. 30 is a diagram illustrating a relation between resolution and jitter.

H1, H2, and H3 of FIG. 30 indicate a relation between a resolution (sec) and jitter (sec_rms) of a clock signal, for example, when a random walk is assumed. For example, a relation between the resolution and the jitter is indicated when the accumulative jitter amount is expressed as $K^{1/2} \times J$.

H1, H2, and H3 are equivalent to cases in which the frequencies of the clock signals (CK1 and CK2) are 100 MHz, 1 GHz, and 10 MHz. In FIG. 30, a region indicated by H4 is a region in which the precision degrades due to the jitter as a main cause. A region indicated by H5 is a region in which the precision degrades due to the resolution as a main cause.

For example, H1 of FIG. 30 indicates a case in which the frequency of the clock signal is 100 MHz and the number of clocks K is about $10^4$. For example, when the resolution ($\Delta t$) is 1 ps ($10^{-12}$ sec) in H1, jitter (J) is 0.01 ps ($10^{-14}$ sec_rms). When K=$10^4$ is set, a relation of $\Delta t = K^{1/2} \times J$ is established. For example, when the frequency of the clock signal is set to be high like 1 GHz, the number of clocks K can be set to be small. Therefore, a line indicating the relation of $\Delta t = K^{1/2} \times J$ is indicated by H2 and a request for the jitter is moderate. Conversely, when the frequency of the clock signal is set to be low like 10 MHz, the number of clocks K increases. Therefore, a line indicating the relation of $\Delta t = K^{1/2} \times J$ is indicated by H3 and a request for the jitter is strict.

In the embodiment, when J is a jitter amount per clock cycle of the clock signals CK1 and CK2 and $\Delta t$ is a resolution of the time-to-digital conversion, at least a relation of $J \leq \Delta t$ is established. For example, H6 of FIG. 31 indicates a line in which a relation of $J = \Delta t$ is established. This line corresponds to a region in which the precision degrades due to the jitter as a main cause, as indicated by H4 of FIG. 30, and indicates an upper limit of the jitter in which the jitter does not exceed at least the resolution. For example, when the resolution ($\Delta t$) is 1 ps ($10^{-12}$ sec), it is requested that the jitter amount J is equal to or less than at least 1 ps ($10^{-12}$ sec_rms) and the jitter amount J is not allowed to be greater than 1 ps (an RMS value). This is because when the jitter amount is greater than 1 ps, setting of the high resolution such as $\Delta t = 1$ ps is meaningless.

In the embodiment, when K is the number of clocks of one clock signal during the period TK between a timing at which the phase of one of the clock signals CK1 and CK2 is synchronized with the phase of the other clock signal or the reference clock signal (CKR) and a timing at which the phases are subsequently synchronized, a relation of $J \geq \Delta t/K$ is established. For example, H7 of FIG. 31 indicates a line in which a relation of $J = \Delta t/K$ is established. This line corresponds to a region in which the precision degrades due to the resolution as a main cause, as indicated by H5 of FIG. 30, and indicates a lower limit of the jitter with respect to the resolution. For example, H7 corresponds to a quantum walk. In this way, when $J \geq \Delta t/K$ is set, a behavior of the accumulative jitter can be treated even when the quantum walk is assumed. An oscillation element with jitter characteristics more than necessary may not be selected.

For example, when f (f1 or f2) is the frequency of the clock signals (CK1 and CK2) and K is the number of clocks during the period TK, K=$1/(f \times \Delta t)$ is established. In the example of FIG. 8, N=$1/(f1 \times \Delta t)$ and M=$1/(f2 \times \Delta t)$ are established. This means that the phases of one of the clock signals (CK1 and CK2) and the other clock signal deviate by one clock cycle for each period TK (TAB). Accordingly, when the relation of $J \div \Delta t/K$ is expressed with the frequency f of the clock signal, a relation of $J \geq f \times \Delta t^2$ is established.

Figure 31:
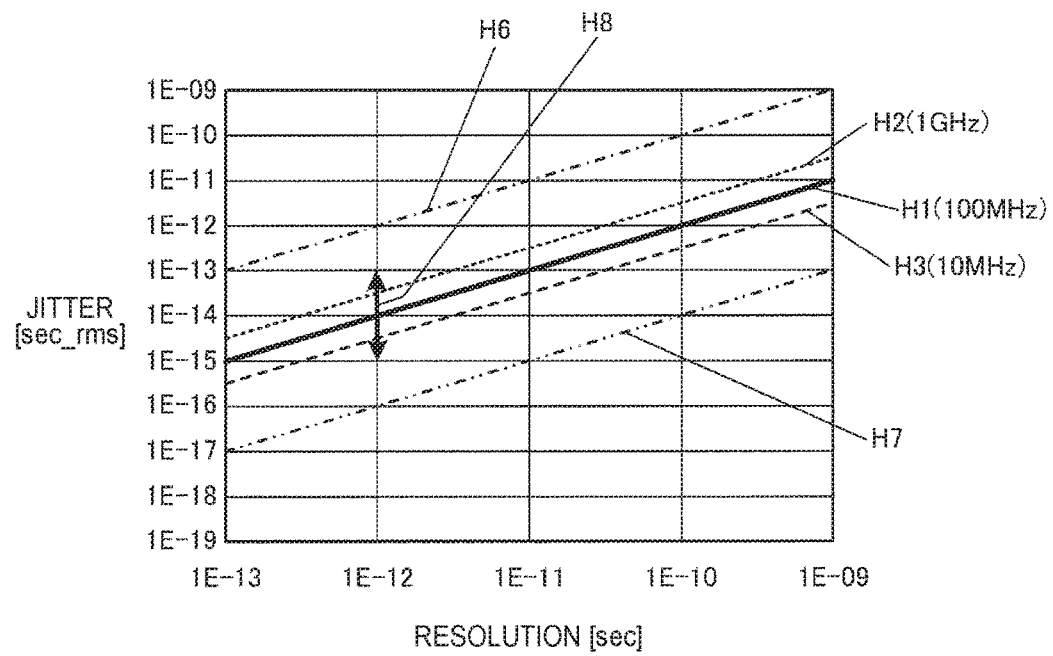
FIG. 31 is a diagram illustrating a relation between resolution and jitter.

In the embodiment, for example, a relation of $(1/10) \times (\Delta t/K^{1/2}) \leq J \leq 10 \times (\Delta t/K^{1/2})$ is established. For example, when the clock frequency is 100 MHz, H1 of FIG. 31 is equivalent to a line of $J = \Delta t/K^{1/2}$. This line is equivalent to a line of a random walk. In this case, for example, in a range indicated by H8 of FIG. 31, the precision does not degrade due to the jitter as a main cause, as indicated by H4 of FIG. 30 and the precision does not degrade due to the resolution as a main cause, as indicated by H5. It is indicated that $(1/10) \times (\Delta t/K^{1/2}) \leq J \leq 10 \times (\Delta t/K^{1/2})$ is within the range indicated by H8 of FIG. 31 and the relation between the resolution of the jitter is preferably within the range of H8. Since the region in the range of H8 is a region in a boundary of a region in which the accumulative jitter limits the precision and a region in which the resolution limits the precision, the time-to-digital conversion of high precision can be realized even when an oscillation element with over-specification is not employed.

For example, when a random walk is assumed, a relation in which the resolution and the accumulative jitter amount compete with each other can be expressed as $J = \Delta t/K^{1/2}$. As described above, when K=$1/(f \times \Delta t)$ is established, $J = \Delta t/K^{1/2}$ becomes a relation of $J = (f \times \Delta t^3)^{1/2}$. Accordingly, when the frequency f of the clock signal is in the range of 10 MHz to 1 GHz as in FIG. 31, a relation of $(10^7 \times \Delta t^3)^{1/2} \leq J \leq (10^4 \times \Delta t^3)^{1/2}$ is established. When the frequency f of the clock signal is in the range of 10 KHz to 10 GHz, a relation of $(10^4 \times \Delta t^3)^{1/2} \leq J \leq (10^{10} \times \Delta t^3)^{1/2}$.

11. Physical Quantity Measurement Apparatus, Electronic Apparatus, and Vehicle

Figure 32:
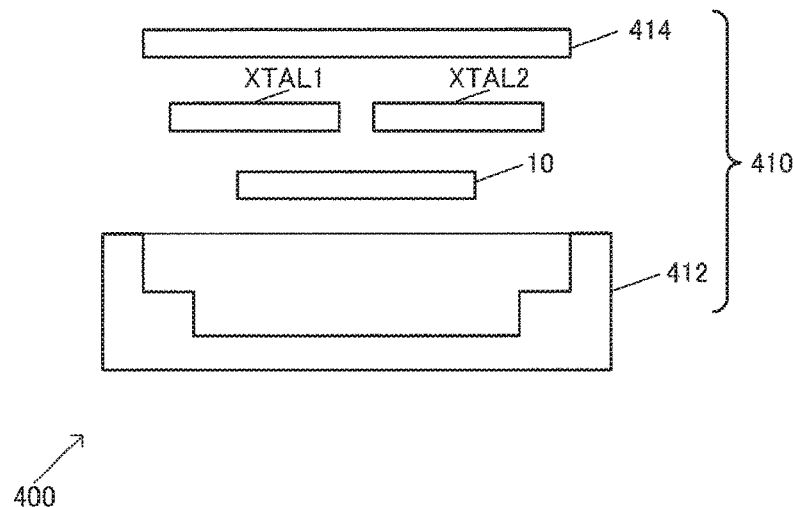
FIG. 32 is a diagram illustrating a configuration example of a physical quantity measurement apparatus.

FIG. 32 illustrates a configuration example of a physical quantity measurement apparatus 400 according to the embodiment. The physical quantity measurement apparatus 400 includes the integrated circuit device 10 according to the embodiment, the oscillation element XTAL1 (the first resonator or a first resonator element) that generates the clock signal CK1, and the oscillation element XTAL2 (the second oscillation element or a second resonator element) that generates the clock signal CK2. The physical quantity measurement apparatus 400 can include a package 410 in which the integrated circuit device and the oscillation elements XTAL1 and XTAL2 are accommodated. The package 410 is configured to include, for example, a base unit 412 and a lid unit 414. The base unit 412 is, for example, a box-like member formed of an insulation material such as ceramics and the lid unit 414 is, for example, a plate-shaped member bonded to the base unit 412. An external connection terminal (external electrode) which is connected to an external apparatus is installed on, for example, the bottom surface of the base unit 412. The integrated circuit device 10 and the oscillation elements XTAL1 and XTAL2 are accommodated in an internal space (cavity) formed by the base unit 412 and the lid unit 414. Then, the integrated circuit device 10 and the oscillation elements XTAL1 and XTAL2 are air-tightly sealed inside the package 410 by being sealed by the lid unit 414.

The integrated circuit device 10 and the oscillation elements XTAL1 and XTAL2 are mounted inside the package 410. Terminals of the oscillation elements XTAL1 and XTAL2 and a terminal (pad) of the integrated circuit device 10 (IC) are electrically connected by an internal wiring of the package 410. The oscillation circuits 101 and 102 oscillating the oscillation elements XTAL1 and XTAL2 are installed in the integrated circuit device 10. The oscillation elements XTAL1 and XTAL2 are oscillated by the oscillation circuits 101 and 102 to generate the clock signals CK1 and CK2.

In the scheme of the related art of the above-described JP-A-5-87954, for example, the first and second oscillation circuits are installed in the first and second quartz crystal oscillators and the integrated circuit device does not contain the first and second oscillation circuits. Therefore, the synchronization of the phases of the first and second clock signals may not be realized by the synchronization circuit 110. In addition, there is the disadvantage that a control process common to the first and second oscillation circuits may not be performed in the integrated circuit device.

Various modifications of the configuration of the physical quantity measurement apparatus 400 can be realized. For example, the base unit 412 may have a plate shape and the lid unit 414 may have a shape in which a depression portion is formed therein. Various modifications of the mounting form or the wiring connection of the integrated circuit device 10 and the oscillation elements XTAL1 and XTAL2 inside the package 410 can also be realized. The oscillation elements XTAL1 and XTAL2 may not necessarily be configured to be completely separated from each other and may be first and second oscillation regions formed in one member. Three or more oscillation elements may be installed in the physical quantity measurement apparatus 400 (the package 410). In this case, three or more oscillation circuits corresponding to the three or more oscillation elements may be installed in the integrated circuit device 10.

Figure 33:
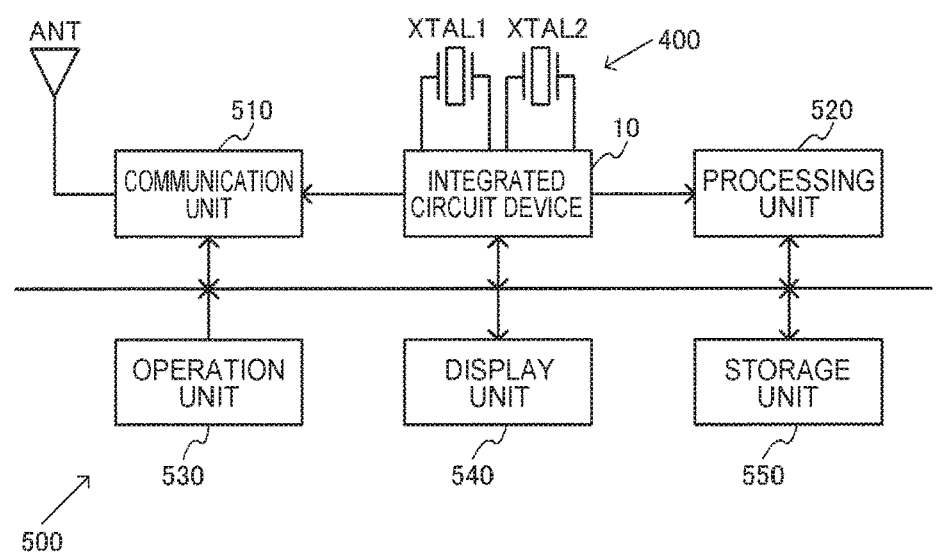
FIG. 33 is a diagram illustrating a configuration example of an electronic apparatus.

FIG. 33 is a diagram illustrating a configuration example of an electronic apparatus 500 including the integrated circuit device 10 according to the embodiment. The electronic apparatus 500 includes the oscillation elements XTAL1 and XTAL2, a processing unit 520, and the integrated circuit device 10 according to the embodiment. The electronic apparatus 500 can also include a communication unit 510, an operation unit 530, a display unit 540, a storage unit 550, and an antenna ANT. The physical quantity measurement apparatus 400 is configured to include the integrated circuit device 10 and the oscillation elements XTAL1 and XTAL2. The electronic apparatus 500 is not limited to the configuration of FIG. 33. Various modifications can be realized in such a manner that some of the constituent elements are omitted or other constituent elements are added.

As the electronic apparatus 500, for example, a measurement apparatus measuring a physical quantity such as a distance, a time, a flow rate, or a flow quantity, a biometric information measurement apparatus (an ultrasonic measurement apparatus, a pulse wave meter, or a blood pressure measurement apparatus) measuring biometric information, an on-vehicle apparatus (an automatic driving apparatus), and a network-related apparatus such as a base station or a router can be considered. A wearable apparatus such as ahead-mounted display apparatus or a watch-related apparatus, a printing apparatus, a projection apparatus, a robot, a portable information terminal (a smartphone, a mobile phone, a portable game apparatus, a notebook type PC, or a tablet PC), a content supply apparatus delivering content, and a video apparatus such as a digital camera or a video camera can also be considered.

The communication unit 510 (wireless circuit) performs a process of receiving data from the outside or transmitting data to the outside via the antenna ANT. The processing unit 520 performs a control process of the electronic apparatus 500 or various digital processes for data transmitted and received through the communication unit 510. The processing unit 520 performs various processes using physical quantity information measured by the physical quantity measurement apparatus 400. The function of the processing unit 520 can be realized by, for example, a processor such as a microcomputer.

The operation unit 530 is a unit with which a user performs an input operation and can be realized by an operation button, a touch panel display, or the like. The display unit 540 displays various kinds of information and can be realized by a liquid crystal or organic EL display. When a touch panel display is used as the operation unit 530, the touch panel display also has functions of the operation unit 530 and the display unit 540. The storage unit 550 stores data and the function of the storage unit 550 can be realized by a semiconductor memory such as a RAM or a ROM or a hard disk drive (HDD).

Figure 34:
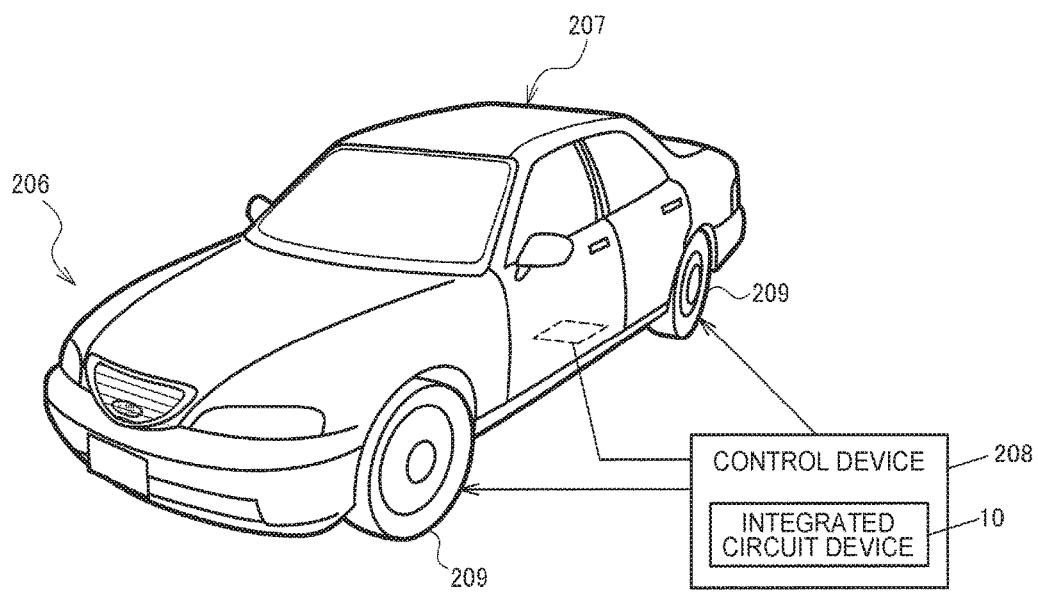
FIG. 34 is a diagram illustrating a configuration example of a vehicle.

FIG. 34 is a diagram illustrating an example of a vehicle including the integrated circuit device 10 according to the embodiment. The integrated circuit device 10 (the oscillator) according to the embodiment can be embedded in, for example, various vehicles such as a car, an airplane, a motorbike, a bicycle, a robot, and a ship. A vehicle is, for example, an apparatus that includes a driving mechanism such as an engine or a motor, a steering mechanism such as a handle or a wheel and various electronic apparatuses (on-vehicle apparatuses) and move on the ground, in the air, or on the sea. FIG. 34 schematically illustrates an automobile 206 as a specific example of the vehicle. The physical quantity measurement apparatus (not illustrated) including the integrated circuit device 10 and the oscillation elements according to the embodiment is embedded in the automobile 206 (vehicle). A control device 208 performs various control processes based on physical quantity information measured by the physical quantity measurement apparatus. For example, when distance information of an object around the automobile 206 is measured as physical quantity information, the control device 208 performs various control processes for automatic driving using the measured distance information. The control device 208 controls relative hardness of a suspension, for example, in accordance with an attitude of a body 207 or controls a brake of an individual car wheel 209. A device in which the integrated circuit device 10 according to the embodiment or the physical quantity measurement apparatus is embedded is not limited to the control device 208, but integrated circuit device 10 or the physical quantity measurement apparatus can be embedded in various devices (on-vehicle devices) installed in a vehicle such as the automobile 206.

The embodiment has been described in detail above, but those skilled in the art easily understand that many modifications can be made without substantially departing from the novelties and advantages of the invention. Accordingly, all the modification examples are included in the scope of the invention. For example, terms (the clock cycle designation value, the control voltage, and the like) described along with other broader or identical terms (the clock cycle designation information, the control signal, and the like) in the present specification and the drawings can be replaced with other terms in any portions of the present specification or the drawings at least once. All the combinations of the embodiment and the modification examples are also included in the scope of the invention. The configurations and operations of the integrated circuit device, the physical quantity measurement apparatus, the electronic apparatus, and the vehicle, the configurations of the oscillation circuits, the time-to-digital conversion circuit, and the control unit, the control process of the control unit, the time-to-digital conversion process, the phase synchronization process, the oscillation process, and the first and second signal generation processes, and the phase comparison process are not limited to those described in the embodiment, but various modifications can be made.

The entire disclosure of Japanese Patent Application No. 2016-187799 filed Sep. 27, 2016 and 2017-102224 filed May 24, 2017 are expressly incorporated by reference herein.

What is claimed is:

1. An integrated circuit device comprising:
a first oscillation circuit configured to oscillate a first resonator to generate a first clock signal with a first clock frequency;
a second oscillation circuit configured to oscillate a second resonator to generate a second clock signal with a second clock frequency that is different from the first clock frequency; and
a time-to-digital conversion circuit configured to convert a time into a digital value using the first and second clock signals.

2. The integrated circuit device according to claim 1, further comprising:
a controller configured to control at least one of the first and second oscillation circuits.

3. The integrated circuit device according to claim 2,
wherein the controller is configured to control at least one of an oscillation frequency and a phase of an oscillation signal of at least the one oscillation circuit.

4. The integrated circuit device according to claim 2,
wherein the controller is configured to control at least the one oscillation circuit so that the first and second clock signals have a given frequency relation or a given phase relation.

5. The integrated circuit device according to claim 4,
wherein the first clock frequency is f1,
the second clock frequency is f2, and
the controller is configured to control at least the one oscillation circuit so that N/f1=M/f2,
wherein N and M are mutually different integers equal to or greater than 2.

6. The integrated circuit device according to claim 1, further comprising:
a first terminal that connects one end of the first resonator to the first oscillation circuit;
a second terminal that connects the other end of the first resonator to the first oscillation circuit;
a third terminal that connects one end of the second resonator to the second oscillation circuit; and
a fourth terminal that connects the other end of the second resonator to the second oscillation circuit.

7. The integrated circuit device according to claim 1,
wherein the time-to-digital conversion circuit is configured to convert a time difference between transition timings of the first and second clock signals into a digital value.

8. The integrated circuit device according to claim 7,
wherein an inter-clock time difference is the time difference between the transition timings of the first and second clock signals at first to i-th clock cycles,
the inter-clock time difference is Δt to i×Δt, where Δt is a resolution and i is an integer equal to or greater than 2, after a phase synchronization timing of the first and second clock signals, and
the time-to-digital conversion circuit is configured to calculate the digital value by specifying whether the time difference between the first and second signals corresponds to one of Δt to i×Δt.

9. The integrated circuit device according to claim 7,
wherein a measurement period is from a first phase synchronization timing to a second phase synchronization timing of the first and second clock signals,
an inter-clock time difference is the time difference between the transition timings of the first and second clock signals,
the time-to-digital conversion circuit is configured to generate a plurality of the first clock signals at a plurality of cycles of the measurement period and is configured to acquire a plurality of the second clock signals having signal levels changed to correspond to the plurality of generated first clock signals, and
the time-to-digital conversion circuit is configured to calculate the digital value by comparing a time difference between;
the first and second clock signals at each cycle; and
the inter-clock time difference at each cycle.

10. The integrated circuit device according to claim 7,
wherein a first updating period is from a first phase synchronization timing to a second phase synchronization timing of the first and second clock signals,
a second updating period is from the second phase synchronization timing to a third phase synchronization timing,
an inter-clock time difference is the time difference between the transition timings of the first and second clock signals,
the time-to-digital conversion circuit is configured to:
generate the first signal at an m-th clock cycle, where m is an integer equal to or greater than 1,
acquire the second signal having a signal level changed to correspond to the generated first signal, and
compare the time difference between the first and second signals at the m-th clock cycle to the inter-clock time difference during the first updating period, and
the time-to-digital conversion circuit is configured to:
generate the first signal at an n-th clock cycle, where n is an integer equal to or greater than 1, set in accordance with the comparison during the first updating period,
acquire the second signal having a signal level changed to correspond to the generated first signal, and
compare the time difference between the first and second signals at the n-th clock cycle to the inter-clock time difference during the second updating period.

11. The integrated circuit device according to claim 1,
wherein the time-to-digital conversion circuit is configured to convert a time into a digital value at a resolution corresponding to a frequency difference between the first and second clock frequencies.

12. The integrated circuit device according to claim 11,
wherein the first clock frequency is f1;
the second clock frequency is f2;
the time-to-digital conversion circuit is configured to convert the time into the digital value at a resolution Δt, and
Δt=|1/f1−1/f2|=|f1−f2|/(f1×f2).

13. The integrated circuit device according to claim 1,
wherein the first and second resonators are quartz crystal resonators.

14. The integrated circuit device according to claim 1, further comprising:
a first PLL circuit configured to perform phase synchronization of the first clock signal with a reference clock signal; and
a second PLL circuit configured to perform phase synchronization of the second clock signal with the reference clock signal.

15. The integrated circuit device according to claim 1,
wherein a jitter amount per clock cycle of the first and second clock signals is J, a resolution of time-to-digital conversion is $\Delta t$, and
$J \leq \Delta t$.

16. The integrated circuit device according to claim 15, wherein the number of one of the first and second clock signals occurring during a period between a phase synchronization timing of the one clock signal with the other clock signal or a reference clock signal and a subsequent phase synchronization timing is K, and
$J \geq \Delta t/K$.

17. The integrated circuit device according to claim 15, wherein the number of one of the first and second clock signals occurring during a period between a phase synchronization timing of the one clock signal with the other clock signal or a reference clock signal and a subsequent phase synchronization timing is K, and
$(1/10) \times (\Delta t/K^{1/2}) \leq J \leq \times (\Delta t/K^{1/2})$.

* * * * *